US012720990B2

(12) United States Patent
Yamazaki et al.

(10) Patent No.: US 12,720,990 B2
(45) Date of Patent: Aug. 25, 2026

(54) DISPLAY DEVICE

(71) Applicant: SEMICONDUCTOR ENERGY LABORATORY CO., LTD., Atsugi (JP)

(72) Inventors: Shunpei Yamazaki, Tokyo (JP); Takayuki Ikeda, Kanagawa (JP); Kenichi Okazaki, Kanagawa (JP); Yasumasa Yamane, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 474 days.

(21) Appl. No.: 18/273,122

(22) PCT Filed: Jan. 14, 2022

(86) PCT No.: PCT/IB2022/050284
§ 371 (c)(1),
(2) Date: Jul. 19, 2023

(87) PCT Pub. No.: WO2022/162486
PCT Pub. Date: Aug. 4, 2022

(65) Prior Publication Data

US 2024/0090253 A1 Mar. 14, 2024

(30) Foreign Application Priority Data

Jan. 29, 2021 (JP) ................................ 2021-011701
Feb. 3, 2021 (JP) ................................ 2021-015235
Mar. 15, 2021 (JP) ................................ 2021-040152

(51) Int. Cl.
*H01L 27/12* (2006.01)
*H10K 50/13* (2023.01)
(Continued)

(52) U.S. Cl.
CPC ......... *H10K 59/173* (2023.02); *H10K 50/131* (2023.02); *H10K 59/88* (2023.02)

(58) Field of Classification Search
CPC .... H10K 59/173; H10K 50/131; H10K 59/88; H10K 50/11; H10K 59/35; H10K 59/121;
(Continued)

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 111033602 A 4/2020
CN 112186111 A 1/2021
(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.
(Continued)

*Primary Examiner* — Sheikh Maruf
(74) *Attorney, Agent, or Firm* — NIXON PEABODY LLP; Jeffrey L. Costellia

(57) ABSTRACT

A high-resolution display device is provided. A display device having both high display quality and high resolution is provided. The display device includes a first light-emitting element and a second light-emitting element. The first light-emitting element includes a first pixel electrode, a first EL layer, and a common electrode. The second light-emitting element includes a second pixel electrode, a second EL layer, and the common electrode. An insulating layer containing an inorganic insulating material is provided between the first pixel electrode and the second pixel electrode. The
(Continued)

insulating layer includes a first region overlapping with the first EL layer, a second region overlapping with the second EL layer, and a third region positioned between the first region and the second region. A side surface of the first EL layer and a side surface of the second EL layer are positioned over the insulating layer to face each other. The common electrode is provided along the side surface of the first EL layer, the side surface of the second EL layer, and a top surface of the insulating layer. A width of the insulating layer is larger than or equal to 2 times and smaller than or equal to 4 times a distance between the first pixel electrode and the second pixel electrode.

18 Claims, 25 Drawing Sheets

(51) Int. Cl.
*H10K 59/173* (2023.01)
*H10K 59/88* (2023.01)

(58) Field of Classification Search
CPC .. H10K 59/8051; H10K 59/8052; G09F 9/30; G09F 9/335; H05B 33/12; H05B 33/14; H05B 33/22; H05B 33/06
USPC .............................................................. 257/40
See application file for complete search history.

(56) References Cited

U.S. PATENT DOCUMENTS

| | | | | |
|---|---|---|---|---|
| 7,399,991 | B2 | 7/2008 | Seo et al. | |
| 7,663,149 | B2 | 2/2010 | Seo et al. | |
| 11,302,898 | B2 | 4/2022 | Nakamura et al. | |
| 2002/0072139 | A1 | 6/2002 | Kashiwabara | |
| 2011/0148290 | A1 | 6/2011 | Oota | |
| 2012/0205701 | A1* | 8/2012 | Sasaki | H10K 50/818 257/98 |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2012/0286305 | A1* | 11/2012 | Sasaki | H10K 59/30 257/89 |
| 2012/0326201 | A1* | 12/2012 | Ohnuma | H10K 59/122 438/22 |
| 2013/0062607 | A1* | 3/2013 | Yamazaki | H10D 86/423 257/E29.273 |
| 2013/0084531 | A1* | 4/2013 | Hamaguchi | H10K 71/233 430/319 |
| 2013/0084664 | A1 | 4/2013 | Yoshitoku et al. | |
| 2013/0084666 | A1 | 4/2013 | Oshige | |
| 2013/0280839 | A1 | 10/2013 | Sonoda et al. | |
| 2013/0295705 | A1 | 11/2013 | Sonoda et al. | |
| 2014/0004640 | A1* | 1/2014 | Hamaguchi | H10K 71/40 438/34 |
| 2014/0004642 | A1 | 1/2014 | Otsuka et al. | |
| 2014/0008668 | A1* | 1/2014 | Hirakata | H10K 71/80 438/23 |
| 2014/0252383 | A1* | 9/2014 | Senda | H10K 50/131 257/88 |
| 2014/0291648 | A1* | 10/2014 | Yamazaki | H10K 59/124 257/40 |
| 2015/0060826 | A1* | 3/2015 | Matsumoto | H10K 59/122 438/34 |
| 2015/0069360 | A1* | 3/2015 | Sato | H10K 59/122 438/34 |
| 2015/0076476 | A1* | 3/2015 | Odaka | H10K 59/124 438/33 |
| 2016/0019019 | A1* | 1/2016 | Ikeda | G06F 3/0412 345/1.3 |
| 2016/0172595 | A1 | 6/2016 | Malinowski et al. | |
| 2016/0315133 | A1* | 10/2016 | Sato | G09G 3/3233 |
| 2016/0329513 | A1* | 11/2016 | Kim | H10K 50/16 |
| 2017/0141167 | A1* | 5/2017 | Naganuma | H10K 59/131 |
| 2017/0256754 | A1 | 9/2017 | Defranco et al. | |
| 2018/0180951 | A1* | 6/2018 | Toyotaka | H10K 59/122 |
| 2018/0190908 | A1 | 7/2018 | Ke et al. | |
| 2020/0203662 | A1* | 6/2020 | Mollard | H10K 59/876 |
| 2020/0303475 | A1* | 9/2020 | Go | H10K 59/131 |
| 2021/0005669 | A1* | 1/2021 | Kamada | G06V 40/1318 |
| 2021/0143352 | A1* | 5/2021 | Yamazaki | H10K 59/38 |
| 2021/0159461 | A1* | 5/2021 | Nakamura | G09F 9/40 |
| 2022/0216449 | A1 | 7/2022 | Nakamura et al. | |
| 2024/0057404 | A1 | 2/2024 | Yamazaki et al. | |

FOREIGN PATENT DOCUMENTS

| | | | |
|---|---|---|---|
| JP | 2000-036385 | A | 2/2000 |
| JP | 2002-324673 | A | 11/2002 |
| JP | 2003-059663 | A | 2/2003 |
| JP | 2008-098106 | A | 4/2008 |
| JP | 2008-147072 | A | 6/2008 |
| JP | 2008-251270 | A | 10/2008 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2019-179696 | A | 10/2019 |
| JP | 2020-160305 | A | 10/2020 |
| JP | 2021-012366 | A | 2/2021 |
| KR | 2009-0021442 | A | 3/2009 |
| KR | 2020-0046035 | A | 5/2020 |
| KR | 2021-0004867 | A | 1/2021 |
| TW | 202104541 | | 2/2021 |
| WO | WO-2019/038619 | | 2/2019 |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.
Malinowski.P et al., "Photolithographic patterning of organic photodetectors with a non-fluorinated photoresist system", Organic Electronics, Jul. 12, 2014, vol. 15, No. 10, pp. 2355-2359.
Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.
Papadopoulos.N et al., "AMOLED Displays with In-Pixel Photodetector", Liquid Crystals and Display Technology, Jul. 9, 2020, pp. 1-19.
Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.
Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.
Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.
Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.
Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.
Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

(56) References Cited

OTHER PUBLICATIONS

International Search Report (Application No. PCT/IB2022/050284), dated Apr. 19, 2022.
Written Opinion (Application No. PCT/IB2022/050284), dated Apr. 19, 2022.

* cited by examiner 101
111R
111G
131
111B
131
111C 101
111R
112Rf
111G
144a
146a
111B
131
111C 143a
101
111R
112Rf
111G
144a
146a
111B
131
111C 101
147a
111R
112Rf
111G
144a
111B
131
111C 145a
101
147a
111R
112Rf
111G
111B
131
111C 145a
145a
101
111R
112R
111G
111B
131
111C 143b
101 145a 111R 112R 112Gf 111G 144b 146b 111B 131 111C 145a 143b
147b
101 145a 111R 112R 112Gf 111G 144b 111B 131 111C 145a 101 145a 111R 112R 112G 111G 145b 111B 131 111C 145a 145b 145a 145b 145c 145c
101 111R 112R 112G 111G 112B 111B 131 111C 145a 145b 101 111R 112R 112G 111G 112B 111B 131 111C 110R 110G 110B 130
101 111R 112R 113 112G 111G 131 114 112B 111B 131 111C

100A
A3
B3
A4
110R
110G
110B
C3
C4
R
G
B
R
G
B
114
113
111C
113
114
Y
X
B4

110R
110G
110B
A3
A4
101
111R
112R
113
121
112G
111G
131
114
112B
111B 110R
110R
B3
B4
101
111R
112R
113
114
131
121
112R
111R

130
C3
C4
131
121
113
111C
101

B3
B4
C3
C4
101
111R
112R
113
114
131
112R
111R
131
111C

B3
143d
B4
C3
C4
101
111R
112R
113
114
131
112R
111R
131
111C

B4
C3
C4
B3
101
111R
112R
113
114
131
112R
111R
131
111C 110R
110R
B3
B4
C3
C4
101
111R
112R
113
114
131
121
112R
111R
131
111C 122
121
111R
112R
131
113
114

52
63
53
62
51
61

22
31a
33a
32b
R
B
G
G
R
B
51a
51b
52c
53a
32a
52a
53b
31b
52b
53c
33b
52c 8100
8101
8006
8102
8103
8004
8001
8002
8000
8003

8200
8201
8202
8206
8205
8203
8204

8300
8301
8304
8304
8300
8301
8305
8302
8304
8304
8305

8300
8305
8301
8302
8305
8400
8402
8403
8405
8401
8404

DISPLAY DEVICE

TECHNICAL FIELD

One embodiment of the present invention relates to a display device. One embodiment of the present invention relates to a method for manufacturing a display device.

Note that one embodiment of the present invention is not limited to the above technical field. Examples of the technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a manufacturing method thereof. A semiconductor device refers to any device that can function by utilizing semiconductor characteristics.

BACKGROUND ART

In recent years, higher-resolution display panels have been required. Examples of devices that require high-resolution display panels include a smartphone, a tablet terminal, and a laptop personal computer. Moreover, higher resolution has been required for a stationary display device such as a television device or a monitor device along with an increase in definition. Furthermore, an example of a device required to have the highest resolution is a device for virtual reality (VR) or augmented reality (AR).

Examples of a display device that can be used for a display panel include, typically, a liquid crystal display device, a light-emitting apparatus including a light-emitting element such as an organic EL (Electro Luminescence) element or a light-emitting diode (LED), and electronic paper performing display by an electrophoretic method or the like.

For example, the basic structure of an organic EL element is a structure in which a layer containing a light-emitting organic compound is provided between a pair of electrodes. By applying voltage to this element, light emission can be obtained from the light-emitting organic compound. A display device using such an organic EL element does not need a backlight that is necessary for a liquid crystal display device and the like; thus, a thin, lightweight, high-contrast, and low-power display device can be achieved. Patent Document 1, for example, discloses an example of a display device using an organic EL element.

REFERENCE

Patent Document

[Patent Document 1] Japanese Published Patent Application No. 2002-324673

SUMMARY OF THE INVENTION

Problems to be Solved by the Invention

An object of one embodiment of the present invention is to provide a display device that can easily achieve higher resolution and a manufacturing method thereof. Another object of one embodiment of the present invention is to provide a display device having both high display quality and high resolution. Another object of one embodiment of the present invention is to provide a display device with high contrast. Another object of one embodiment of the present invention is to provide a highly reliable display device.

An object of one embodiment of the present invention is to provide a display device having a novel structure or a method for manufacturing a display device. Another object of one embodiment of the present invention is to provide a method for manufacturing the above-described display device with a high yield. Another object of one embodiment of the present invention is to at least reduce at least one of problems of the conventional technology.

Note that the description of these objects does not preclude the existence of other objects. Note that one embodiment of the present invention does not have to achieve all the objects. Objects other than these can be derived from the description of the specification, the drawings, the claims, and the like.

Means for Solving the Problems

One embodiment of the present invention is a display device including a first light-emitting element and a second light-emitting element. The first light-emitting element includes a first pixel electrode, a first EL layer, and a common electrode. The second light-emitting element includes a second pixel electrode, a second EL layer, and the common electrode. An insulating layer is provided between the first pixel electrode and the second pixel electrode. The insulating layer includes a first region overlapping with the first EL layer, a second region overlapping with the second EL layer, and a third region positioned between the first region and the second region and overlapping with neither the first EL layer nor the second EL layer. A side surface of the first EL layer and a side surface of the second EL layer are positioned over the insulating layer to face each other. The common electrode is provided along the side surface of the first EL layer, the side surface of the second EL layer, and a top surface of the insulating layer. The insulating layer contains an inorganic insulating material. A width of the insulating layer is larger than or equal to 2 times and smaller than or equal to 4 times a distance between the first pixel electrode and the second pixel electrode.

Another embodiment of the present invention is a display device including a first light-emitting element and a second light-emitting element. The first light-emitting element includes a first pixel electrode, a first EL layer, and a common electrode. The second light-emitting element includes a second pixel electrode, a second EL layer, and the common electrode. An insulating layer is provided between the first pixel electrode and the second pixel electrode. The insulating layer includes a first region overlapping with the first EL layer, a second region overlapping with the second EL layer, and a third region positioned between the first region and the second region and overlapping with neither the first EL layer nor the second EL layer. A side surface of the first EL layer and a side surface of the second EL layer are positioned over the insulating layer to face each other. The common electrode is provided along the side surface of the first EL layer, the side surface of the second EL layer, and a top surface of the insulating layer. The insulating layer contains an inorganic insulating material. A width of the insulating layer is larger than or equal to 2 times and smaller than or equal to 4 times a distance between the side surface of the first EL layer and the side surface of the second EL layer.

In any of the above, a width of the first region is preferably larger than a width of the third region and smaller than or equal to 300 nm, and a width of the second region is preferably larger than the width of the third region and smaller than or equal to 300 nm.

In any of the above, a sum of the width of the first region and the width of the second region is preferably larger than 2 times the width of the third region. A sum of the width of the first region, the width of the second region, and the width of the third region is preferably smaller than or equal to 1000 nm.

In any of the above, the width of the third region is preferably larger than or equal to 50 nm and smaller than or equal to 250 nm.

In any of the above, the display device preferably has an effective light-emitting area ratio higher than or equal to 70% and lower than 100%.

Effect of the Invention

According to one embodiment of the present invention, a display device that can easily achieve higher resolution and a manufacturing method thereof can be provided. A display device having both high display quality and high resolution can be provided. A display device with high contrast can be provided. A highly reliable display device can be provided.

According to one embodiment of the present invention, a display device having a novel structure or a method for manufacturing a display device can be provided. A method for manufacturing the above-described display device with a high yield can be provided. According to one embodiment of the present invention, at least one of problems of the conventional technology can be at least reduced.

Note that the description of these effects does not preclude the existence of other effects. Note that one embodiment of the present invention does not need to have all the effects. Effects other than these can be derived from the description of the specification, the drawings, the claims, and the like.

MODE FOR CARRYING OUT THE INVENTION

Figure 1A:
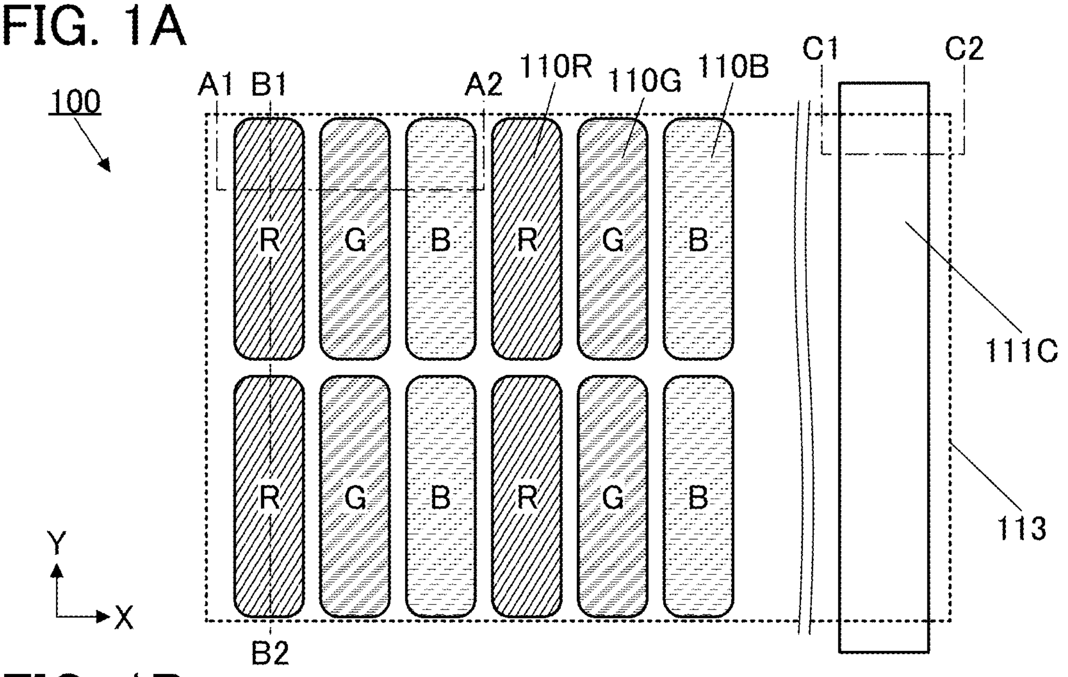
FIG. 1A to FIG. 1D are diagrams illustrating a structure example of a display device.

Hereinafter, embodiments will be described with reference to the drawings. Note that the embodiments can be implemented in many different modes, and it will be readily understood by those skilled in the art that modes and details thereof can be changed in various ways without departing from the spirit and scope thereof. Thus, the present invention should not be construed as being limited to the description of the following embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

In each drawing described in this specification, the size, the layer thickness, or the region of each component is exaggerated for clarity in some cases. Therefore, they are not limited to the illustrated scale.

In this specification and the like, the ordinal numbers such as “first” and “second” are used in order to avoid confusion among components and do not limit the number.

In this specification and the like, the term “film” and the term “layer” can be interchanged with each other. For example, in some cases, the term “conductive layer” and the term “insulating layer” can be interchanged with the term “conductive film” and the term “insulating film”, respectively.

Note that in this specification, an EL layer means a layer containing at least a light-emitting substance (also referred to as a light-emitting layer) or a stacked-layer body including the light-emitting layer provided between a pair of electrodes of a light-emitting element.

In this specification and the like, a display panel that is one embodiment of a display device has a function of displaying (outputting) an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Embodiment 1

In this embodiment, a structure example of a display device of one embodiment of the present invention and an example of a method for manufacturing the display device are described.

One embodiment of the present invention is the display device including a light-emitting element (also referred to as a light-emitting device). The display device includes at least two light-emitting elements which emit light of different colors. The light-emitting elements each include a pair of electrodes and an EL layer therebetween. The light-emitting elements are preferably organic EL elements (organic electroluminescent elements). The two or more light-emitting elements which emit light of different colors include respective EL layers containing different materials. For example, three kinds of light-emitting elements emitting red (R) light, green (G) light, and blue (B) light are included, whereby a full-color display device can be achieved.

Here, as a way of forming part or all of EL layers separately between light-emitting elements which emit light of different colors, an evaporation method using a shadow mask such as a metal mask is known. However, this method causes a deviation from the designed shape and position of an island-shaped organic film due to various influences such as the low accuracy of the metal mask, the positional deviation between the metal mask and a substrate, a warp of the metal mask, and the vapor-scattering-induced expansion of outline of the deposited film; accordingly, it is difficult to achieve high resolution and a high aperture ratio of the display device. Thus, a measure has been taken for pseudo improvement in resolution (also referred to as pixel density) by employing a unique pixel arrangement method such as a PenTile arrangement, for example.

In one embodiment of the present invention, fine patterning of an EL layer is performed without a shadow mask such as a metal mask. Thus, a display device that has high resolution and a high aperture ratio, which has been difficult to achieve, can be achieved. Moreover, EL layers can be formed separately, enabling the display device to perform extremely clear display with high contrast and high display quality.

Here, description is made on a case where EL layers in light-emitting elements of two colors are separately formed, for simplicity. First, a stack of a first EL film and a first sacrificial film is formed to cover two pixel electrodes. Next, a resist mask is formed over the first sacrificial film in a position overlapping with one pixel electrode (a first pixel electrode). Then, part of the first sacrificial film and part of the first EL film which do not overlap with the resist mask are etched. At this time, the etching is stopped when the other pixel electrode (a second pixel electrode) is exposed. Thus, part of the first EL film processed into a band shape or an island shape (also referred to as a first EL layer) can be formed over the first pixel electrode, and part of the sacrificial film (also referred to as a first sacrificial layer) can be formed thereover.

Next, a stack of a second EL film and a second sacrificial film is formed. Then, a resist mask is formed in a position overlapping with the second pixel electrode. Then, part of the second sacrificial film and part of the second EL film which do not overlap with the resist mask are etched in a manner similar to the above. As a result, the first EL layer and the first sacrificial layer are provided over the first pixel electrode, and a second EL layer and a second sacrificial layer are provided over the second pixel electrode. In this manner, the first EL layer and the second EL layer can be formed separately. Finally, the first sacrificial layer and the second sacrificial layer are removed to expose the first EL layer and the second EL layer, and then a common electrode is formed, so that the light-emitting elements of two colors can be formed separately.

Furthermore, by repeating the above-described steps, EL layers in light-emitting elements of three or more colors can be formed separately. Accordingly, a display device including light-emitting elements of three colors or four or more colors can be achieved.

Here, an electrode (also referred to as a first electrode, a connection electrode, or the like) can be formed on the same plane as the pixel electrode in order to supply a potential to the common electrode, whereby the connection electrode is electrically connected to the common electrode. The connection electrode is positioned outside the display portion where the pixels are provided. In order to prevent a top surface of the connection electrode from being exposed to etching of the first EL film, it is preferable that the first sacrificial layer be also provided over the connection electrode. Also in etching of the second EL film, the second sacrificial layer is preferably provided over the connection electrode. The first sacrificial layer and the second sacrificial layer provided over the connection electrode can be removed by etching concurrently with etching of the first sacrificial layer over the first EL layer and the second sacrificial layer over the second EL layer.

It is difficult to set the distance between the EL layers of different colors to be less than 10 μm with a formation method using a metal mask, for example; however, with the use of the above method, the distance can be narrowed to be less than or equal to 3 μm, less than or equal to 2 μm, or less than or equal to 1 μm. For example, with the use of a light exposure apparatus for LSI, the distance can be narrowed to be less than or equal to 500 nm, less than or equal to 200 nm, less than or equal to 100 nm, or less than or equal to 50 nm. Accordingly, as compared with the case of using a metal mask, the area of a non-light-emitting region that may exist between two light-emitting elements can be significantly reduced, and the aperture ratio can be close to 100%. For example, the aperture ratio lower than 100% but higher than or equal to 50%, higher than or equal to 60%, higher than or equal to 70%, higher than or equal to 80%, or higher than or equal to 90% can be achieved.

Furthermore, a pattern of the EL layer itself can be made much smaller than that in the case of using a metal mask. For example, in the case of using a metal mask for forming EL layers separately, a variation in the thickness of the pattern occurs between the center and the edge of the pattern. This causes a reduction in an effective area that can be used as a light-emitting region with respect to the entire pattern area. By contrast, in the above manufacturing method, a pattern is formed by processing a film deposited to have a uniform thickness, which enables a uniform thickness in the pattern. Thus, even with a fine pattern, almost the entire area can be used as a light-emitting region. Therefore, the above manufacturing method can achieve both high resolution and a high aperture ratio.

Furthermore, an insulating layer is preferably provided between two adjacent pixel electrodes. The insulating layer is provided to cover end portions of the pixel electrodes. A region covered with the insulating layer over the pixel electrode does not function as a light-emitting region of the light-emitting element, whereby the effective light-emitting area ratio, i.e., the aperture ratio of the display device can be increased as the width of the region where the insulating layer and the pixel electrode overlap with each other becomes smaller.

End portions of the EL layer are positioned over the insulating layer. In that case, the end portions (side surfaces) of the two EL layers are placed to face each other over the insulating layer. As the distance between the two EL layers is shorter, the width of the insulating layer can also be smaller; thus, the aperture ratio of the display device can be increased.

The width of the insulating layer provided between the two light-emitting elements is preferably larger than the distance between the two pixel electrodes, and preferably smaller than or equal to 4 times, further preferably smaller than or equal to 3.5 times, still further preferably smaller than or equal to 3 times; in particular, the width of the insulating layer is preferably larger than or equal to 1.5 times, further preferably larger than or equal to 2 times the distance between the two pixel electrodes. By setting the width of the insulating layer to the above value, even when process variations occur, the insulating layer can surely cover the end portions of the pixel electrodes while high aperture ratio is maintained.

The width of the insulating layer provided between the two light-emitting elements is preferably larger than or equal to the distance between two facing side surfaces of the two EL layers, and is preferably smaller than or equal to 4 times, further preferably smaller than or equal to 3.5 times, still further preferably smaller than or equal to 3 times. In particular, the width of the insulating layer is preferably larger than or equal to 1.5 times, further preferably larger than or equal to 2 times the distance between the two facing side surfaces of the two EL layers. By setting the width of the insulating layer to the above value, even when process variations occur, the EL layers can be processed so that the end portions of the EL layers are surely positioned over the insulating layer while high aperture ratio is maintained.

In this manner, the above manufacturing method can provide a display device in which minute light-emitting elements are integrated, and it is not necessary to conduct a pseudo improvement in resolution by employing a unique pixel arrangement method such as a PenTile arrangement. Thus, the display device can achieve resolution higher than or equal to 500 ppi, higher than or equal to 1000 ppi, higher than or equal to 2000 ppi, higher than or equal to 3000 ppi, or higher than or equal to 5000 ppi while having what is called a stripe arrangement where R, G, and B are arranged in one direction. Furthermore, a display device with an effective light-emitting area ratio (aperture ratio) higher than or equal to 50%, higher than or equal to 60%, or higher than or equal to 70% and lower than 100% can be achieved.

Note that in this specification and the like, the effective light-emitting area ratio refers to a proportion of an area of a region that can be regarded as a light-emitting region of one pixel in an area of one pixel calculated from a repeated pixel pitch in a display device.

More specific structure examples and manufacturing method examples of the display device of one embodiment of the present invention are described below with reference to drawings.

Structure Example 1

FIG. 1A is a schematic top view of a display device 100 of one embodiment of the present invention. The display device 100 includes a plurality of light-emitting elements 110R exhibiting red, a plurality of light-emitting elements 110G exhibiting green, and a plurality of light-emitting elements 110B exhibiting blue. In FIG. 1A, light-emitting regions of the light-emitting elements are denoted by R, G, and B to easily differentiate the light-emitting elements.

The light-emitting elements 110R, the light-emitting elements 110G, and the light-emitting elements 110B are arranged in a matrix. FIG. 1A illustrates what is called a stripe arrangement, in which the light-emitting elements of the same color are arranged in one direction. Note that the arrangement method of the light-emitting elements is not limited thereto; another arrangement method such as a delta arrangement, a zigzag arrangement, or a PenTile arrangement may also be used.

The light-emitting elements 110R, the light-emitting elements 110G, and the light-emitting elements 110B are arranged in the X direction. The light-emitting elements of the same color are arranged in the Y direction intersecting with the X direction.

As the light-emitting elements 110R, the light-emitting elements 110G, and the light-emitting elements 110B, an EL element such as an OLED (Organic Light Emitting Diode) or a QLED (Quantum-dot Light Emitting Diode) is preferably used. As a light-emitting substance contained in the EL element, a substance that emits fluorescence (a fluorescent material), a substance that emits phosphorescence (a phosphorescent material), a substance that exhibits thermally activated delayed fluorescence (a thermally activated delayed fluorescent (TADF) material), and the like can be given. Examples of the light-emitting substance contained in the EL element include not only organic compounds but also inorganic compounds (e.g., quantum dot materials).

Figure 1B:
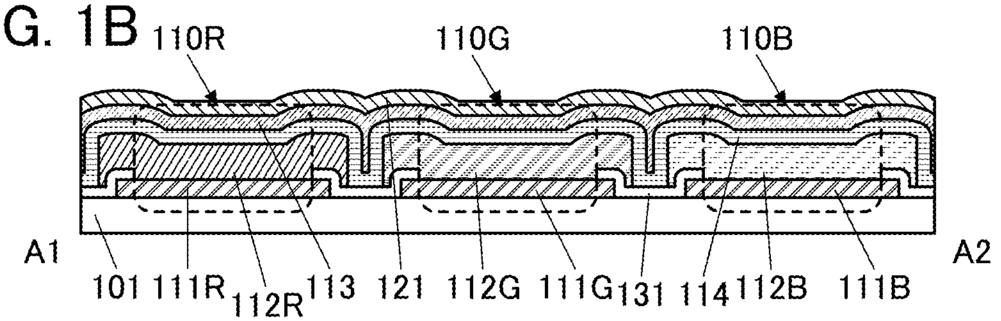
Figure 1C:
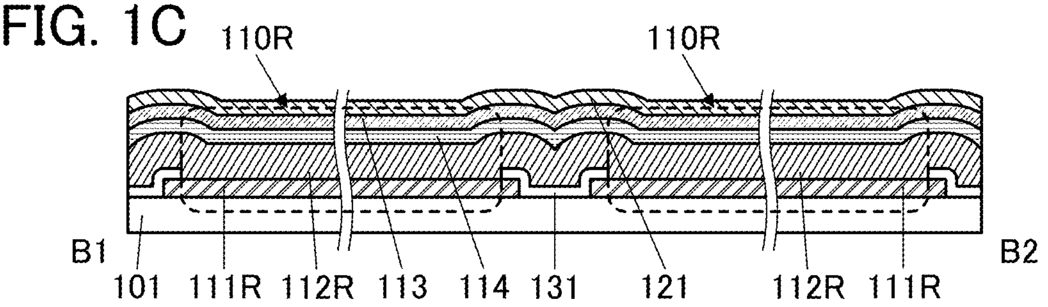

FIG. 1B is a schematic cross-sectional view taken along the dashed-dotted line A1-A2 in FIG. 1A. FIG. 1C is a schematic cross-sectional view taken along the dashed-dotted line B1-B2.

FIG. 1B illustrates a cross section of the light-emitting element 110R, the light-emitting element 110G, and the light-emitting element 110B. The light-emitting element 110R includes a pixel electrode 111R, an EL layer 112R, an EL layer 114, and a common electrode 113. The light-emitting element 110G includes a pixel electrode 111G, an EL layer 112G, the EL layer 114, and the common electrode 113. The light-emitting element 110B includes a pixel electrode 111B, an EL layer 112B, the EL layer 114, and the common electrode 113. The EL layer 114 and the common electrode 113 are shared by the light-emitting element 110R, the light-emitting element 110G, and the light-emitting element 110B. The EL layer 114 can also be referred to as a common layer.

The EL layer 112R included in the light-emitting element 110R contains at least a light-emitting organic compound that emits light with intensity in a red wavelength range. The EL layer 112G included in the light-emitting element 110G contains at least a light-emitting organic compound that emits light with intensity in a green wavelength range. The EL layer 112B included in the light-emitting element 110B contains at least a light-emitting organic compound that emits light with intensity in a blue wavelength range.

The EL layer 112R, the EL layer 112G, and the EL layer 112B may each include one or more of an electron-injection layer, an electron-transport layer, a hole-injection layer, and a hole-transport layer in addition to the layer containing a light-emitting organic compound (the light-emitting layer). The EL layer 114 can have a structure that does not include the light-emitting layer. For example, the EL layer 114 includes one or more of an electron-injection layer, an electron-transport layer, a hole-injection layer, and a hole-transport layer.

The pixel electrode 111R, the pixel electrode 111G, and the pixel electrode 111B are provided for the respective light-emitting elements. Each of the common electrode 113 and the EL layer 114 is provided as a continuous layer shared by the light-emitting elements. A conductive film that transmits visible light is used for the pixel electrodes or the common electrode 113, and a reflective conductive film is used for the other. The use of the light-transmitting pixel electrodes and the reflective common electrode 113 offers a bottom-emission display device whereas the use of the reflective pixel electrodes and the light-transmitting common electrode 113 offers a top-emission display device. Note that when both the pixel electrodes and the common electrode 113 transmit light, a dual-emission display device can be obtained.

An insulating layer 131 covering end portions of the pixel electrode 111R, the pixel electrode 111G, and the pixel electrode 111B is provided. End portions of the insulating layer 131 are preferably tapered. Note that the insulating layer 131 is not necessarily provided when not needed. Note that in this specification and the like, an end portion of an object having a tapered shape indicates that the end portion of the object has a cross-sectional shape in which the angle between a surface of the object and a surface on which the object is formed is greater than 0° and less than 90°, preferably greater than or equal to 5° and less than or equal to 70° in a region of the end portion, and the thickness continuously increases from the end portion.

The insulating layer 131 is preferably formed using an inorganic insulating material. With the use of an inorganic insulating material for the insulating layer 131, fine processing by a photolithography method can be performed accurately, whereby the distance between the adjacent pixels can be extremely smaller than that in the case of using an organic insulating material and thus the aperture ratio can be extremely high.

The end portions of the insulating layer 131 are preferably tapered. Thus, the step coverage with a film formed over the insulating layer 131, such as the EL layer or the like provided to cover the end portions of the insulating layer 131, can be improved. The thickness of the insulating layer 131 is preferably smaller than that of the pixel electrode 111R or the like. By forming the insulating layer 131 thin, the step coverage of the film formed over the insulating layer 131 can be improved.

Examples of inorganic insulating materials that can be used for the insulating layer 131 include films of oxides and nitrides such as silicon oxide, silicon oxynitride, silicon nitride oxide, silicon nitride, aluminum oxide, aluminum oxynitride, and hafnium oxide. Yttrium oxide, zirconium oxide, gallium oxide, tantalum oxide, magnesium oxide, lanthanum oxide, cerium oxide, neodymium oxide, or the like may be used.

In the insulating layer 131, films containing the above inorganic insulating materials may be stacked.

The EL layer 112R, the EL layer 112G, and the EL layer 112B each include a region in contact with a top surface of the pixel electrodes and a region in contact with a surface of the insulating layer 131. End portions of the EL layer 112R, the EL layer 112G, and the EL layer 112B are positioned over the insulating layer 131.

As illustrated in FIG. 1B, there is a gap between the two EL layers of light-emitting elements which emit light of different colors. In this manner, the EL layer 112R, the EL layer 112G, and the EL layer 112B are preferably provided with gaps so as not to be in contact with each other. This suitably prevents unintentional light emission from being caused by a current flowing through EL layers formed continuously between light-emitting elements which emit light of different colors. As a result, the contrast can be increased to achieve a display device with high display quality.

As illustrated in FIG. 1C, the EL layer 112R is formed in a band shape so that the EL layer 112R can be continuous in the Y direction. When the EL layer 112R and the like are formed in a band shape, no space for dividing the layer is needed and thus a non-light-emitting area between the light-emitting elements is reduced, resulting in a higher aperture ratio. FIG. 1C illustrates the cross section of the light-emitting element 110R as an example; the light-emitting element 110G and the light-emitting element 110B can have a similar shape.

A protective layer 121 is provided over the common electrode 113 so as to cover the light-emitting element 110R, the light-emitting element 110G, and the light-emitting element 110B. The protective layer 121 has a function of preventing diffusion of impurities such as water into the light-emitting elements from above.

The protective layer 121 can have, for example, a single-layer structure or a stacked-layer structure at least including an inorganic insulating film. As the inorganic insulating film, for example, an oxide film or a nitride film such as a silicon oxide film, a silicon oxynitride film, a silicon nitride oxide film, a silicon nitride film, an aluminum oxide film, an aluminum oxynitride film, or a hafnium oxide film can be given. Alternatively, a semiconductor material such as indium gallium oxide or indium gallium zinc oxide may be used for the protective layer 121.

As the protective layer 121, a stacked film of an inorganic insulating film and an organic insulating film can be used. For example, a structure in which an organic insulating film is sandwiched between a pair of inorganic insulating films is preferable. In particular, the organic insulating film preferably functions as a planarization film. With this structure, a top surface of the organic insulating film can be flat, and accordingly, coverage with the inorganic insulating film over the organic insulating film is improved, leading to an improvement in barrier properties. It is preferable that a top surface of the protective layer 121 be flat because in the case where a component (e.g., a color filter, an electrode of a touch sensor, a lens array, or the like) is provided above the protective layer 121, the influence of an uneven shape caused by the lower structure can be reduced.

FIG. 1A also illustrates a connection electrode 111C that is electrically connected to the common electrode 113. The connection electrode 111C is supplied with a potential (e.g., an anode potential or a cathode potential) that is to be supplied to the common electrode 113. The connection electrode 111C is provided outside a display region where the light-emitting elements 110R and the like are arranged. In FIG. 1A, the common electrode 113 is denoted by a dashed line.

The connection electrode 111C can be provided along the outer periphery of the display region. For example, the connection electrode 111C may be provided along one side of the outer periphery of the display region or two or more sides of the outer periphery of the display region. That is, in the case where the display region has a rectangular top surface shape, a top surface shape of the connection electrode 111C can be a band shape, an L shape, a U shape (a square bracket shape), a quadrangular shape, or the like.

Figure 1D:
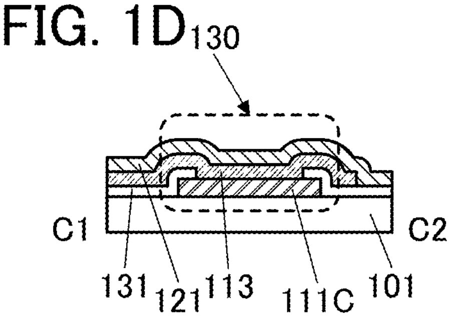

FIG. 1D is a schematic cross-sectional view taken along the dashed-dotted line C1-C2 in FIG. 1A. FIG. 1D illustrates a connection portion 130 in which the connection electrode 111C is electrically connected to the common electrode 113. In the connection portion 130, the common electrode 113 is provided over and in contact with the connection electrode 111C and the protective layer 121 is provided to cover the common electrode 113. In addition, the insulating layer 131 is provided to cover an end portion of the connection electrode 111C.

Figure 2A:
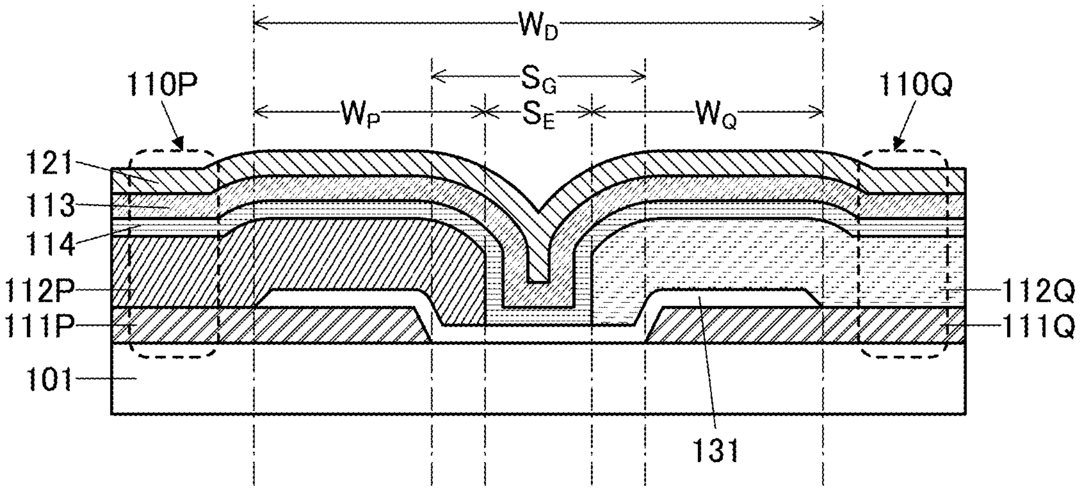
FIG. 2A and FIG. 2B are diagrams illustrating structure examples of a display device.

Next, a preferable structure of the insulating layer 131 and its vicinity is described in detail. FIG. 2A is an enlarged view of the insulating layer 131 between the two adjacent light-emitting elements and the vicinity of the insulating layer 131.

Here, a light-emitting element 110P and a light-emitting element 110Q are used as given two adjacent light-emitting elements. The light-emitting element 110P and the light-emitting element 110Q each independently represent any one of the light-emitting element 110R, the light-emitting element 110G, and the light-emitting element 110B. The light-emitting element 110P includes an EL layer 112P and a pixel electrode 111P, and the light-emitting element 110Q includes an EL layer 112Q and a pixel electrode 111Q.

FIG. 2A illustrates a width $W_D$ of the insulating layer 131, a distance $S_G$ between the pixel electrode 111P and the pixel electrode 111Q, and a distance $S_E$ between a side surface of the EL layer 112P and a side surface of the EL layer 112Q.

The insulating layer 131 includes a region overlapping with the EL layer 112P, a region overlapping with the EL layer 112Q, and a region not overlapping with any of these. In the insulating layer 131, the width of the region overlapping with the EL layer 112P is referred to as a width $W_P$, and the width of the region overlapping with the EL layer 112Q is referred to as $W_Q$. Note that the width of the region of the insulating layer 131 not overlapping with any of the EL layers corresponds to a difference obtained by subtracting the width $W_P$ and the width $W_Q$ from the width $W_D$, which is substantially equal to the distance $S_E$.

Here, the width $W_D$ of the insulating layer 131 is larger than the distance $S_G$ between a pair of pixel electrodes. In particular, the width $W_D$ is preferably larger than or equal to 1.2 times, further preferably larger than or equal to 1.5 times, still further preferably larger than or equal to 2 times, and preferably smaller than or equal to 8 times, further preferably smaller than or equal to 6 times, still further preferably smaller than or equal to 4 times, yet further preferably smaller than or equal to 3 times the distance $S_G$. Typically, the width $W_D$ is preferably larger than or equal to 2 times and smaller than or equal to 4 times the distance $S_G$. As the width $W_D$ is increased, positional deviation between the pair of pixel electrodes and the insulating layer 131 can become permissible, which can improve the manufacturing yield. By contrast, as the width $W_D$ is decreased, the resolution, the aperture ratio, and the like can be improved. Setting the width $W_D$ within the above range enables both a high manufacturing yield and a high resolution or aperture ratio.

The width $W_D$ of the insulating layer 131 is larger than the distance $S_E$ between the side surface of the EL layer 112P and the side surface of the EL layer 112Q. In particular, the width $W_D$ is preferably larger than or equal to 1.2 times, further preferably larger than or equal to 1.5 times, still further preferably larger than or equal to 2 times, and preferably smaller than or equal to 8 times, further preferably smaller than or equal to 6 times, still further preferably smaller than or equal to 4 times, yet further preferably smaller than or equal to 3 times the distance $S_E$. Typically, the width $W_D$ is preferably larger than or equal to 2 times and smaller than or equal to 4 times the distance $S_E$. As the width $W_D$ is increased, positional deviation between the end portions of the EL layers and the insulating layer 131 can become permissible, which can improve the manufacturing yield. By contrast, as the width $W_D$ is decreased, the resolution, the aperture ratio, and the like can be improved. Setting the width $W_D$ within the above range enables both a high manufacturing yield and a high resolution or aperture ratio.

Furthermore, in the insulating layer 131, the width $W_P$ of the region overlapping with the EL layer 112P is preferably larger than the width of the region overlapping with neither the EL layer 112P nor the EL layer 112Q (i.e., the distance $S_E$). Moreover, the width $W_Q$ of the region overlapping with the EL layer 112Q is preferably larger than the distance $S_E$. Each of the width $W_P$ and the width $W_Q$ is preferably smaller than or equal to 2000 nm, further preferably smaller than or equal to 1000 nm, further preferably smaller than or equal to 500 nm, still further preferably smaller than or equal to 300 nm, yet further preferably smaller than or equal to 200 nm, yet still further preferably smaller than or equal to 150 nm. Typically, each of the width $W_P$ and the width $W_Q$ is preferably smaller than or equal to 300 nm.

In the insulating layer 131, the sum of the width $W_P$ and the width $W_Q$ is preferably more than 2 times as large as the distance $S_E$. Furthermore, in the insulating layer 131, the width $W_D$, i.e., the sum of the width $W_P$, the width $W_Q$, and the distance $S_E$ is preferably smaller than or equal to 1500 nm, further preferably smaller than or equal to 1200 nm, further preferably smaller than or equal to 1000 nm, still further preferably smaller than or equal to 900 nm, yet further preferably smaller than or equal to 800 nm, yet still further preferably smaller than or equal to 600 nm. Typically, it is preferable that the width $W_D$ be more than or equal to 2 times as large as the distance $S_E$ and be smaller than or equal to 1000 nm.

As the distance $S_E$ between the EL layer 112P and the EL layer 112Q is decreased, the aperture ratio and the resolution can be increased. By contrast, as the distance $S_E$ is increased, the effect of variation in the manufacturing process between the EL layer 112P and the EL layer 112Q becomes permissible, which leads to an increase in manufacturing yield. The distance $S_E$ is preferably larger than or equal to 20 nm and smaller than or equal to 350 nm, further preferably larger than or equal to 30 nm and smaller than or equal to 300 nm, further preferably larger than or equal to 40 nm and smaller than or equal to 300 nm, still further preferably larger than or equal to 50 nm and smaller than or equal to 250 nm, yet further preferably larger than or equal to 50 nm and smaller than or equal to 200 nm, yet still further preferably larger than or equal to 50 nm and smaller than or equal to 150 nm. Typically, the distance $S_E$ is preferably larger than or equal to 50 nm and smaller than or equal to 250 nm (e.g., 90 nm or a neighborhood thereof).

By setting the relation between the insulating layer 131, the EL layer 112P, the EL layer 112Q, the pixel electrode 111P, and the pixel electrode 111Q between the two adjacent light-emitting elements as described above, a display device with a high aperture ratio can be achieved. For example, the aperture ratio (the effective light-emitting area ratio) can be increased to higher than or equal to 40%, higher than or equal to 50%, furthermore higher than or equal to 60%, still furthermore higher than or equal to 65%, yet furthermore higher than or equal to 70%.

FIG. 2A is an example of the case where an end portion of the EL layer 112P does not overlap with the pixel electrode 111P and an end portion of the EL layer 112Q does not overlap with the pixel electrode 111Q. Moreover, in a plan view, the end portion of the EL layer 112P and the end portion of the EL layer 112Q are positioned between the pair of pixel electrodes.

Figure 2B:
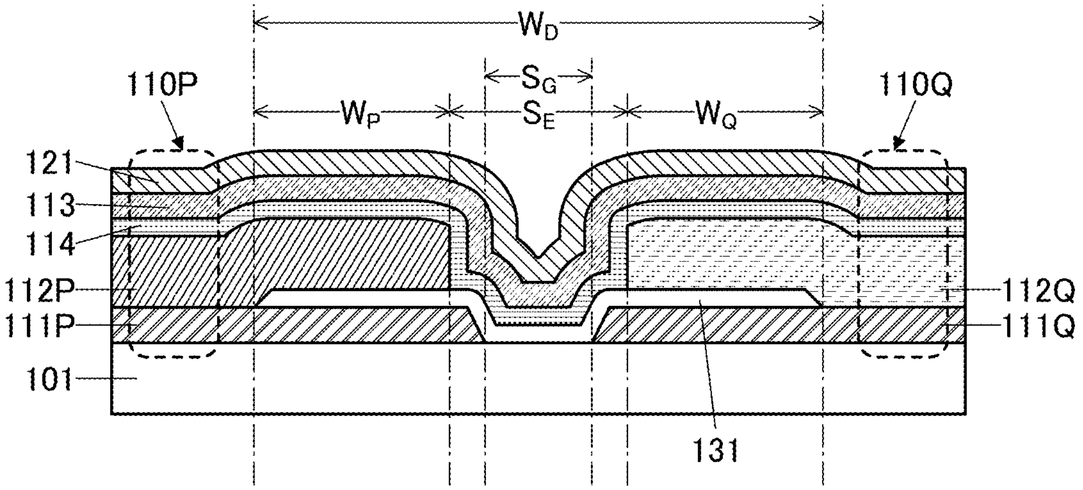

By contrast, FIG. 2B illustrates an example of the case where the end portion of the EL layer 112P overlaps with the pixel electrode 111P and the end portion of the EL layer 112Q overlaps with the pixel electrode 111Q. In a plan view, the end portion of the pixel electrode 111P and the end portion of the pixel electrode 111Q are positioned between the facing end portions of the two adjacent EL layers.

Note that a structure may be employed in which an end portion of one of the pair of EL layers overlaps with the pixel electrode and an end portion of the other does not overlap with the pixel electrode. Alternatively, another structure may be employed in which the end portion of one of the pixel electrodes overlaps with the EL layer and the end portion of the other does not overlap with the EL layer.

The above is the description of the structure example of the insulating layer 131 and its vicinity.

Manufacturing Method Example 1

Figure 3A:
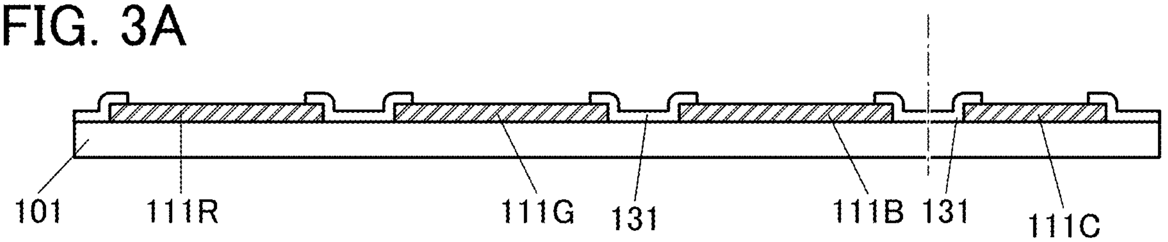
FIG. 3A to FIG. 3F are diagrams illustrating an example of a method for manufacturing a display device.

An example of a method for manufacturing the display device of one embodiment of the present invention will be described below with reference to drawings. Here, the method is described using, as an example, the display device 100 exemplified in the above structure example. FIG. 3A to FIG. 4F are schematic cross-sectional views in steps of the method for manufacturing the display device described as an example below. In FIG. 3A and the like, the schematic cross-sectional views of the connection portion 130 and the periphery thereof are also illustrated on the right side.

Note that thin films that form the display device (insulating films, semiconductor films, conductive films, or the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD: Plasma Enhanced CVD) method and a thermal CVD method. As an example of the thermal CVD method, a metal organic chemical vapor deposition (MOCVD: Metal Organic CVD) method can be given.

Alternatively, thin films that form the display device (insulating films, semiconductor films, conductive films, or the like) can be formed by a method such as spin coating, dipping, spray coating, ink-jetting, dispensing, screen printing, offset printing, a doctor knife method, a slit coater, a roll coater, a curtain coater, or a knife coater.

When the thin films that form the display device are processed, a photolithography method or the like can be used. Besides, a nanoimprinting method, a sandblasting method, a lift-off method, or the like may be used for the processing of the thin films. Island-shaped thin films may be directly formed by a deposition method using a shielding mask such as a metal mask.

There are two typical examples of a photolithography method. In one of the methods, a resist mask is formed over a thin film that is to be processed, the thin film is processed by etching or the like, and the resist mask is removed. In the other method, after a photosensitive thin film is deposited, exposure and development are performed, so that the thin film is processed into a desired shape.

As the light used for exposure in the photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Exposure may be performed by liquid immersion exposure technique. As the light used for the exposure, extreme ultraviolet (EUV) light, X-rays, or the like may be used. Furthermore, instead of the light used for the exposure, an electron beam can also be used. It is preferable to use extreme ultraviolet light, X-rays, or an electron beam because extremely minute processing can be performed. Note that in the case of performing exposure by scanning of a beam such as an electron beam, a photomask is not needed.

For etching of the thin film, a dry etching method, a wet etching method, a sandblasting method, or the like can be used.

[Preparation for Substrate 101]

As a substrate 101, a substrate having at least heat resistance high enough to withstand the following heat treatment can be used. In the case where an insulating substrate is used as the substrate 101, a glass substrate, a quartz substrate, a sapphire substrate, a ceramic substrate, an organic resin substrate, or the like can be used. Alternatively, a single crystal semiconductor substrate using silicon or silicon carbide, a polycrystalline semiconductor substrate, a compound semiconductor substrate of silicon germanium or the like, a semiconductor substrate such as an SOI substrate, or the like can be used.

As the substrate 101, it is particularly preferable to use the semiconductor substrate or the insulating substrate over which a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

[Formation of Pixel Electrodes 111R, 111G, and 111B and Connection Electrode 111C]

Next, the pixel electrode 111R, the pixel electrode 111G, the pixel electrode 111B, and the connection electrode 111C are formed over the substrate 101. First, a conductive film to be a pixel electrode is deposited, a resist mask is formed by a photolithography method, and an unnecessary portion of the conductive film is removed by etching. After that, the resist mask is removed to form the pixel electrode 111R, the pixel electrode 111G, and the pixel electrode 111B.

In the case where a conductive film that has a property of reflecting visible light is used as each pixel electrode, it is preferable to use a material (e.g., silver or aluminum) having reflectance as high as possible in the whole wavelength range of visible light. This can increase not only light extraction efficiency, but also color reproducibility of the light-emitting elements.

[Formation of Insulating Layer 131]

Next, the insulating layer 131 is formed so as to cover the end portions of the pixel electrode 111R, the pixel electrode 111G, and the pixel electrode 111B (FIG. 3A). An organic insulating film or an inorganic insulating film can be used for the insulating layer 131. The end portions of the insulating layer 131 are preferably tapered to improve step coverage with an EL film in a later step. In particular, when an organic insulating film is used, a photosensitive material is preferably used, in which case the shape of the end portions can be easily controlled by the conditions of light exposure and development.

[Formation of EL Film 112Rf]

Next, an EL film 112Rf to be the EL layer 112R is deposited over the pixel electrode 111R, the pixel electrode 111G, the pixel electrode 111B, and the insulating layer 131.

The EL film 112Rf includes at least a film containing a light-emitting compound. A structure may be employed in which one or more films functioning as an electron-injection layer, an electron-transport layer, a charge-generation layer, a hole-transport layer, or a hole-injection layer are stacked in addition to the above. The EL film 112Rf can be formed by, for example, an evaporation method, a sputtering method, or an inkjet method. Without limitation to this, the above-described deposition method can be used as appropriate.

For example, the EL film 112Rf is preferably a stacked film in which a hole-injection layer, a hole-transport layer, a light-emitting layer, and an electron-transport layer are stacked in this order. In that case, a film including the electron-injection layer can be used as the EL layer 114 formed later. In particular, the electron-transport layer is provided to cover the light-emitting layer, which can inhibit the light-emitting layer from being damaged by a subsequent photolithography step or the like, so that a highly reliable light-emitting element can be manufactured. Furthermore, when layers containing the same organic compound are used as the electron-transport layer used for the EL film 112Rf or the like and the electron-injection layer to be used for the EL layer 114 later, favorable junction of these layers can be obtained and a light-emitting element with high emission efficiency and high reliability can be achieved. For example, an organic compound having an electron-transport property may be used for the electron-transport layer and a material containing the organic compound and a metal may be used for the electron-injection layer.

The EL film 112Rf is preferably formed so as not to be provided over the connection electrode 111C. For example, in the case where the EL film 112Rf is formed by an evaporation method (or a sputtering method), it is preferable that the EL film 112Rf be formed using a shielding mask so as not to be deposited over the connection electrode 111C.

[Formation of Sacrificial Film 144*a*]

Next, a sacrificial film 144*a* is formed to cover the EL film 112Rf. The sacrificial film 144*a* is provided in contact with a top surface of the connection electrode 111C.

As the sacrificial film 144*a*, it is possible to use a film highly resistant to etching treatment performed on various EL films such as the EL film 112Rf, i.e., a film having high etching selectivity with respect to the EL films. Furthermore, as the sacrificial film 144*a*, it is possible to use a film having high etching selectivity with respect to a protective film such as a protective film 146*a* described later. Moreover, as the sacrificial film 144*a*, it is possible to use a film that can be removed by wet etching that is less likely to cause damage to the EL films.

The sacrificial film 144*a* can be formed using an inorganic film such as a metal film, an alloy film, a metal oxide film, a semiconductor film, or an inorganic insulating film, for example. The sacrificial film 144*a* can be formed by any of a variety of deposition methods such as a sputtering method, an evaporation method, a CVD method, and an ALD method. In particular, an ALD method gives less damage to a layer where a film is to be formed; for this reason, the sacrificial film 144*a*, which is directly formed on the EL film 112Rf, is preferably formed by an ALD method.

For example, a metal material such as gold, silver, platinum, magnesium, nickel, tungsten, chromium, molybdenum, iron, cobalt, copper, palladium, titanium, aluminum, yttrium, zirconium, and tantalum, or an alloy material containing the metal material can be used as the sacrificial film 144*a*. It is particularly preferable to use a low-melting-point material such as aluminum or silver.

Alternatively, the sacrificial film 144*a* can be formed using a metal oxide such as an indium-gallium-zinc oxide (In—Ga—Zn oxide, also referred to as IGZO). It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Moreover, indium tin oxide containing silicon can also be used, for example.

Note that an element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. In particular, M is preferably one or more kinds selected from gallium, aluminum, and yttrium.

Alternatively, the sacrificial film 144*a* can be formed using an inorganic insulating material such as aluminum oxide, hafnium oxide, or silicon oxide.

The sacrificial film 144*a* is preferably formed using a material that can be dissolved in a solvent chemically stable with respect to at least the uppermost film of the EL film 112Rf. In particular, a material that will be dissolved in water or alcohol can be suitably used for the sacrificial film 144*a*. In deposition of the sacrificial film 144*a*, it is preferable that application of such a material dissolved in a solvent such as water or alcohol be performed by a wet deposition process and followed by heat treatment for evaporating the solvent. At this time, the heat treatment is preferably performed in a reduced-pressure atmosphere, in which case the solvent can be removed at a low temperature in a short time and thermal damage to the EL film 112Rf can be reduced accordingly.

Examples of a wet deposition process that can be employed for forming the sacrificial film 144*a* include spin coating, dipping, spray coating, ink-jetting, dispensing, screen printing, offset printing, a doctor knife method, a slit coating, a roll coating, a curtain coating, a knife coating, or the like.

As the sacrificial film 144*a*, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin can be used.

[Formation of Protective Film 146*a*]

Figure 3B:
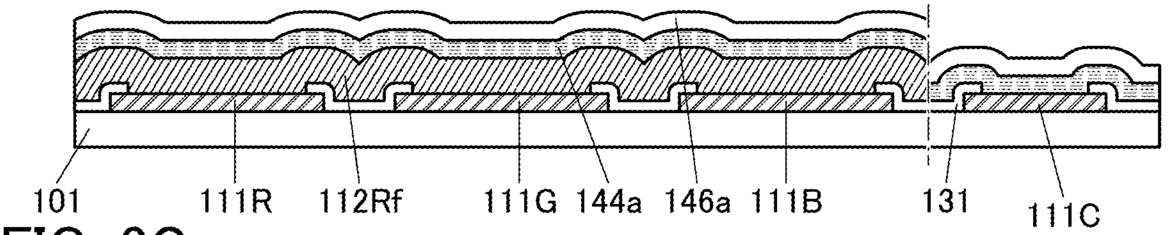

Next, the protective film 146*a* is formed over the sacrificial film 144*a* (FIG. 3B).

The protective film 146*a* is a film used as a hard mask when the sacrificial film 144*a* is etched later. In a later step of processing the protective film 146*a*, the sacrificial film 144*a* is exposed. Thus, the combination of films having high etching selectivity therebetween is selected for the sacrificial film 144*a* and the protective film 146*a*. It is thus possible to select a film that can be used for the protective film 146*a* depending on etching conditions of the sacrificial film 144*a* and etching conditions of the protective film 146*a*.

For example, in the case where dry etching using a gas containing fluorine (also referred to as a fluorine-based gas) is used for the etching of the protective film 146*a*, silicon, silicon nitride, silicon oxide, tungsten, titanium, molybdenum, tantalum, tantalum nitride, an alloy containing molybdenum and niobium, an alloy containing molybdenum and tungsten, or the like can be used for the protective film 146*a*.

Here, a metal oxide film using IGZO, ITO, or the like is given as a film having high etching selectivity (that is, enabling low etching rate) in dry etching using the fluorine-based gas, and such a film can be used as the sacrificial film 144*a*.

Without being limited to the above, a material of the protective film 146*a* can be selected from a variety of materials depending on etching conditions of the sacrificial film 144*a* and etching conditions of the protective film 146*a*. For example, any of the films that can be used for the sacrificial film 144*a* can used.

As the protective film 146*a*, a nitride film can be used, for example. Specifically, it is possible to use a nitride such as silicon nitride, aluminum nitride, hafnium nitride, titanium nitride, tantalum nitride, tungsten nitride, gallium nitride, or germanium nitride.

As the protective film 146*a*, an oxide film can also be used. Typically, an oxide film or an oxynitride film such as silicon oxide, silicon oxynitride, aluminum oxide, aluminum oxynitride, hafnium oxide, or hafnium oxynitride can be used.

For example, for the sacrificial film 144*a*, an inorganic insulating material, such as aluminum oxide, hafnium oxide, or silicon oxide, formed by an ALD method is preferably used; and for the protective film 146*a*, a metal oxide containing indium, such as an indium gallium zinc oxide (also denoted as In—Ga—Zn oxide or IGZO), formed by a sputtering method is preferably used.

Alternatively, as the protective film 146*a*, an organic film that can be used as the EL film 112Rf or the like can be used. For example, the protective film 146*a* can be formed using the same organic film that are used as the EL film 112Rf, an EL film 112Gf, or an EL film 112Bf. The use of such an organic film is preferable, in which case the same deposition apparatus can be used for forming the EL film 112Rf or the like.

[Formation of Resist Mask 143*a*]

Figure 3C:
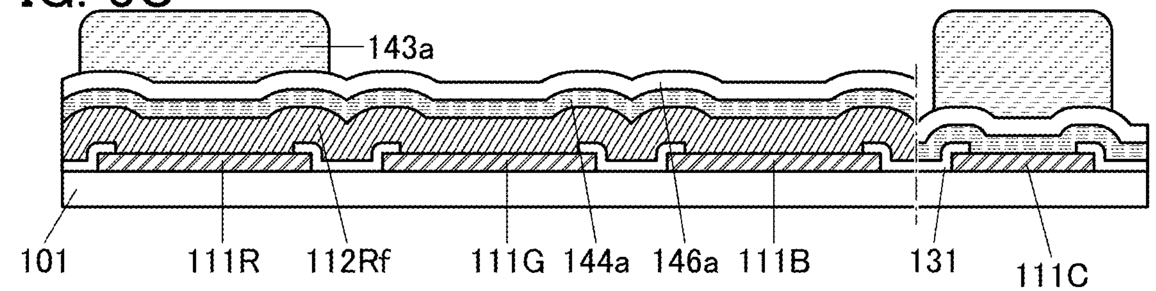

Then, over the protective film 146*a*, a resist mask 143*a* is formed in each of a position overlapping with the pixel electrode 111R and a position overlapping with the connection electrode 111C (FIG. 3C).

For the resist mask 143*a*, a resist material containing a photosensitive resin such as a positive type resist material or a negative type resist material can be used.

In the case where the resist mask 143*a* is formed over the sacrificial film 144*a* without using the protective film 146*a*, there is a risk of dissolving the EL film 112Rf due to a solvent of the resist material if a defect such as a pinhole exists in the sacrificial film 144*a*. Such a defect can be prevented by using the protective film 146*a*.

Note that in the case where a film that is unlikely to cause a defect such as a pinhole is used as the sacrificial film 144*a*, the resist mask 143*a* may be formed directly on the sacrificial film 144*a* without using the protective film 146*a*.

[Etching of Protective Film 146*a*]

Next, part of the protective film 146*a* that is not covered with the resist mask 143*a* is removed by etching, so that a band-shaped protective layer 147*a* is formed. At this time, the protective layer 147*a* is concurrently formed also over the connection electrode 111C.

In the etching of the protective film 146*a*, an etching condition with high selectivity is preferably employed so that the sacrificial film 144*a* is not removed by the etching. Either wet etching or dry etching can be performed for the etching of the protective film 146*a*; the use of dry etching is preferable, in which case a shrinkage of the pattern of the protective film 146*a* can be inhibited.

[Removal of Resist Mask 143*a*]

Figure 3D:
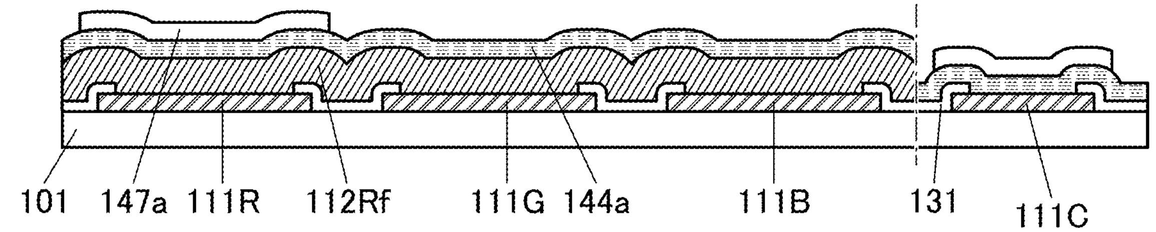

Next, the resist mask 143*a* is removed (FIG. 3D).

The removal of the resist mask 143*a* can be performed by wet etching or dry etching. It is particularly preferable to perform dry etching (also referred to as plasma ashing) using an oxygen gas as an etching gas to remove the resist mask 143*a*.

At this time, the removal of the resist mask 143*a* is performed in a state where the EL film 112Rf is covered with the sacrificial film 144*a*; thus, the influence on the EL film 112Rf is inhibited. In particular, when the EL film 112Rf is exposed to oxygen, the electrical characteristics are adversely affected in some cases; thus, it is suitable in the case where etching using an oxygen gas, such as plasma ashing, is performed.

[Etching of Sacrificial Film 144*a*]

Figure 3E:
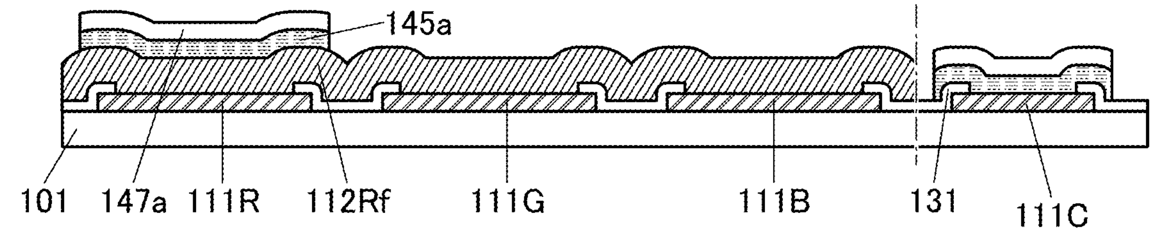

Next, part of the sacrificial film 144*a* that is not covered with the protective layer 147*a* is removed by etching with use of the protective layer 147*a* as a mask, so that a band-shaped sacrificial layer 145*a* is formed (FIG. 3E). At this time, the sacrificial layer 145*a* is concurrently formed also over the connection electrode 111C.

Either wet etching or dry etching can be performed for the etching of the sacrificial film 144*a*; the use of dry etching is preferable, in which case a shrinkage of the pattern can be inhibited.

[Etching of EL Film 112Rf and Protective Layer 147*a*]

Figure 3F:
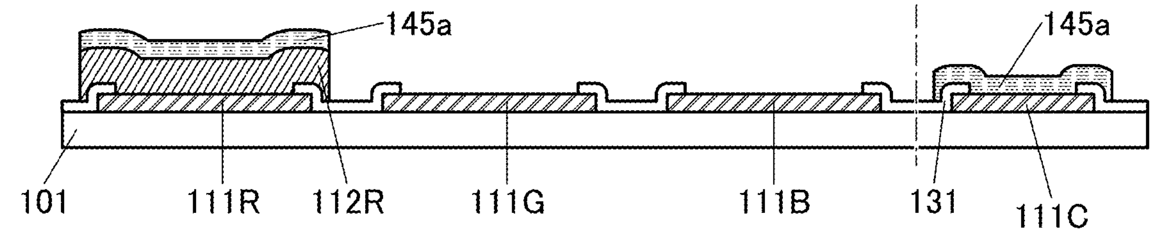

Next, part of the EL film 112Rf that is not covered with the sacrificial layer 145*a* is removed by etching at the same time as etching of the protective layer 147*a*, whereby the EL layer 112R having a band shape is formed (FIG. 3F). At this time, the protective layer 147*a* over the connection electrode 111C is also removed at the same time.

The EL film 112Rf and the protective layer 147*a* are preferably etched by the same treatment, in which case the process can be simplified and the manufacturing cost of the display device can be reduced.

In particular, for the etching of the EL film 112Rf, it is preferable to perform dry etching using an etching gas that does not contain oxygen as its main component. This is because the alteration of the EL film 112Rf is inhibited, and a highly reliable display device can be achieved. Examples of the etching gas that does not contain oxygen as its main component include $CF_4$, $C_4F_8$, $SF_6$, $CHF_3$, $Cl_2$, $H_2O$, $BCl_3$, $H_2$, or a noble gas such as He. Alternatively, a mixed gas of the above gas and a dilute gas that does not contain oxygen can be used as the etching gas.

Note that the etching of the EL film 112Rf and the etching of the protective layer 147*a* may be performed separately. In that case, either the etching of the EL film 112Rf or the etching of the protective layer 147*a* may be performed first.

At this step, the EL layer 112R and the connection electrode 111C are covered with the sacrificial layer 145*a*.

[Formation of EL Film 112Gf]

Subsequently, the EL film 112Gf to be the EL layer 112G later is deposited over the sacrificial layer 145*a*, the insulating layer 131, the pixel electrode 111G, and the pixel electrode 111B. In that case, it is preferable that the EL film 112Gf be not provided over the connection electrode 111C like the EL film 112Rf is not provided.

The above description of the EL film 112Rf can be referred to for the formation method of the EL film 112Gf.

[Formation of Sacrificial Film 144*b*]

Subsequently, a sacrificial film 144*b* is formed over the EL film 112Gf. The sacrificial film 144*b* can be formed in a manner similar to that for the sacrificial film 144*a*. In particular, the sacrificial film 144*b* and the sacrificial film 144*a* are preferably formed using the same material.

At this time, the sacrificial film 144*b* is concurrently formed also over the connection electrode 111C so as to cover the sacrificial layer 145*a*.

[Formation of Protective Film 146*b*]

Next, a protective film 146*b* is formed over the sacrificial film 144*b*. The protective film 146*b* can be formed in a manner similar to that for the protective film 146*a*. In particular, the protective film 146*b* and the protective film 146*a* are preferably formed using the same material.

[Formation of Resist Mask 143*b*]

Figure 4A:
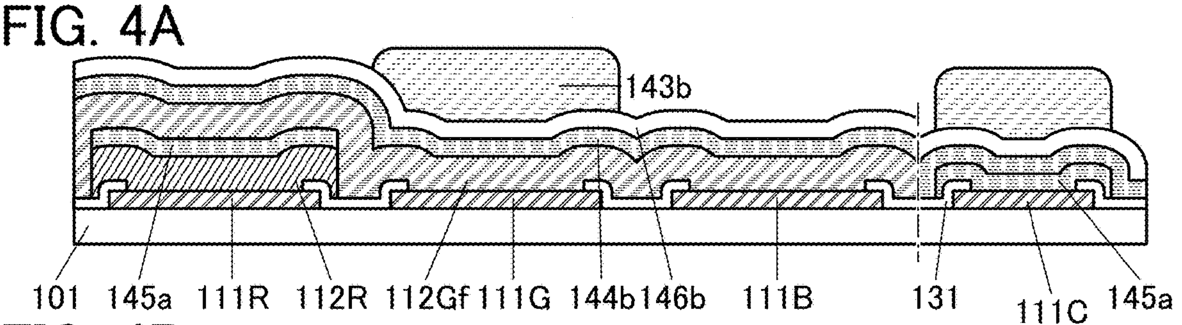
FIG. 4A to FIG. 4F are diagrams illustrating the example of the method for manufacturing the display device.

Then, over the protective film 146*b*, a resist mask 143*b* is formed in a position overlapping with the pixel electrode 111G and a position overlapping with the connection electrode 111C (FIG. 4A).

The resist mask 143*b* can be formed in a manner similar to that for the resist mask 143*a*.

[Etching of Protective Film 146*b*]

Figure 4B:
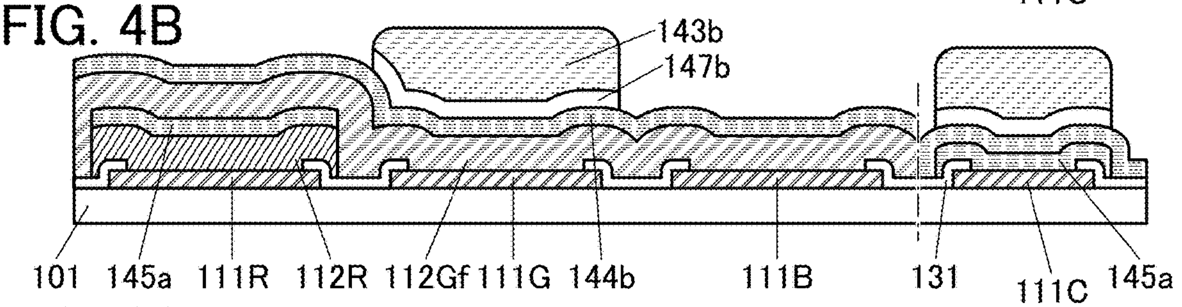

Next, part of the protective film 146*b* that is not covered with the resist mask 143*b* is removed by etching, so that a band-shaped protective layer 147*b* is formed (FIG. 4B). At this time, the protective layer 147*b* is concurrently formed also over the connection electrode 111C.

The above description of the protective film 146*a* can be referred to for the etching of the protective film 146*b*.

[Removal of Resist Mask 143*b*]

Next, the resist mask 143*b* is removed. The above description of the resist mask 143*a* can be referred to for the removal of the resist mask 143*b*.

[Etching of Sacrificial Film 144*b*]

Next, part of the sacrificial film 144*b* that is not covered with the protective layer 147*b* is removed by etching with use of the protective layer 147*b* as a mask, so that a band-shaped sacrificial layer 145*b* is formed. At this time, the sacrificial layer 145*b* is concurrently formed also over the connection electrode 111C. The sacrificial layer 145*a* and the sacrificial layer 145*b* are stacked over the connection electrode 111C.

The above description of the sacrificial film 144*a* can be referred to for the etching of the sacrificial film 144*b*.

[Etching of EL Film 112Gf and Protective Layer 147*b*]

Figure 4C:
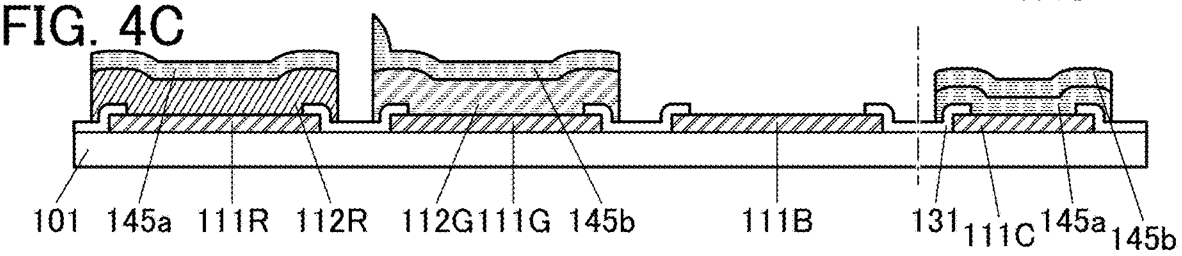

Next, part of the EL film 112Gf that is not covered with the sacrificial layer 145*b* is removed by etching at the same time as etching of the protective layer 147*b*, whereby the EL layer 112G having a band shape is formed (FIG. 4C). At this time, the protective layer 147*b* over the connection electrode 111C is also removed at the same time.

The above description of the EL film 112Rf and the protective layer 147*a* can be referred to for the etching of the EL film 112Gf and the protective layer 147*b*.

At this time, the EL layer 112R is protected by the sacrificial layer 145*a*, and thus can be prevented from being damaged due to the etching step of the EL film 112Gf.

In the above manner, the band-shaped EL layer 112R and the band-shaped EL layer 112G can be separately formed with high alignment accuracy.

[Formation of EL Layer 112B]

Figure 4D:
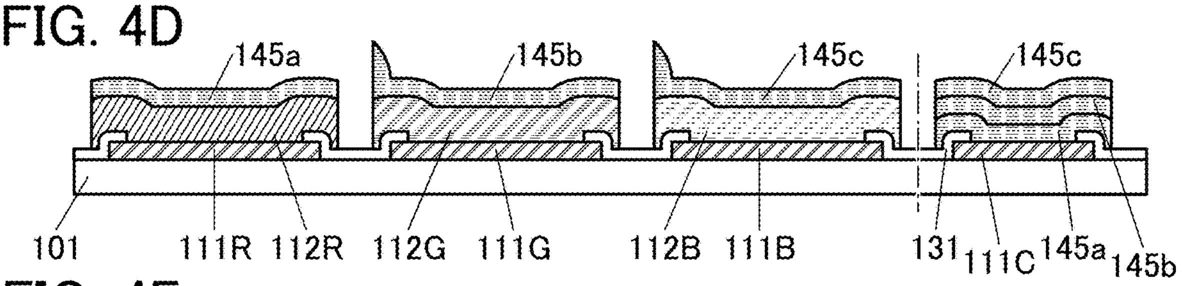

The above steps are performed on the EL film 112Bf (not illustrated), whereby the island-shaped EL layer 112B and an island-shaped sacrificial layer 145*c* can be formed (FIG. 4D).

That is, after the EL layer 112G is formed, the EL film 112Bf, a sacrificial film 144*c*, a protective film 146*c*, and a resist mask 143*c* (each of which is not illustrated) are sequentially formed. After that, the protective film 146*c* is etched to form a protective layer 147*c* (not illustrated); then, the resist mask 143*c* is removed. Subsequently, the sacrificial film 144*c* is etched to form the sacrificial layer 145*c*. Then, the protective layer 147*c* and the EL film 112Bf are etched to form the band-shaped EL layer 112B.

After the EL layer 112B is formed, the sacrificial layer 145*c* is concurrently formed also over the connection electrode 111C. The sacrificial layer 145*a*, the sacrificial layer 145*b*, and the sacrificial layer 145*c* are stacked over the connection electrode 111C.

[Removal of Sacrificial Layer]

Figure 4E:
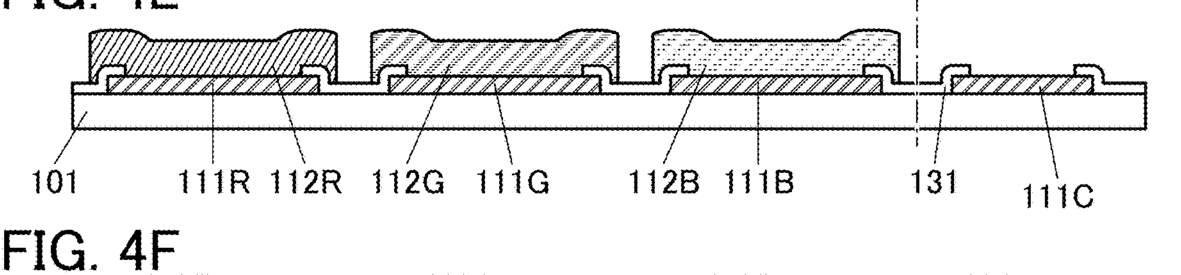

Next, the sacrificial layer 145*a*, the sacrificial layer 145*b*, and the sacrificial layer 145*c* are removed, whereby top surfaces of the EL layer 112R, the EL layer 112G, and the EL layer 112B are exposed (FIG. 4E). At this time, the top surface of the connection electrode 111C is also exposed at the same time.

The sacrificial layer 145*a*, the sacrificial layer 145*b*, and the sacrificial layer 145*c* can be removed by wet etching or dry etching. At this time, a method that causes damage to the EL layer 112R, the EL layer 112G, and the EL layer 112B as little as possible is preferably employed. In particular, wet etching is preferably used. For example, wet etching using a tetramethyl ammonium hydroxide (TMAH) aqueous solution, diluted hydrofluoric acid, oxalic acid, phosphoric acid, acetic acid, nitric acid, or a mixed solution thereof is preferably performed.

Alternatively, the sacrificial layer 145*a*, the sacrificial layer 145*b*, and the sacrificial layer 145*c* are preferably removed by being dissolved in a solvent such as water or alcohol. Here, examples of the alcohol in which the sacrificial layer 145*a*, the sacrificial layer 145*b*, and the sacrificial layer 145*c* can be dissolved include a variety of alcohol such as ethyl alcohol, methyl alcohol, isopropyl alcohol (IPA), and glycerin.

After the sacrificial layer 145*a*, the sacrificial layer 145*b*, and the sacrificial layer 145*c* are removed, drying treatment is preferably performed in order to remove water contained in the EL layer 112R, the EL layer 112G, and the EL layer 112B and water adsorbed on the surfaces of the EL layer 112R, the EL layer 112G, and the EL layer 112B. For example, heat treatment is preferably performed in an inert gas atmosphere or a reduced-pressure atmosphere. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere, in which case drying at a lower temperature is possible.

In this manner, the EL layer 112R, the EL layer 112G, and the EL layer 112B can be formed separately.

[Formation of EL Layer 114]

Then, the EL layer 114 is deposited to cover the EL layer 112R, the EL layer 112G, and the EL layer 112B.

The EL layer 114 can be deposited in a manner similar to that of the EL film 112Rf or the like. In the case where the EL layer 114 is deposited by an evaporation method, the EL layer 114 is preferably deposited using a shielding mask so as not to be deposited over the connection electrode 111C.

[Formation of Common Electrode 113]

Figure 4F:
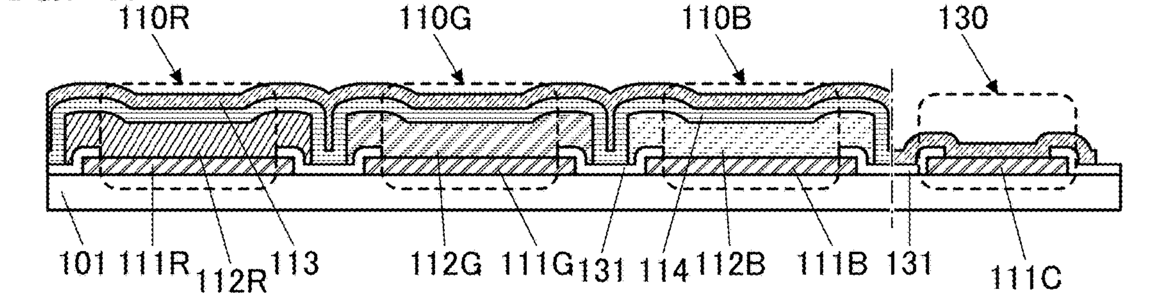

Then, the common electrode 113 is formed to cover the EL layer 114 and the connection electrode 111C (FIG. 4F).

The common electrode 113 can be formed by a deposition method such as an evaporation method or a sputtering method. Alternatively, a film formed by an evaporation method and a film formed by a sputtering method may be stacked. In that case, the common electrode 113 is preferably formed so as to cover a region where the EL layer 114 is deposited. That is, a structure in which end portions of the EL layer 114 overlap with the common electrode 113 can be obtained. The common electrode 113 is preferably formed using a shielding mask.

The common electrode 113 is electrically connected to the connection electrode 111C outside a display region.

[Formation of Protective Layer]

Next, the protective layer 121 is formed over the common electrode 113. An inorganic insulating film used for the protective layer 121 is preferably deposited by a sputtering method, a PECVD method, or an ALD method. In particular, an ALD method is preferable because a film formed by an ALD method has good step coverage and is less likely to cause a defect such as a pinhole. An organic insulating film is preferably deposited by an inkjet method because a uniform film can be formed in a desired area.

Through the above steps, the display device 100 illustrated in FIG. 1B and FIG. 1C can be manufactured.

Although the case where the common electrode 113 and the EL layer 114 are formed so as to have different top surface shapes is described above, they may be formed in the same region i.e., they may be formed to have the same top surface shape.

Figure 5A:
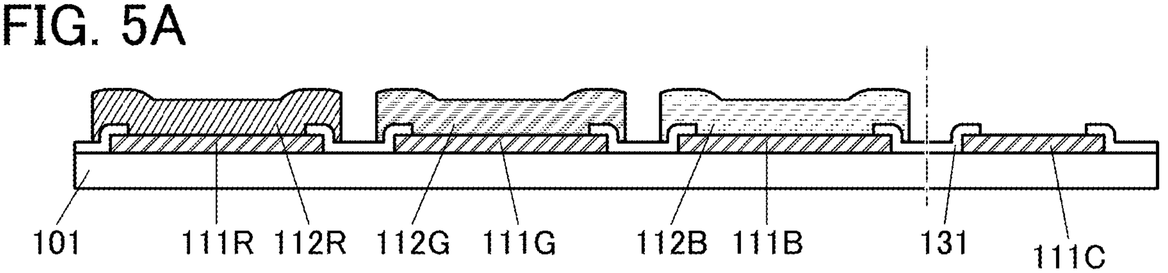
FIG. 5A to FIG. 5C are diagrams illustrating the example of the method for manufacturing the display device.
Figure 5B:
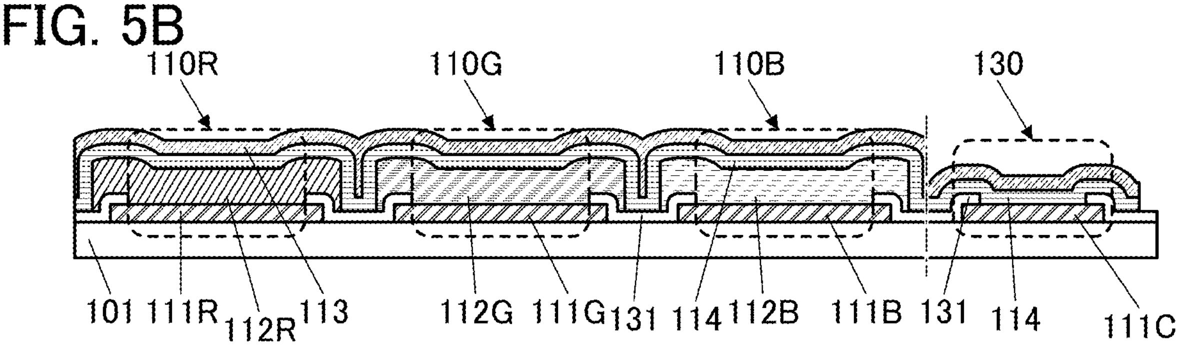

FIG. 5A is a schematic cross-sectional view after removal of the sacrificial layer in the above description. For example, as illustrated in FIG. 5B, the EL layer 114 and the common electrode 113 can be formed using the same shielding mask or without using a shielding mask. Thus, manufacturing cost can be reduced as compared to the case where different shielding masks are used.

As illustrated in FIG. 5B, in the connection portion 130, the EL layer 114 is provided between the connection electrode 111C and the common electrode 113. At this time, for the EL layer 114, a material with as low electric resistance as possible is preferably used. Alternatively, it is preferable to form the EL layer 114 as thin as possible, in which case the electric resistance of the EL layer 114 in the thickness direction can be reduced. For example, the EL layer 114 can be formed using a material having an electron-injection property or a hole-injection property having a thickness greater than or equal to 1 nm and less than or equal to 5 nm, preferably greater than or equal to 1 nm and less than or equal to 3 nm, whereby the electric resistance between the connection electrode 111C and the common electrode 113 can be made negligible in some cases.

Figure 5C:
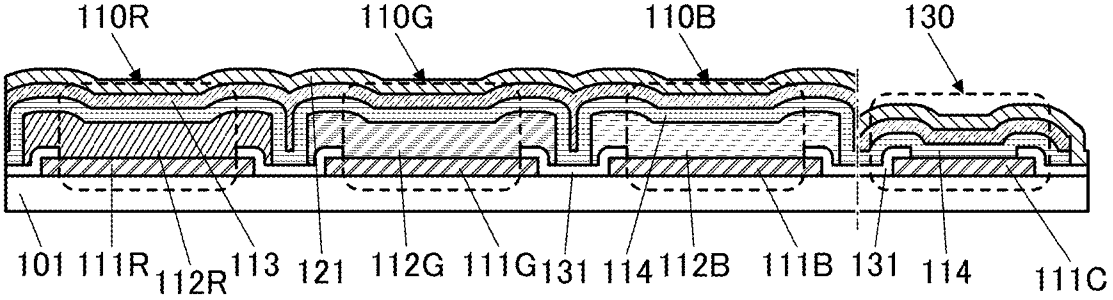

Subsequently, the protective layer 121 is formed as illustrated in FIG. 5C. At this time, as illustrated in FIG. 5C, the protective layer 121 is preferably provided to cover end portions of the common electrode 113 and the end portions of the EL layer 114. Accordingly, diffusion of impurities such as water or oxygen into the EL layer 114 and an interface between the EL layer 114 and the common electrode 113 from the outside can be effectively prevented.

Here, the adhesion between the organic film used in the EL layer and the inorganic insulating film is low in some cases, whereby film separation (peeling) due to stress in the manufacturing process might be caused in a portion where the formation surface is an inorganic insulating film. Thus, a structure is preferably employed in which stress of the EL layer, the sacrificial layer formed over the EL layer, and the like is easily reduced particularly in a region outside the display portion, for example.

Figure 6A:
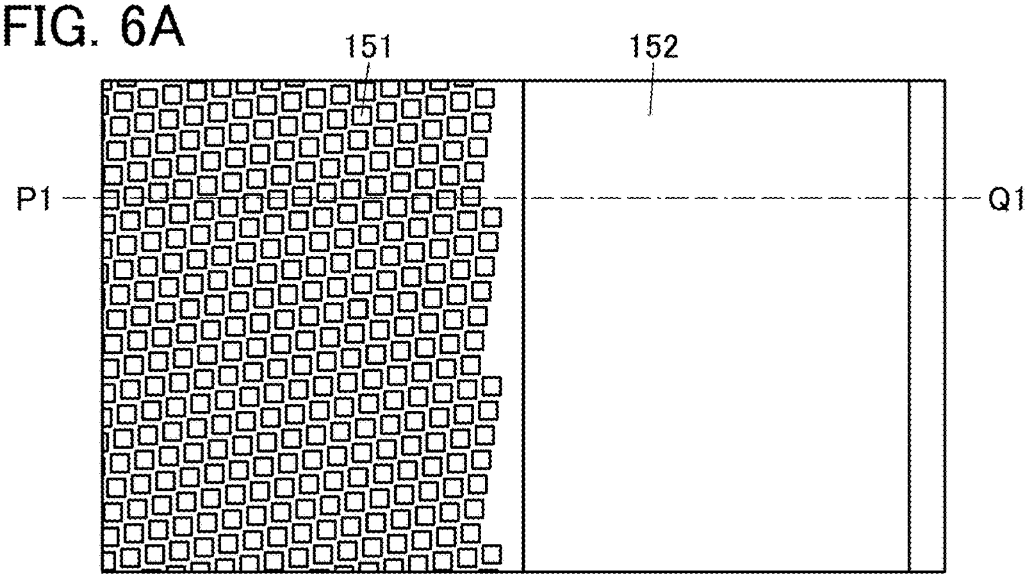
FIG. 6A to FIG. 6D are diagrams illustrating structure examples of a display device.
Figure 6B:
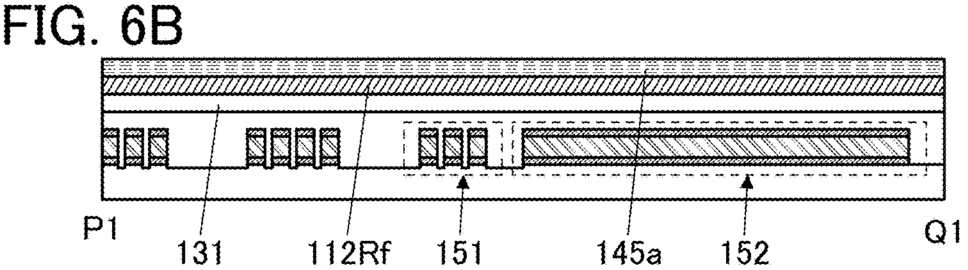

FIG. 6A is a schematic top view of a region outside the display portion, and FIG. 6B is a schematic cross-sectional view along the dashed-dotted line P1-Q2 in FIG. 6A. FIG. 6B illustrates a cross section at the time when a dummy layer 151 and a wiring 152 are covered with an insulating layer, and the insulating layer 131, the EL film 112Rf, and the sacrificial layer 145*a* are stacked over the insulating layer.

In FIG. 6A, the dummy layer 151 and the wiring 152 are provided. The dummy layer is provided to inhibit processing variations in a planarization step or the like. The wiring 152 functions as a power supply line (e.g., an anode line or a cathode line).

The dummy layer 151 has an island-shaped top surface. A plurality of dummy layers 151 are arranged periodically. Accordingly, stress is reduced in portions overlapping with the dummy layers 151, so that peeling can be inhibited from being caused in the region. Meanwhile, the wiring 152 includes a region with a large area over a wide range, and the stress of a film provided over the wiring 152 is less likely to be reduced; thus, peeling is easily caused in the region as compared with in a region where the dummy layer 151 is provided.

Figure 6C:
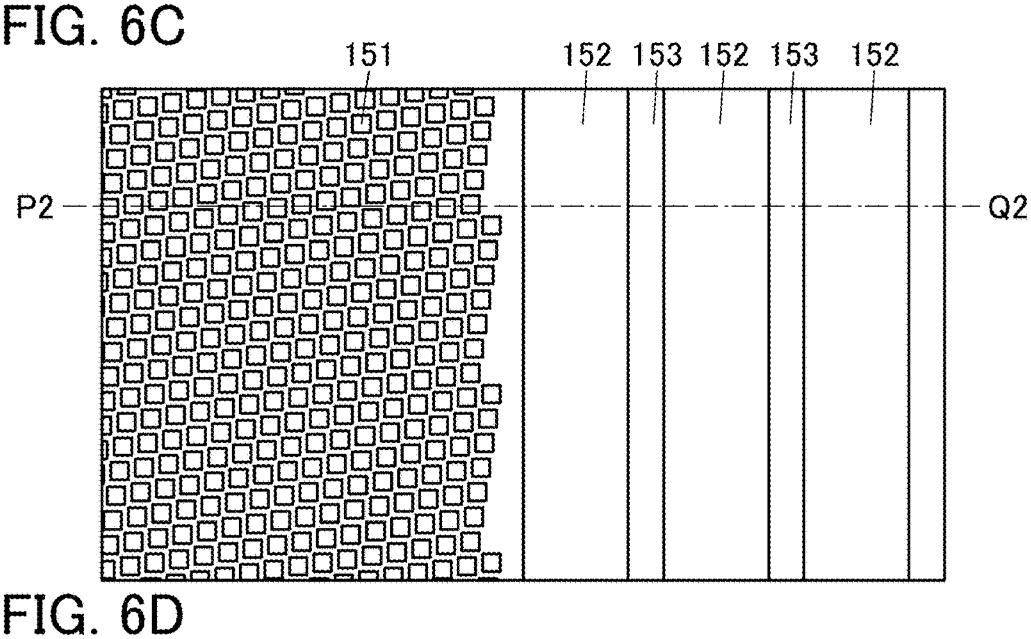
Figure 6D:
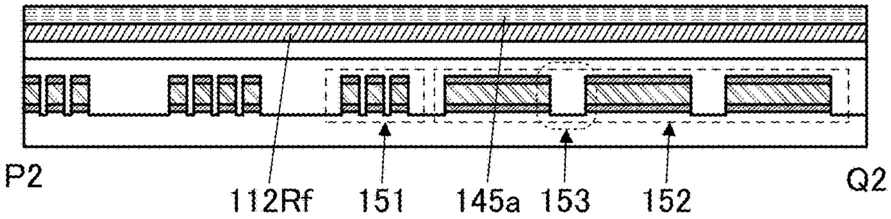

FIG. 6C is a schematic top view in which the shape of the wiring 152 is different from above. FIG. 6D is a schematic cross-sectional view along the dashed-dotted line P2-Q2 in FIG. 6C.

The wirings 152 are provided with a plurality of slits 153 as illustrated in FIG. 6A and FIG. 6B, whereby the stress of the film provided over the wirings 152 is likely to be reduced and the peeling can be inhibited from being caused.

The above is the description of an example of the method for manufacturing the display device.

Structure Example 2

In the description below, a structure example of a display device whose structure is partly different from that of Structure example 1 will be described. Hereinafter, description of the portions overlapping with the above is omitted in some cases.

A display device 100A illustrated in FIG. 7A to FIG. 7D is different from the display device 100 mainly in the shapes of the EL layer 114 and the common electrode 113.

Figure 7A:
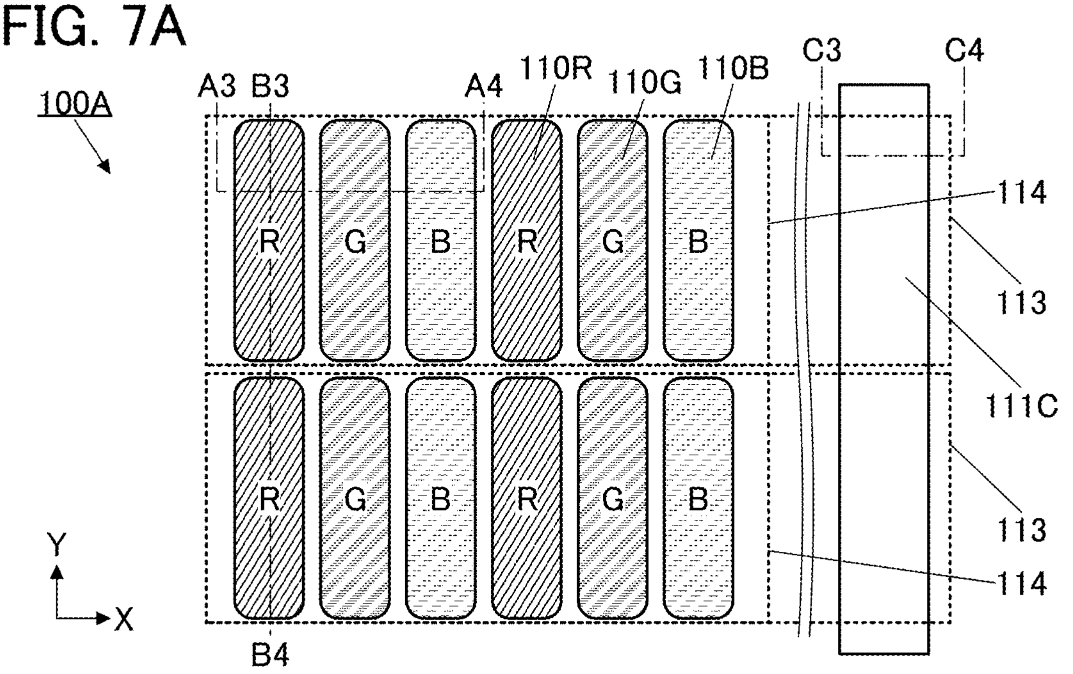
FIG. 7A to FIG. 7D are diagrams illustrating a structure example of a display device.
Figure 7B:
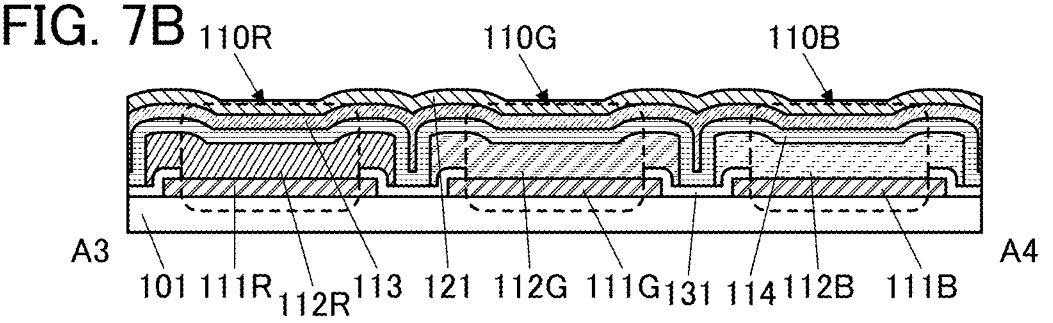
Figure 7C:
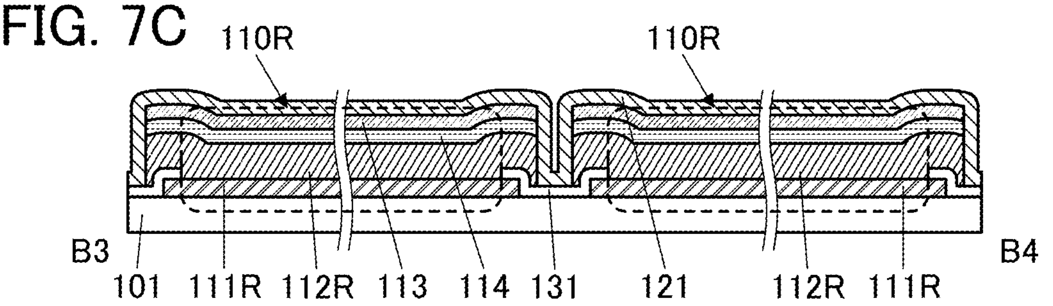
Figure 7D:
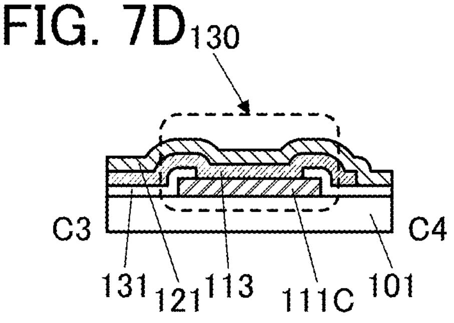

As illustrated in FIG. 7C, in a cross section in the Y direction, the EL layer 112R, the EL layer 114, and the common electrode 113 are separated between the two light-emitting elements 110R. In other words, the EL layer 112R, the EL layer 114, and the common electrode 113 have end portions in a portion overlapping with the insulating layer 131.

In addition, the protective layer 121 is provided to cover side surfaces of the EL layer 112R, the EL layer 114, and the common electrode 113 in a region overlapping with the insulating layer 131.

As illustrated in FIG. 7C, a recessed portion may be formed on part of a top surface of the insulating layer 131. In that case, the protective layer 121 is preferably provided along and in contact with the surface of the recessed portion of the insulating layer 131. This is preferable because the contact area between the insulating layer 131 and the protective layer 121 is increased and the adhesion of the insulating layer 131 and the protective layer 121 is improved.

In FIG. 7A, the outline of the common electrode 113 and the EL layer 114 is denoted by a dashed line. As illustrated in FIG. 7A, the common electrode 113 and the EL layer 114 each have a band-shaped top surface shape, whereby a longitudinal direction is parallel to the X direction. By contrast, as illustrated in FIG. 7B and FIG. 7C, the EL layer 112R has an island shape.

Although not illustrated here, the light-emitting element 110G and the light-emitting element 110B can also have a similar structure.

Manufacturing Method Example 2

An example of a method for manufacturing the display device 100A will be described below. Note that for the portions similar to those in Manufacturing method example 1, the above description is referred to and the repeated description is skipped below. The manufacturing method example described here is different from that of the above manufacturing method example 1 in the process after the formation process of the common electrode 113.

FIG. 8A to FIG. 8D are each a schematic cross-sectional view of a step described below as an example. Here, a cross section taken along the dashed-dotted line B3-B4 and a cross section taken along the dashed-dotted line C3-C4 in FIG. 7A are illustrated side by side.

Figure 8A:
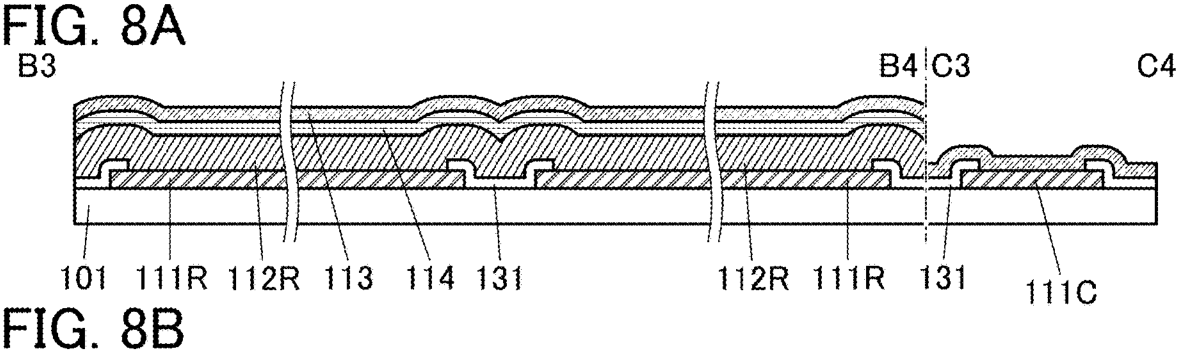
FIG. 8A to FIG. 8E are diagrams illustrating an example of a method for manufacturing a display device.

In a manner similar to that of the manufacturing method example 1, steps up to the formation of the common electrode 113 are performed in order (FIG. 8A).

Figure 8B:
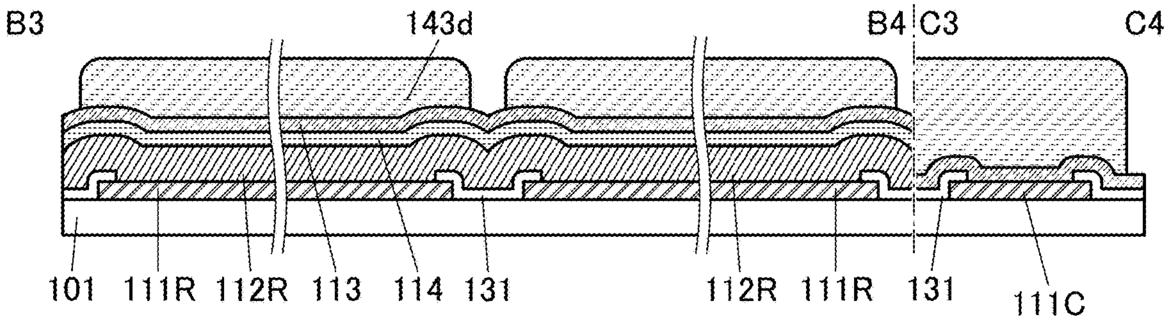

Next, a plurality of resist masks 143*d* are formed over the common electrode 113 (FIG. 8B). The resist mask 143*d* is formed to have a band-shaped top surface shape extending in the X direction. The resist mask 143*d* overlaps with the pixel electrode 111R. An end portion of the resist mask 143*d* is provided over the insulating layer 131.

Figure 8C:
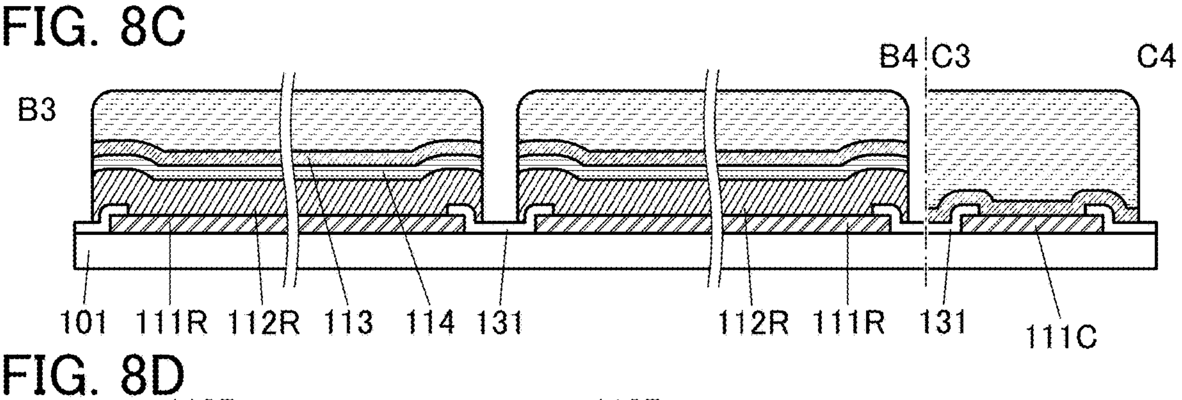

Next, portions of the common electrode 113, the EL layer 114, the EL layer 112R, the EL layer 112G (not illustrated), and the EL layer 112B (not illustrated) that are not covered with the resist mask 143*d* are removed by etching (FIG. 8C). Accordingly, the common electrode 113 and the EL layer 114 that have been covering the entire pixel electrodes and provided continuously can be divided with a slit formed by the etching so that the plurality of band-shaped common electrodes 113 and the EL layer 114 are formed.

Therefore, it is preferable to employ dry etching as the etching. For example, by changing the etching gas, the common electrode 113, the EL layer 114, the EL layer 112R, and the like are preferably etched successively without exposure to the air. Furthermore, a gas that does not contain oxygen as its main component is preferably used as the etching gas.

In the etching for the electrode 113, the EL layer 114, the EL layer 112R, and the like, part of the insulating layer 131 may be etched, so that the recessed portion may be formed in the upper portion of the insulating layer 131 as illustrated in FIG. 8C. Alternatively, a portion of the insulating layer 131 that is not covered with the resist mask 143*d* is etched and is divided into two in some cases.

Next, the resist masks 143*d* are removed. The removal of the resist masks 143*d* can be performed by wet etching or dry etching.

Figure 8D:
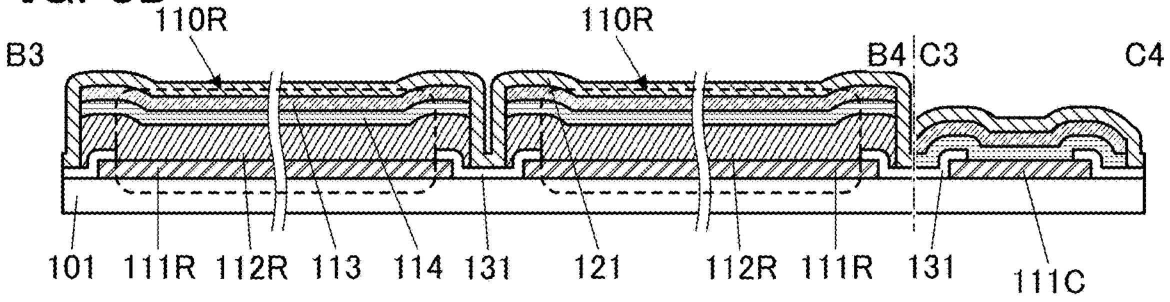

Next, the protective layer 121 is formed (FIG. 8D). The protective layer 121 is provided to cover the side surface of the common electrode 113, the side surface of the EL layer 114, and the side surface of the EL layer 112R. The protective layer 121 is preferably provided in contact with the top surface of the insulating layer 131.

Figure 8E:
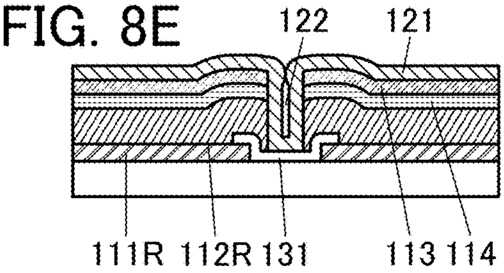

As illustrated in FIG. 8E, a space (also referred to as a gap, an interval, or the like) 122 might be formed above the insulating layer 131 when the protective layer 121 is formed. The space 122 may be in a reduced pressure state or in an atmospheric pressure. A gas such as air, nitrogen, or a noble gas or a deposition gas used for depositing the protective layer 121 may be contained.

The above is the description of an example of the method for manufacturing the display device 100A.

Note that although the resist mask 143*d* is directly formed over the common electrode 113, a film functioning as a hard mask may be provided over the common electrode 113. At this time, a hard mask can be formed using the resist mask 143*d* as a mask and after the resist mask is removed, the hard mask can be used a mask, whereby the common electrode 113, the EL layer 114, the EL layer 112R, and the like can be etched. Note that at this time, the hard mask may be removed or left.

Variation Example

A structure example whose structure is partly different from that of the above is described below. Note that in the description below, the above description is referred to for portions similar to those described above and the portions are not described.

Variation Example 1

Figure 9A:
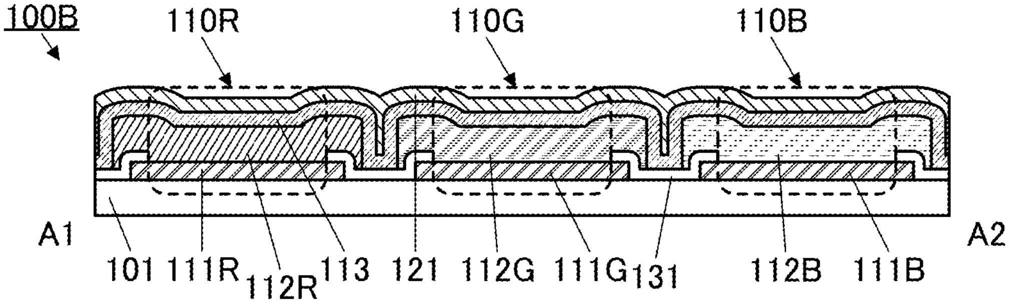
FIG. 9A to FIG. 9C are diagrams illustrating structure examples of a display device.
Figure 9B:
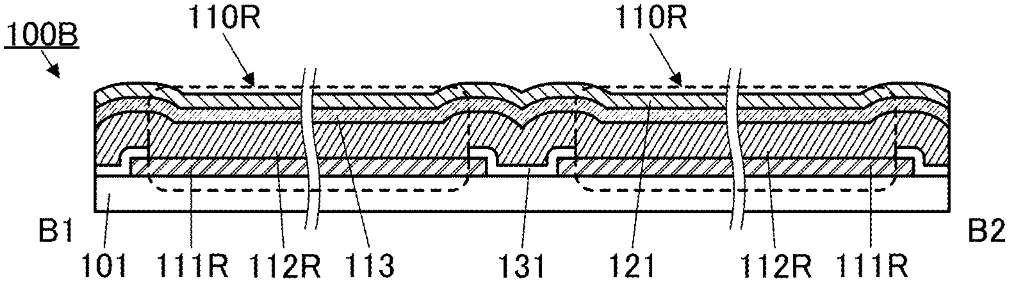

FIG. 9A and FIG. 9B are schematic cross-sectional views of a display device 100B. A top view of the display device 100B is similar to that in FIG. 1A. FIG. 9A corresponds to a cross section in the X direction, and FIG. 9B corresponds to a cross section in the Y direction.

The display device 100B is different from the display device 100 mainly in not including the EL layer 114, which is a common layer.

The common electrode 113 is provided in contact with the top surfaces of the EL layer 112R, the EL layer 112G, and the EL layer 112B. When the EL layer 114 is not provided, the light-emitting element 110R, the light-emitting element 110G, and the light-emitting element 110B can have significantly different stacked-layer structures; thus, options for materials increase, which can increase the design flexibility.

Figure 9C:
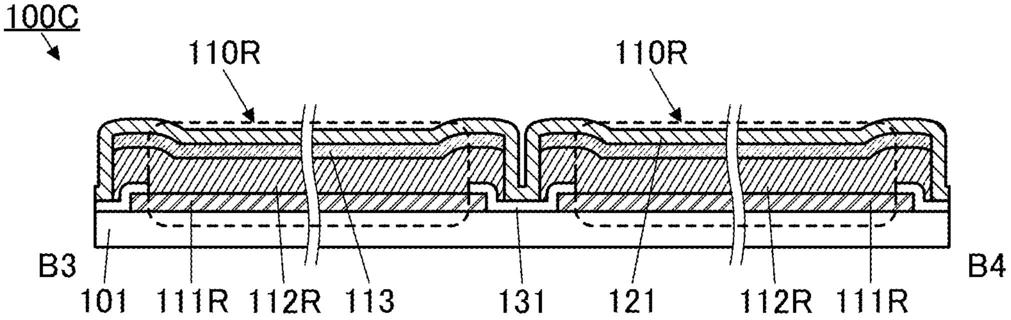

A display device 100C illustrated in FIG. 9C, as in the display device 100A, is an example of a case where a slit extending in the X direction in a region overlapping with the insulating layer 131 in the common electrode 113 is formed. In the display device 100C, the protective layer 121 is provided in contact with the side surface of the common electrode 113, the side surface of the EL layer 112R, and the top surface of the insulating layer 131.

Variation Example 2

Figure 10A:
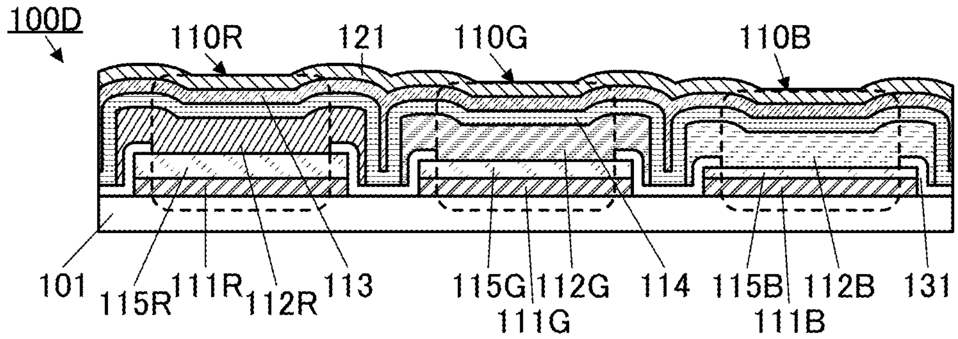
FIG. 10A to FIG. 10C are diagrams illustrating structure examples of a display device.
Figure 10B:
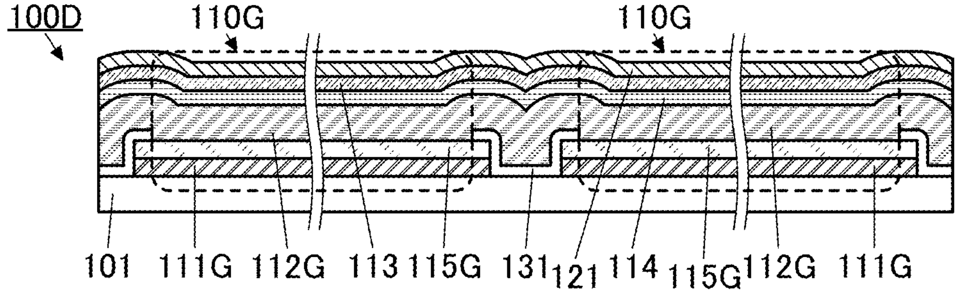

A display device 100D illustrated in FIG. 10A and FIG. 10B is different from the display device 100 mainly in the structure of the light-emitting element.

The light-emitting element 110R includes an optical adjustment layer 115R between the pixel electrode 111R and the EL layer 112R. The light-emitting element 110G includes an optical adjustment layer 115G between the pixel electrode 111G and the EL layer 112G. The light-emitting element 110B includes an optical adjustment layer 115B between the pixel electrode 111B and the EL layer 112B.

In addition, the optical adjustment layer 115R, the optical adjustment layer 115G, and the optical adjustment layer 115B each have a light-transmitting property with respect to visible light. The optical adjustment layer 115R, the optical adjustment layer 115G, and the optical adjustment layer 115B have different thicknesses. Thus, the optical path lengths of the light-emitting elements can differ from one another.

Here, a conductive film that has a property of reflecting visible light is used for the pixel electrode 111R, the pixel electrode 111G, and the pixel electrode 111B, and a conductive film that has properties of reflecting and transmitting visible light is used for the common electrode 113. Thus, the light-emitting elements have what is called a microcavity structure and intensify light with a specific wavelength. This can achieve a display device having a high color purity.

A conductive material that has a property of transmitting visible light can be used for each of the optical adjustment layers. For example, a conductive oxide such as indium oxide, indium tin oxide, indium zinc oxide, zinc oxide, zinc oxide containing gallium, indium-tin oxide containing silicon, or an indium-zinc oxide containing silicon can be used.

The optical adjustment layers can be formed after the formation of the pixel electrode 111R, the pixel electrode 111G, and the pixel electrode 111B and before the formation of the EL film 112Rf and the like. The optical adjustment layers may be formed using conductive films with different thicknesses from each other or may have a single-layer structure, a two-layer structure, a three-layer structure, or the like, in the order of small thickness.

Figure 10C:
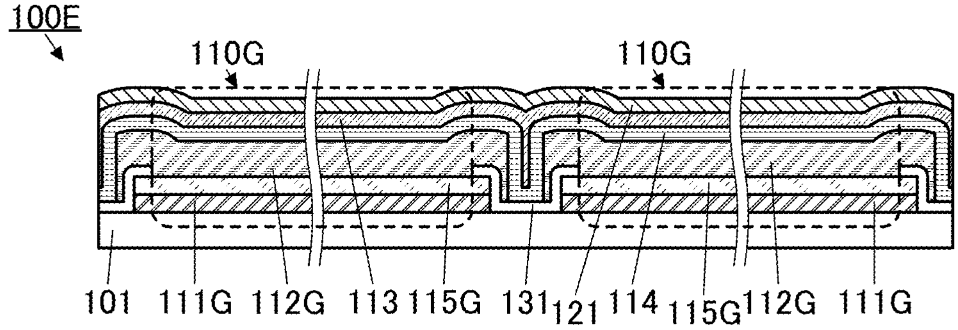

A display device 100E illustrated in FIG. 10C is an example in which an optical adjustment layer is used in the display device 100A. FIG. 10C illustrates a cross section of the two light-emitting elements 110G that are arranged side by side in the Y direction.

Variation Example 3

Figure 11A:
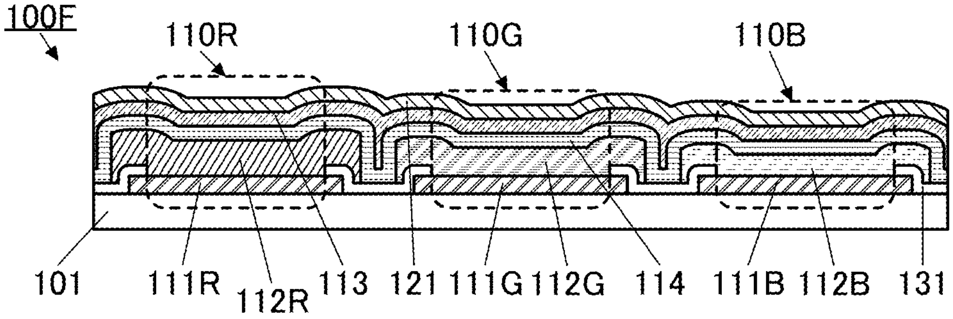
FIG. 11A to FIG. 11C are diagrams illustrating structure examples of a display device.
Figure 11B:
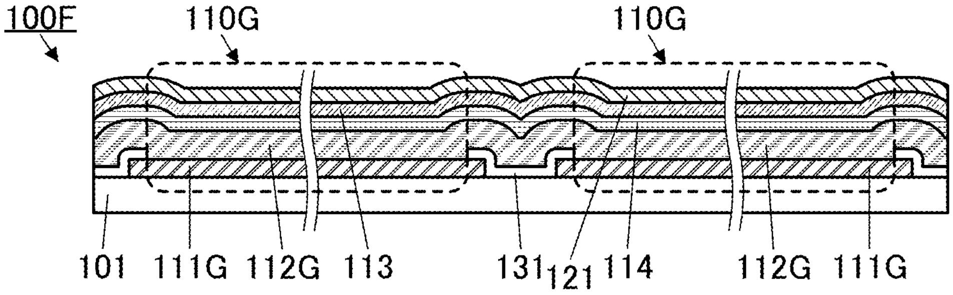

A display device 100F illustrated in FIG. 11A and FIG. 11B is different from the display device 100D mainly in not including an optical adjustment layer.

The display device 100F shows an example where a microcavity structure is achieved with the thicknesses of the EL layer 112R, the EL layer 112G, and the EL layer 112B. Such a structure does not require an optical adjustment layer provided additionally, simplifying the process.

For example, in the display device 100C, the EL layer 112R of the light-emitting element 110R emitting light whose wavelength is longest has the largest thickness, and the EL layer 112B of the light-emitting element 110B emitting light whose wavelength is shortest has the smallest thickness. Without limitation to this, the thicknesses of the EL layers can be adjusted in consideration of the wavelengths of light emitted by the light-emitting elements, the optical characteristics of the layers included in the light-emitting elements, the electrical characteristics of the light-emitting elements, and the like.

Figure 11C:
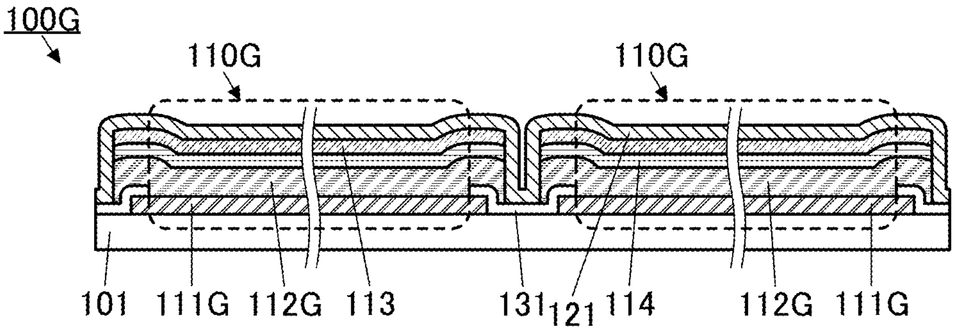

A display device 100G illustrated in FIG. 11C shows an example in which the thickness of the EL layer of the display device 100A is changed and a microcavity structure is achieved. FIG. 11C illustrates a cross section of the two light-emitting elements 110G that are arranged side by side in the Y direction.

The above is the description of the variation examples.

Note that although the example of using the EL layer 114 is described in Variation example 2 and Variation example 3, the structure in which the EL layer 114 is not provided may be employed.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 2

In this embodiment, a structure example of a display device that is different from the above will be described.

The display device in this embodiment can be a high-resolution display device. Accordingly, the display device in this embodiment can be used for display portions of information terminals (wearable devices) such as watch-type and bracelet-type information terminals and display portions of wearable devices capable of being worn on the head, such as a VR device like a head-mounted display and a glasses-type AR device.

[Display Module]

Figure 12A:
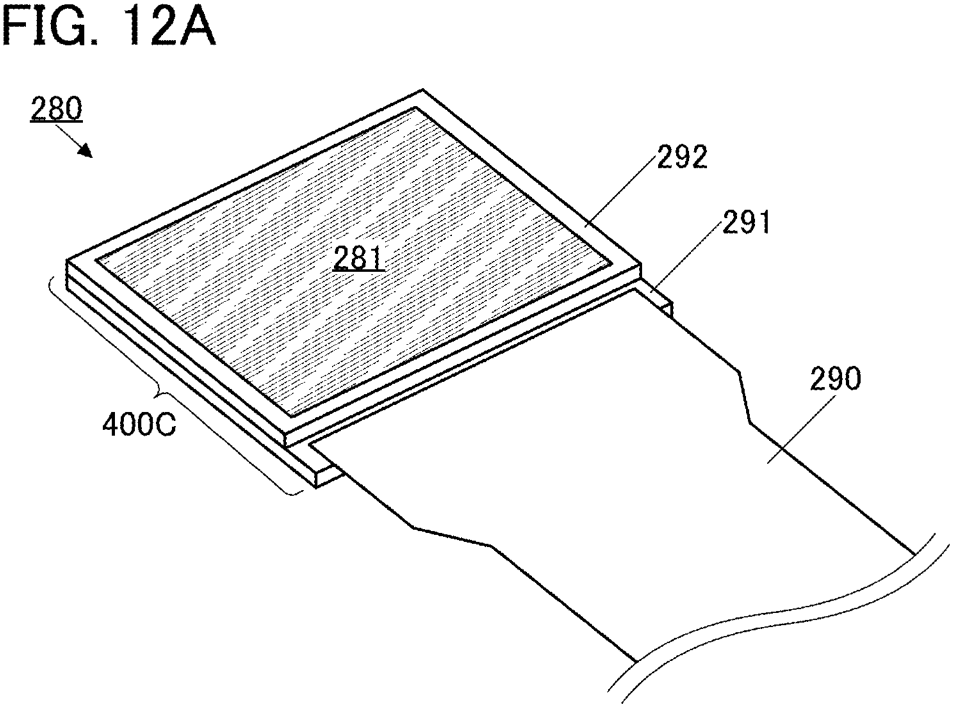
FIG. 12A and FIG. 12B are perspective views illustrating an example of a display module.

FIG. 12A is a perspective view of a display module 280. The display module 280 includes a display device 400C and an FPC 290. Note that the display device included in the display module 280 is not limited to the display device 400C and may be a display device 400D or a display device 400E described later.

The display module 280 includes a substrate 291 and a substrate 292. The display module 280 includes a display portion 281. The display portion 281 is a region of the display module 280 where an image is displayed and is a region where light emitted from pixels provided in a pixel portion 284 described later can be perceived.

Figure 12B:
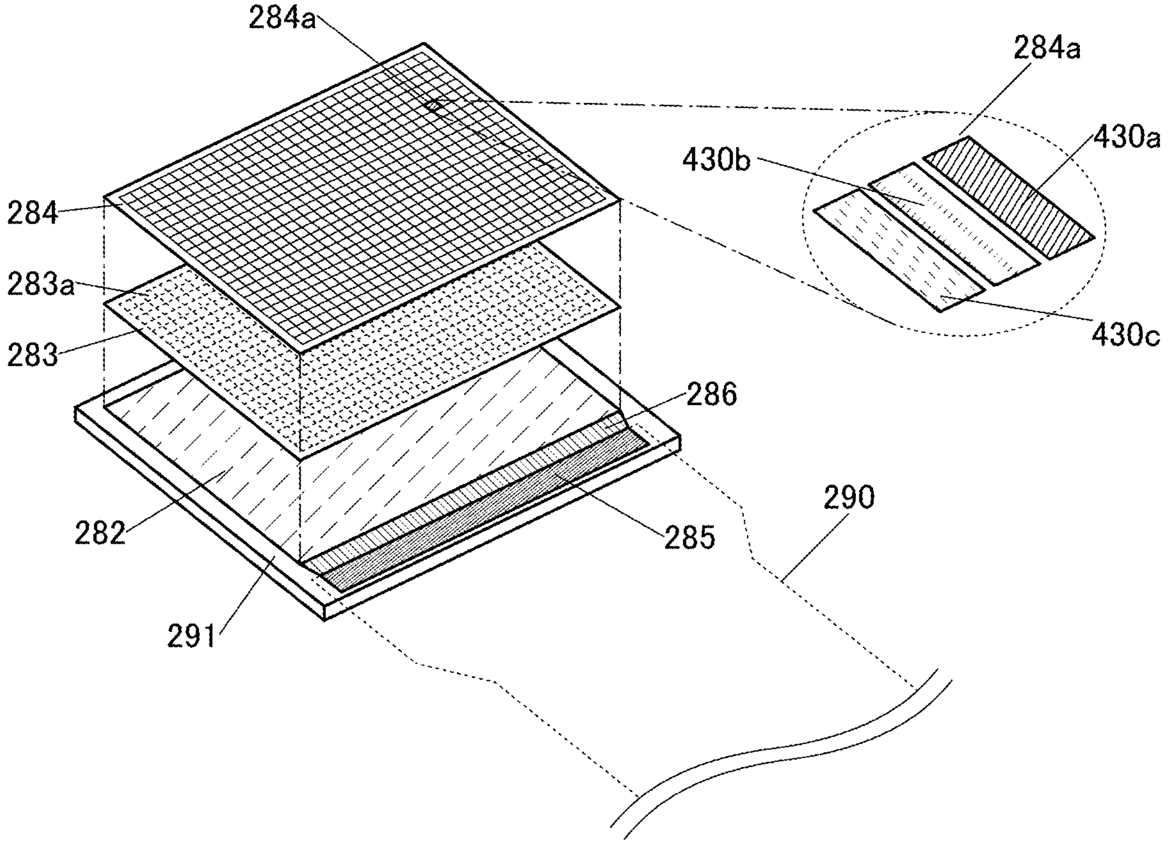

FIG. 12B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. In addition, a terminal portion 285 for connection to the FPC 290 is provided in a portion over the substrate 291 that does not overlap with the pixel portion 284. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side of FIG. 12B. The pixel 284*a* includes light-emitting elements 430*a*, 430*b*, and 430*c* whose emission colors are different from each other. The plurality of light-emitting elements can be arranged in a stripe arrangement as illustrated in FIG. 12B. With the stripe arrangement that enables high-density arrangement of pixel circuits, a high-resolution display device can be provided. Alternatively, a variety of arrangement methods such as a delta arrangement and a PenTile arrangement can be employed.

The pixel circuit portion 283 includes a plurality of pixel circuits 283*a* arranged periodically.

One pixel circuit 283*a* is a circuit that controls light emission of three light-emitting elements included in one pixel 284*a*. One pixel circuit 283*a* may be provided with three circuits for controlling light emission of the respective light-emitting elements. For example, the pixel circuit 283*a* for one light-emitting element can include at least one selection transistor, one current control transistor (driving transistor), and a capacitor. In this case, a gate signal is input to a gate of the selection transistor and a source signal is input to one of a source and a drain thereof. With such a structure, an active-matrix display device is achieved.

The circuit portion 282 includes a circuit for driving the pixel circuits 283*a* in the pixel circuit portion 283. For example, one or both of a gate line driver circuit and a source line driver circuit are preferably included. In addition, at least one of an arithmetic circuit, a memory circuit, a power supply circuit, and the like may be included.

The FPC 290 functions as a wiring for supplying a video signal, power supply potential, or the like to the circuit portion 282 from the outside. In addition, an IC may be mounted on the FPC 290.

The display module 280 can have a structure in which one or both of the pixel circuit portion 283 and the circuit portion 282 are stacked below the pixel portion 284; thus, the aperture ratio (the effective display area ratio) of the display portion 281 can be significantly high. For example, the aperture ratio of the display portion 281 can be higher than or equal to 40% and lower than 100%, preferably higher than or equal to 50% and lower than or equal to 95%, and further preferably higher than or equal to 60% and lower than or equal to 95%. Furthermore, the pixels 284*a* can be arranged extremely densely and thus the display portion 281 can have extremely high resolution. For example, the pixels 284*a* are preferably arranged in the display portion 281 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

The display module 280 has extremely high resolution, and thus can be suitably used for a device for VR such as a head-mounted display or a glasses-type device for AR. For example, even in the case of a structure in which the display portion of the display module 280 is perceived through a lens, pixels of the extremely-high-resolution display portion 281 included in the display module 280 are prevented from being perceived when the display portion is enlarged by the lens, so that display providing a high sense of immersion can be performed. Without limitation to the above, the display module 280 can also be suitably used for an electronic device having a relatively small display portion. For example, the display module 280 can be suitably used for a display portion of a wearable electronic device such as a wrist watch.

[Display Device 400C]

Figure 13:
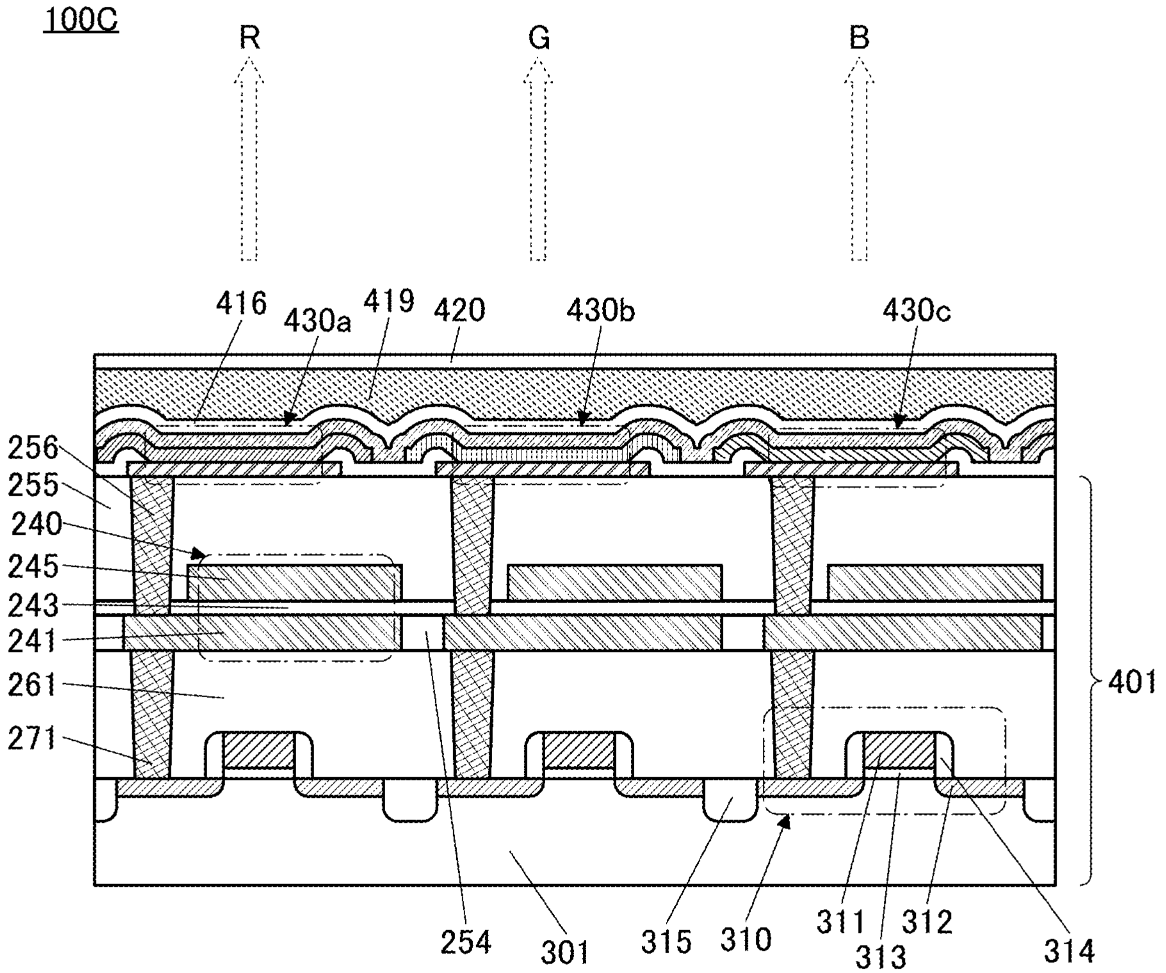
FIG. 13 is a cross-sectional view illustrating an example of a display device.

The display device 400C illustrated in FIG. 13 includes a substrate 301, the light-emitting elements 430*a*, 430*b*, and 430*c*, a capacitor 240, and a transistor 310.

The substrate 301 corresponds to the substrate 291 in FIG. 12A and FIG. 12B. A stacked-layer structure 401 including the substrate 301 and components up to an insulating layer 255 corresponds to the substrate 101 in Embodiment 1.

The transistor 310 is a transistor including a channel formation region in the substrate 301. As the substrate 301, a semiconductor substrate such as a single crystal silicon substrate can be used, for example. The transistor 310 includes part of the substrate 301, a conductive layer 311, a low-resistance region 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layer 314 is provided to cover a side surface of the conductive layer 311 and functions as an insulating layer.

In addition, an element isolation layer 315 is provided between two adjacent transistors 310 to be embedded in the substrate 301.

Furthermore, an insulating layer 261 is provided to cover the transistor 310, and the capacitor 240 is provided over the insulating layer 261.

The capacitor 240 includes a conductive layer 241, a conductive layer 245, and an insulating layer 243 positioned therebetween. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of a source and a drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

The insulating layer 255 is provided to cover the capacitor 240, and the light-emitting elements 430*a*, 430*b*, 430*c*, and the like are provided over the insulating layer 255. The protective layer 416 is provided over the light-emitting elements 430*a*, 430*b*, and 430*c*, and a substrate 420 is bonded to a top surface of the protective layer 416 with a resin layer 419. The substrate 420 corresponds to the substrate 292 in FIG. 12A.

The pixel electrode of the light-emitting element is electrically connected to one of the source and the drain of the transistor 310 through a plug 256 embedded in the insulating layer 255, the conductive layer 241 embedded in the insulating layer 254, and the plug 271 embedded in the insulating layer 261.

[Display Device 400D]

Figure 14:
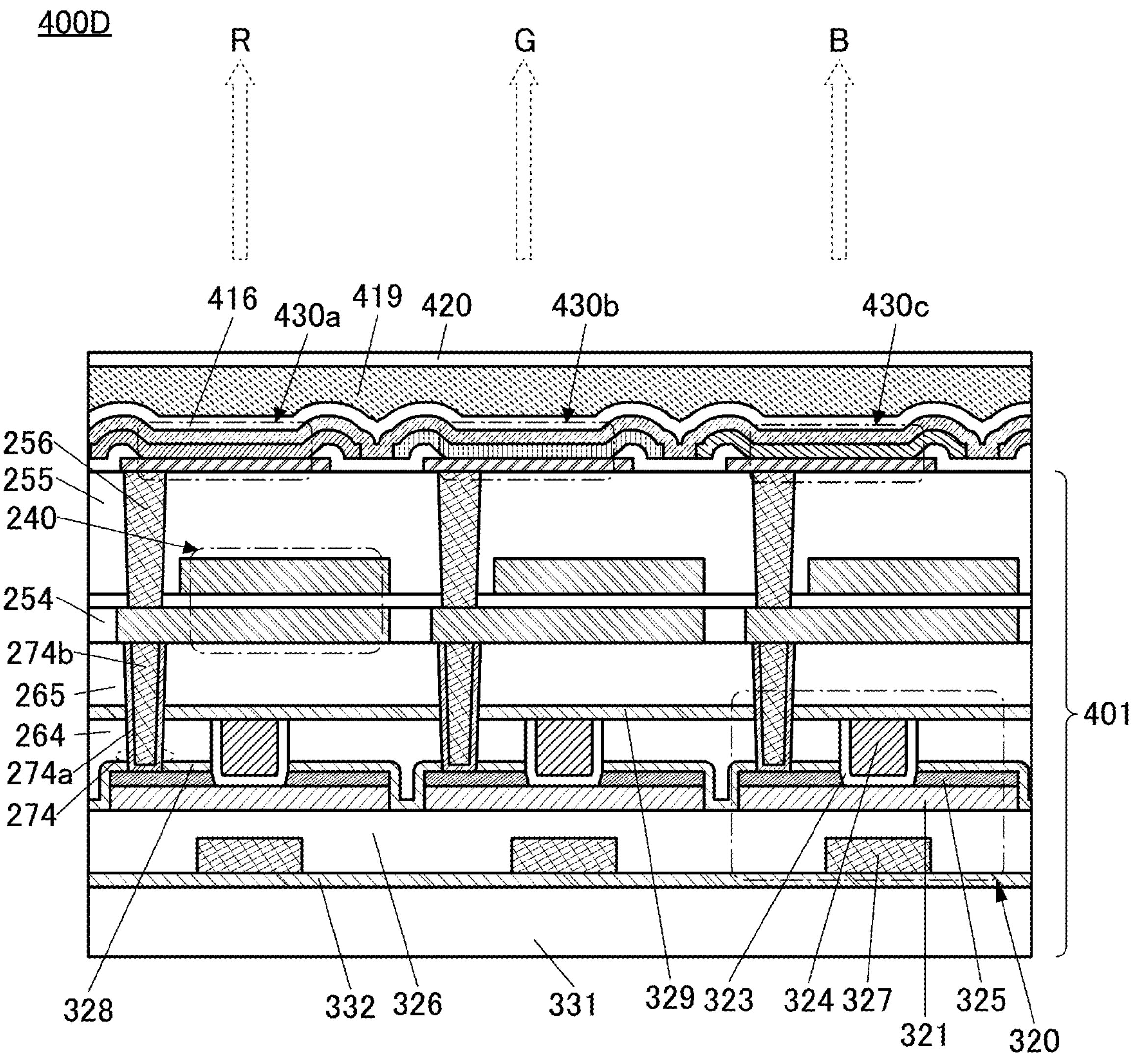
FIG. 14 is a cross-sectional view illustrating an example of a display device.

The display device 400D illustrated in FIG. 14 differs from the display device 400C mainly in a structure of a transistor. Note that portions similar to those of the display device 400C are not described in some cases.

A transistor 320 is a transistor in which a metal oxide (also referred to as an oxide semiconductor) is used in a semiconductor layer where a channel is formed.

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 12A and FIG. 12B. The stacked-layer structure 401 including the substrate 331 and components up to the insulating layer 255 corresponds to the substrate 101 in Embodiment 1. As the substrate 331, an insulating substrate or a semiconductor substrate can be used.

An insulating layer 332 is provided over the substrate 331. The insulating layer 332 functions as a barrier layer that prevents diffusion of impurities such as water and hydrogen from the substrate 331 into the transistor 320 and release of oxygen from the semiconductor layer 321 to the insulating layer 332 side. As the insulating layer 332, it is possible to use, for example, a film in which hydrogen or oxygen is less likely to be diffused than in a silicon oxide film, such as an aluminum oxide film, a hafnium oxide film, or a silicon nitride film.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. For at least part of the insulating layer 326 that is in contact with the semiconductor layer 321, an oxide insulating film such as a silicon oxide film is preferably used. In addition, a top surface of the insulating layer 326 is preferably planarized.

The semiconductor layer 321 is provided over the insulating layer 326. The semiconductor layer 321 preferably includes a film of a metal oxide exhibiting semiconductor characteristics (also referred to as an oxide semiconductor). The material that can be suitably used for the semiconductor layer 321 will be described in detail later.

The pair of conductive layers 325 is provided over and in contact with the semiconductor layer 321, and functions as a source electrode and a drain electrode.

An insulating layer 328 is provided to cover top surfaces and side surfaces of the pair of conductive layers 325, a side surface of the semiconductor layer 321, and the like, and an insulating layer 264 is provided over the insulating layer 328. The insulating layer 328 functions as a barrier layer that prevents diffusion of impurities such as water and hydrogen from the insulating layer 264 or the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with side surfaces of the insulating layer 264, the insulating layer 328, and the conductive layer 325 and a top surface of the semiconductor layer 321, and the conductive layer 324 are embedded in the opening. The conductive layer 324 functions as a second gate electrode, and the insulating layer 323 functions as a second gate insulating layer.

A top surface of the conductive layer 324, a top surface of the insulating layer 323, and a top surface of the insulating layer 264 are planarized so that they are substantially level with each other, and an insulating layer 329 and an insulating layer 265 are provided to cover these layers.

The insulating layer 264 and the insulating layer 265 function as interlayer insulating layers. The insulating layer 329 functions as a barrier layer that prevents diffusion of impurities such as water and hydrogen from the insulating layer 265 or the like into the transistor 320. As the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, and the insulating layer 264. Here, the plug 274 preferably includes a conductive layer 274*a* that covers a side surface of an opening formed in the insulating layer 265, the insulating layer 329, the insulating layer 264, and the insulating layer 328 and part of a top surface of the conductive layer 325, and a conductive layer 274*b* in contact with a top surface of the conductive layer 274*a*. In this case, a conductive material in which hydrogen and oxygen are unlikely to be diffused is preferably used for the conductive layer 274*a*.

A structure including the insulating layer 254 and components up to the substrate 420 in the display device 400D is similar to that of the display device 400C.

[Display Device 400E]

Figure 15:
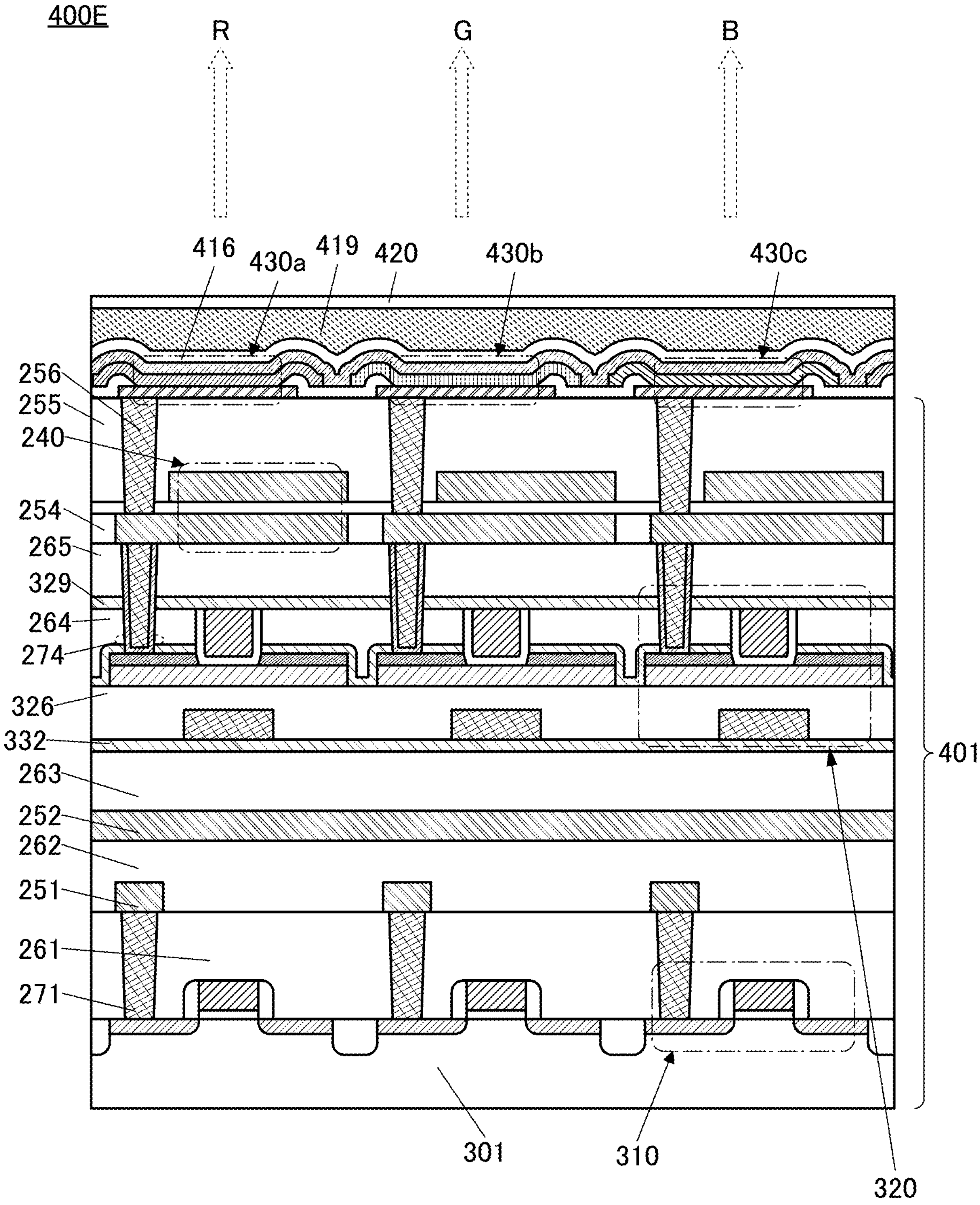
FIG. 15 is a cross-sectional view illustrating an example of a display device.

The display device 400E illustrated in FIG. 15 has a structure in which the transistor 310 whose channel is formed in the substrate 301 and the transistor 320 including a metal oxide in the semiconductor layer where the channel is formed are stacked. Note that portions similar to those of the display devices 400C and 400D are not described in some cases.

The insulating layer 261 is provided to cover the transistor 310, and a conductive layer 251 is provided over the insulating layer 261. In addition, an insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in a pixel circuit. The transistor 310 can also be used as a transistor included in a pixel circuit or a transistor included in a driver circuit (a gate line driver circuit or a source line driver circuit) for driving the pixel circuit. The transistor 310 and the transistor 320 can also be used as transistors included in a variety of circuits such as an arithmetic circuit and a memory circuit.

With such a structure, not only the pixel circuit but also the driver circuit or the like can be formed directly under the light-emitting element; thus, the display device can be downsized as compared with the case where the driver circuit is provided around a display region.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 3

In this embodiment, a light-emitting element (also referred to as a light-emitting device) that can be used in the display device of one embodiment of the present invention will be described.

In this specification and the like, a device formed using a metal mask or an FMM (fine metal mask, high-resolution metal mask) is sometimes referred to as a device having an MM (metal mask) structure. In this specification and the like, a device formed without using a metal mask or an FMM is sometimes referred to as a device having an MML (metal maskless) structure.

In this specification and the like, a structure in which light-emitting layers in light-emitting devices of different colors (here, blue (B), green (G), and red (R)) are separately formed or separately patterned is sometimes referred to as an SBS (Side By Side) structure. In this specification and the like, a light-emitting device capable of emitting white light is sometimes referred to as a white-light-emitting device. Note that a combination of white-light-emitting devices with coloring layers (e.g., color filters) enables a full-color display device.

Structures of light-emitting devices can be classified roughly into a single structure and a tandem structure. A device with a single structure includes one light-emitting unit between a pair of electrodes, and the light-emitting unit preferably includes one or more light-emitting layers. To obtain white light emission, two or more light-emitting layers are selected such that their emission colors are complementary. For example, when the emission color of a first light-emitting layer and the emission color of a second light-emitting layer are complementary colors, the light-emitting device can be configured to emit white light as a whole. The same applies to a light-emitting device including three or more light-emitting layers.

A device with a tandem structure includes two or more light-emitting units between a pair of electrodes, and each light-emitting unit preferably includes one or more light-emitting layers. To obtain white light emission, the structure is made so that light from light-emitting layers of the plurality of light-emitting units can be combined to be white light. Note that a structure for obtaining white light emission is similar to a structure in the case of a single structure. In the device with a tandem structure, an intermediate layer such as a charge-generation layer is suitably provided between the plurality of light-emitting units.

When the white-light-emitting device (having a single structure or a tandem structure) and a light-emitting device having an SBS structure are compared to each other, the light-emitting device having an SBS structure can have lower power consumption than the white-light-emitting device. To reduce power consumption, a light-emitting device having an SBS structure is suitably used. Meanwhile, the white-light-emitting device is suitable in terms of lower manufacturing cost or higher manufacturing yield because the manufacturing process of the white-light-emitting device is simpler than that of the light-emitting device having an SBS structure.

<Structure Examples of Light-Emitting Element>

Figure 16A:
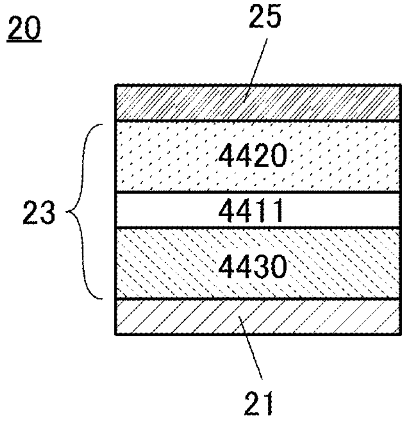
FIG. 16A to FIG. 16D are diagrams illustrating structure examples of a light-emitting element.

As illustrated in FIG. 16A, the light-emitting element includes an EL layer 23 between a pair of electrodes (a lower electrode 21 and an upper electrode 25). The EL layer 23 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between the pair of electrodes, can function as a single light-emitting unit, and the structure in FIG. 16A is referred to as a single structure in this specification.

Figure 16B:
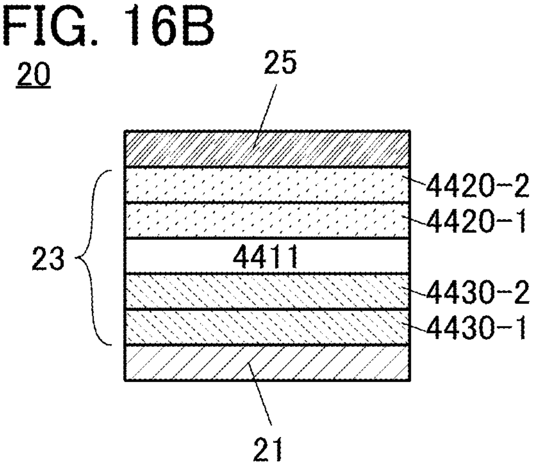

FIG. 16B is a variation example of the EL layer 23 included in a light-emitting element illustrated in FIG. 16A. Specifically, the light-emitting element 20 illustrated in FIG. 16B includes a layer 4430-1 over a lower electrode 21, a layer 4430-2 over a layer 4430-1, the light-emitting layer 4411 over the layer 4430-2, a layer 4420-1 over the light-emitting layer 4411, a layer 4420-2 over the layer 4420-1, and the upper electrode 25 over the layer 4420-2. For example, when the lower electrode 21 functions as an anode and the upper electrode 25 functions as a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, when the lower electrode 21 functions as a cathode and the upper electrode 25 functions as an anode, the layer 4430-1 functions as an electron-injection layer, the layer 4430-2 functions as an electron-transport layer, the layer 4420-1 functions as a hole-transport layer, and the layer 4420-2 functions as a hole-injection layer. With such a layered structure, carriers can be efficiently injected to the light-emitting layer 4411, and the efficiency of the recombination of carriers in the light-emitting layer 4411 can be enhanced.

Figure 16C:
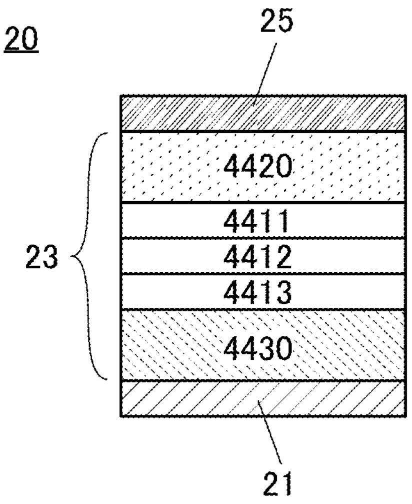

Note that the structure in which a plurality of light-emitting layers (light-emitting layers 4411, 4412, and 4413) are provided between the layer 4420 and the layer 4430 as illustrated in FIG. 16C is a variation of the single structure.

Figure 16D:
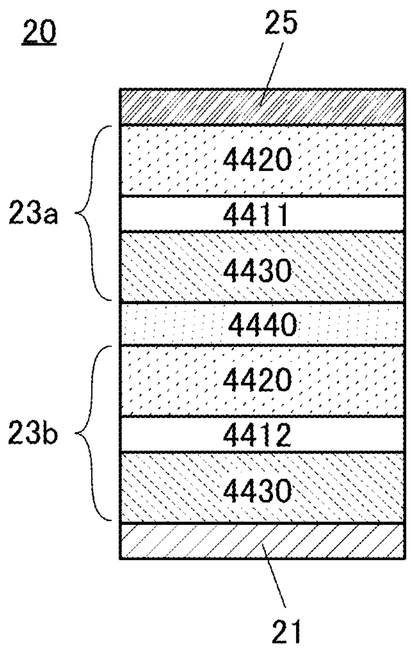

The structure in which a plurality of light-emitting units (EL layers 23*a* and 23*b*) are connected in series with an intermediate layer (charge-generation layer) 4440 therebetween as illustrated in FIG. 16D is referred to as a tandem structure in this specification. In this specification and the like, the structure illustrated in FIG. 16D is referred to as a tandem structure; however, without being limited to this, a tandem structure may be referred to as a stack structure, for example. The tandem structure enables a light-emitting element capable of high luminance light emission.

Also in the structures illustrated in FIG. 16C and FIG. 16D, the layers 4420 and the layers 4430 may each have a stacked-layer structure of two or more layers as illustrated in FIG. 16B.

The emission color of the light-emitting element can be red, green, blue, cyan, magenta, yellow, white, or the like depending on the material that constitutes the EL layer 23. Furthermore, the color purity can be further increased when the light-emitting element has a microcavity structure.

The light-emitting element that emits white light preferably contains two or more kinds of light-emitting substances in the light-emitting layer. To obtain white light emission, two or more light-emitting substances are selected such that their emission colors are complementary. For example, when the emission color of a first light-emitting layer and the emission color of a second light-emitting layer have a relationship of complementary colors, it is possible to obtain a light-emitting element which emits white light as a whole. The same applies to a light-emitting element including three or more light-emitting layers.

The light-emitting layer preferably contains two or more selected from light-emitting substances that emit light of R (red), G (green), B (blue), Y (yellow), 0 (orange), and the like. Alternatively, the light-emitting layer preferably contains two or more light-emitting substances that emit light containing two or more of spectral components of R, G, and B.

Here, a specific structure example of a light-emitting element is described.

The light-emitting element includes at least the light-emitting layer. The light-emitting element may further include, as a layer other than the light-emitting layer, a layer containing a substance with a high hole-injection property, a substance with a high hole-transport property, a hole-blocking material, a substance with a high electron-transport property, an electron-blocking material, a substance with a high electron-injection property, a substance with a bipolar property (a substance with a high electron-transport property and a high hole-transport property), or the like.

Either a low molecular compound or a high molecular compound can be used for the light-emitting device, and an inorganic compound may also be included. Each layer included in the light-emitting device can be formed by an evaporation method (including a vacuum evaporation method), a transfer method, a printing method, an inkjet method, a coating method, or the like.

For example, the light-emitting device can include one or more of a hole-injection layer, a hole-transport layer, a hole-blocking layer, an electron-blocking layer, an electron-transport layer, and an electron-injection layer in addition to the light-emitting layer.

The hole-injection layer is a layer injecting holes from an anode to the hole-transport layer, and a layer containing a material with a high hole-injection property. As the material with a high hole-injection property, an aromatic amine compound and a composite material containing a hole-transport material and an acceptor material (electron-accepting material), and the like can be given.

The hole-transport layer is a layer transporting holes, which are injected from the anode by the hole-injection layer, to the light-emitting layer. The hole-transport layer is a layer containing a hole-transport material. As the hole-transport material, a substance having a hole mobility greater than or equal to $1\times10^{-6}$ $cm^2/Vs$ is preferable. Note that other substances can also be used as long as they have a property of transporting more holes than electrons. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferable.

The electron-transport layer is a layer transporting electrons, which are injected from a cathode by the electron-injection layer, to the light-emitting layer. The electron-transport layer is a layer containing an electron-transport material. As the electron-transport material, a substance having an electron mobility greater than or equal to $1\times10^{-6}$ $cm^2/Vs$ is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a layer injecting electrons from the cathode to the electron-transport layer, and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

For the electron-injection layer, for example, an alkali metal, an alkaline earth metal, or a compound thereof, such as lithium, cesium, lithium fluoride (LiF), cesium fluoride (CsF), calcium fluoride ($CaF_2$), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide ($LiO_x$), or cesium carbonate can be used.

Alternatively, for the electron-injection layer, an electron-transport material may be used. For example, a compound having an unshared electron pair and having an electron deficient heteroaromatic ring can be used as the electron-transport material. Specifically, a compound having at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

The light-emitting layer is a layer containing a light-emitting substance. The light-emitting layer can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (a guest material). As one or more kinds of organic compounds, one or both of the hole-transport material and the electron-transport material can be used. Alternatively, as one or more kinds of organic compounds, a bipolar material or a TADF material may be used.

The light-emitting layer preferably includes, for example, a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of the light-emitting device can be achieved at the same time.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 4

In this embodiment, a high-resolution display device will be described.

[Structure Example of Pixel Circuit]

Examples of a pixel suitable for a high-resolution display device and an arrangement method thereof are described below.

Figure 17A:
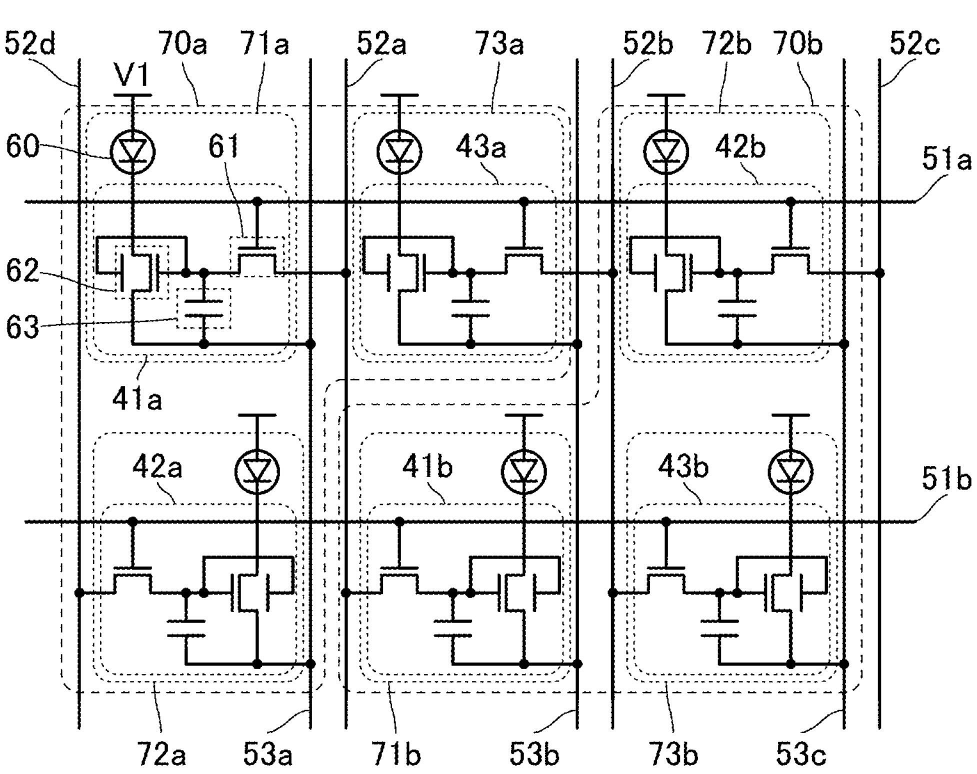
FIG. 17A and FIG. 17B are diagrams illustrating structure examples of a display device.

FIG. 17A illustrates an example of a circuit diagram of a pixel unit 70. The pixel unit 70 is composed of two pixels (a pixel 70*a* and a pixel 70*b*). In addition, the pixel unit 70 is connected to a wiring 51*a*, a wiring 51*b*, a wiring 52*a*, a wiring 52*b*, a wiring 52*c*, a wiring 52*d*, a wiring 53*a*, a wiring 53*b*, and a wiring 53*c* and the like.

The pixel 70*a* includes a subpixel 71*a*, a subpixel 72*a*, and a subpixel 73*a*. The pixel 70*b* includes a subpixel 71*b*, a subpixel 72*b*, and a subpixel 73*b*. The subpixel 71*a*, the subpixel 72*a*, and the subpixel 73*a* include a pixel circuit 41*a*, a pixel circuit 42*a*, and a pixel circuit 43*a*, respectively. The subpixel 71*b*, the subpixel 72*b*, and the subpixel 73*b* include a pixel circuit 41*b*, a pixel circuit 42*b*, and a pixel circuit 43*b*, respectively.

Each subpixel includes the pixel circuit and a display element 60. For example, the subpixel 71*a* includes the pixel circuit 41*a* and the display element 60. A light-emitting element such as an organic EL element is used here as the display element 60.

The wiring 51*a* and the wiring 51*b* each function as a gate line. The wiring 52*a*, the wiring 52*b*, the wiring 52*c*, and the wiring 52*d* each function as a signal line (also referred to as a data line). The wiring 53*a*, the wiring 53*b*, and the wiring 53*c* each have a function of supplying a potential to the display element 60.

The pixel circuit 41*a* is electrically connected to the wiring 51*a*, the wiring 52*a*, and the wiring 53*a*. The pixel circuit 42*a* is electrically connected to the wiring 51*b*, the wiring 52*d*, and the wiring 53*a*. The pixel circuit 43*a* is electrically connected to the wiring 51*a*, the wiring 52*b*, and the wiring 53*b*. The pixel circuit 41*b* is electrically connected to the wiring 51*b*, the wiring 52*a*, and the wiring 53*b*. The pixel circuit 42*b* is electrically connected to the wiring 51*a*, the wiring 52*c*, and the wiring 53*c*. The pixel circuit 43*b* is electrically connected to the wiring 51*b*, the wiring 52*b*, and the wiring 53*c*.

With the structure illustrated in FIG. 17A in which two gate lines are connected to one pixel, the number of source lines can be conversely reduced by half as compared with that in a stripe arrangement. As a result, the number of terminals of the ICs used as source driver circuits can be reduced by half and the number of components can be reduced.

One wiring functioning as a signal line is preferably connected to pixel circuits corresponding to the same color. For example, when a signal with an adjusted potential is supplied to the wiring to correct for variation in luminance between pixels, the correction value may greatly vary between colors. Thus, when pixel circuits connected to one signal line are pixel circuits corresponding to the same color, the correction can be performed easily.

In addition, each pixel circuit includes a transistor 61, a transistor 62, and a capacitor 63. In the pixel circuit 41*a*, for example, a gate of the transistor 61 is electrically connected to the wiring 51*a*, one of a source and a drain of the transistor 61 is electrically connected to the wiring 52*a*, and the other of the source and the drain is electrically connected to a gate of the transistor 62 and one electrode of the capacitor 63. One of a source and a drain of the transistor 62 is electrically connected to one electrode of the display element 60, and the other of the source and the drain is electrically connected to the other electrode of the capacitor 63 and the wiring 53*a*. The other electrode of the display element 60 is electrically connected to a wiring to which a potential V1 is applied.

Note that, as illustrated in FIG. 17A, the other pixel circuits are similar to the pixel circuit 41*a* except for at least one of the wiring to which the gate of the transistor 61 is connected, the wiring to which one of the source and the drain of the transistor 61 is connected, and the wiring to which the other electrode of the capacitor 63 is connected.

In FIG. 17A, the transistor 61 has a function of a selection transistor. The transistor 62 is in a series connection with the display element 60 and has a function of controlling a current flowing into the display element 60. The capacitor 63 has a function of holding the potential of a node connected to the gate of the transistor 62. Note that the capacitor 63 does not have to be intentionally provided in the case where an off-state leakage current of the transistor 61, a leakage current through the gate of the transistor 62, or the like is extremely small.

The transistor 62 preferably includes a first gate and a second gate electrically connected to each other as illustrated in FIG. 17A. This structure with the two gates can increase the amount of current that the transistor 62 can carry. Such a structure is particularly preferable for a high-resolution display device because the amount of current can be increased without increasing the size, the channel width in particular, of the transistor 62.

Note that the transistor 62 may have one gate. This structure eliminates the need for forming the second gate and thus can simplify the process as compared with the above structure. The transistor 61 may have two gates. This structure enables a reduction in size of each transistor. A first gate and a second gate of each transistor can be electrically connected to each other. Alternatively, one gate may be electrically connected not to the other gate but to another wiring. In this case, threshold voltages of the transistors can be controlled by varying potentials that are applied to the two gates.

One of a pair of electrodes of the display element 60 that is electrically connected to the transistor 62 corresponds to a pixel electrode. FIG. 17A illustrates a structure where an electrode of the display element 60 that is electrically connected to the transistor 62 is a cathode and the opposite electrode is an anode. This structure is particularly effective when the transistor 62 is an n-channel transistor. That is, when the transistor 62 is on, the potential applied through the wiring 53*a* is a source potential; accordingly, the amount of current flowing into the transistor 62 can be constant regardless of variation and change in resistance of the display element 60. Alternatively, a p-channel transistor may be used as a transistor of the pixel circuit. In addition, the cathode and the anode of the display element 60 may be reversed.

[Example of Pixel Electrode Layout Method]

Figure 17B:
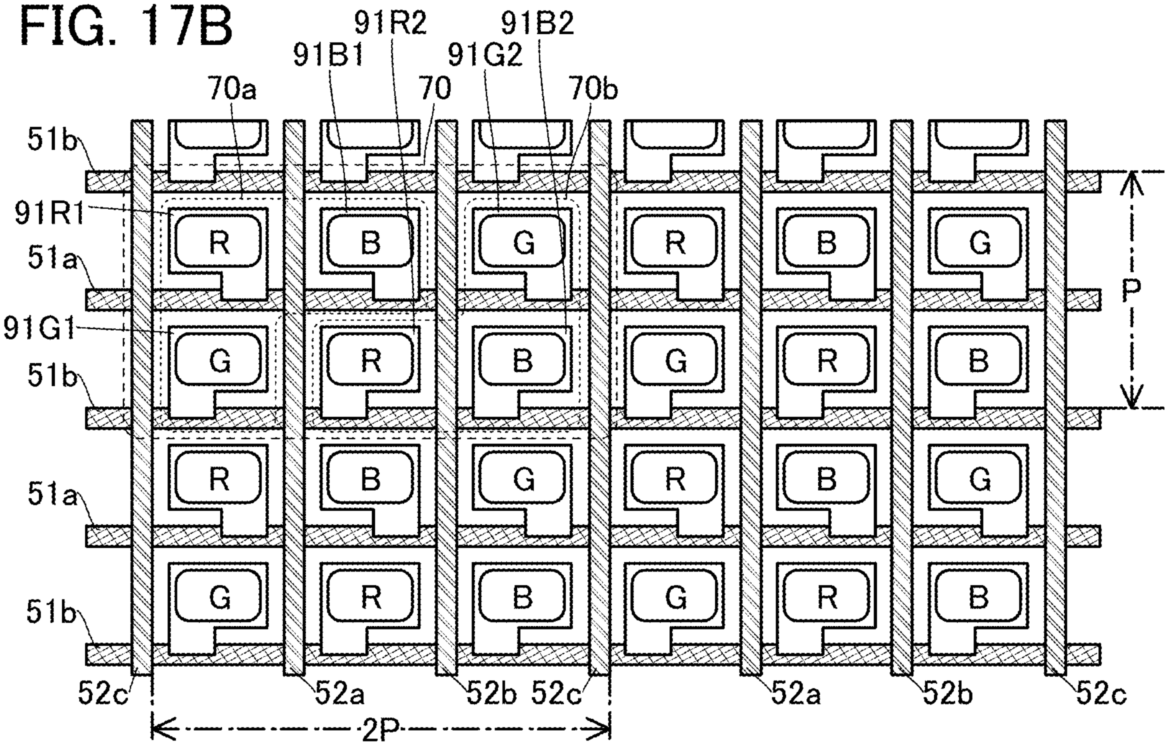

FIG. 17B is a schematic top view illustrating an example of a layout method of pixel electrodes and wirings in the display region. The wirings 51*a* and the wirings 51*b* are alternately arranged. The wiring 52*a*, the wiring 52*b*, and the wiring 52*c*, which intersect with the wirings 51*a* and the wirings 51*b*, are arranged in this order. The pixel electrodes are arranged in matrix in the extending direction of the wirings 51*a* and wirings 51*b*.

The pixel unit 70 includes the pixel 70*a* and the pixel 70*b*. The pixel 70*a* includes a pixel electrode 91R1, a pixel electrode 91G1, and a pixel electrode 91B1. The pixel 70*b* includes a pixel electrode 91R2, a pixel electrode 91G2, and a pixel electrode 91B2. A display region of a subpixel is inside the pixel electrode of the subpixel.

As illustrated in FIG. 17B, when a pitch of the pixel units 70 arranged in the extending direction of the wiring 52*a* or the like (also referred to as the first direction) is denoted as P, a pitch of the pixel units 70 arranged in the extending direction of the wiring 51*a* or the like (also referred to as the second direction) is preferably 2 times the pitch (the pitch 2P). In that case, distortion-free images can be displayed. The pitch P can be longer than or equal to 1 μm and shorter than or equal to 150 μm, preferably longer than or equal to 2 μm and shorter than or equal to 120 μm, further preferably longer than or equal to 3 μm and shorter than or equal to 100 μm, and still further preferably longer than or equal to 4 μm and shorter than or equal to 60 μm. In that case, the display device with extremely high resolution can be obtained.

It is preferable that the pixel electrode 91R1 or the like should not overlap with the wiring 52*a* or the like serving as a signal line, for example. This can suppress change in luminance of the display element, which is caused by change in potential of the pixel electrode 91R1 and the like due to transmission of electrical noise through capacitance between, for example, the wiring 52*a* and the pixel electrode 91R1.

The pixel electrode 91R1 or the like may overlap with the wiring 51*a* or the like serving as a scan line. This can increase the area of the pixel electrode 91R1 and thus increase the aperture ratio. FIG. 17B illustrates an example where part of the pixel electrode 91R1 overlaps with the wiring 51*a*.

When the pixel electrode 91R1 or the like of a subpixel overlaps with the wiring 51*a* or the like serving as a scan line, the wiring is preferably connected to a pixel circuit of the subpixel. For example, a period in which a signal for changing the potential of the wiring 51*a* or the like is input corresponds to a period in which data of the subpixel is rewritten. Thus, if electrical noise is transmitted from the wiring 51*a* or the like to the pixel electrode via capacitance, the luminance of the subpixel does not change.

Example 1 of Pixel Layout

A layout example of the pixel unit 70 is described below.

Figure 18A:
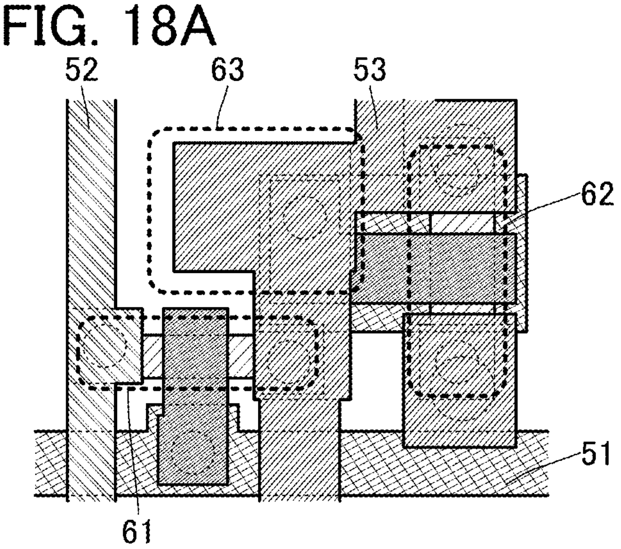
FIG. 18A and FIG. 18B are diagrams illustrating structure examples of a display device.

FIG. 18A is a layout example of a subpixel. The example shows, for easy viewing, a state before a pixel electrode is formed. The subpixel illustrated in FIG. 18A includes the transistor 61, the transistor 62, and the capacitor 63. The transistor 62 includes two gates with a semiconductor layer therebetween.

The lowermost conductive film forms a wiring 51, one gate of the transistor 62, and the like. A conductive film which is formed after the formation of the wiring 51, the one gate of the transistor 62, and the like forms a gate of the transistor 61, the other gate of the transistor 62, and the like. A conductive film which is formed after the formation of the gate of the transistor 61, the other gate of the transistor 62, and the like forms a wiring 52, source electrodes and drain electrodes of the transistors, one electrode of the capacitor 63, and the like. A conductive film which is formed after the formation of the wiring 52, the source electrodes and the drain electrodes of the transistors, the one electrode of the capacitor 63, and the like forms the wiring 53 and the like. Part of the wiring 53 functions as the other electrode of the capacitor 63.

Figure 18B:
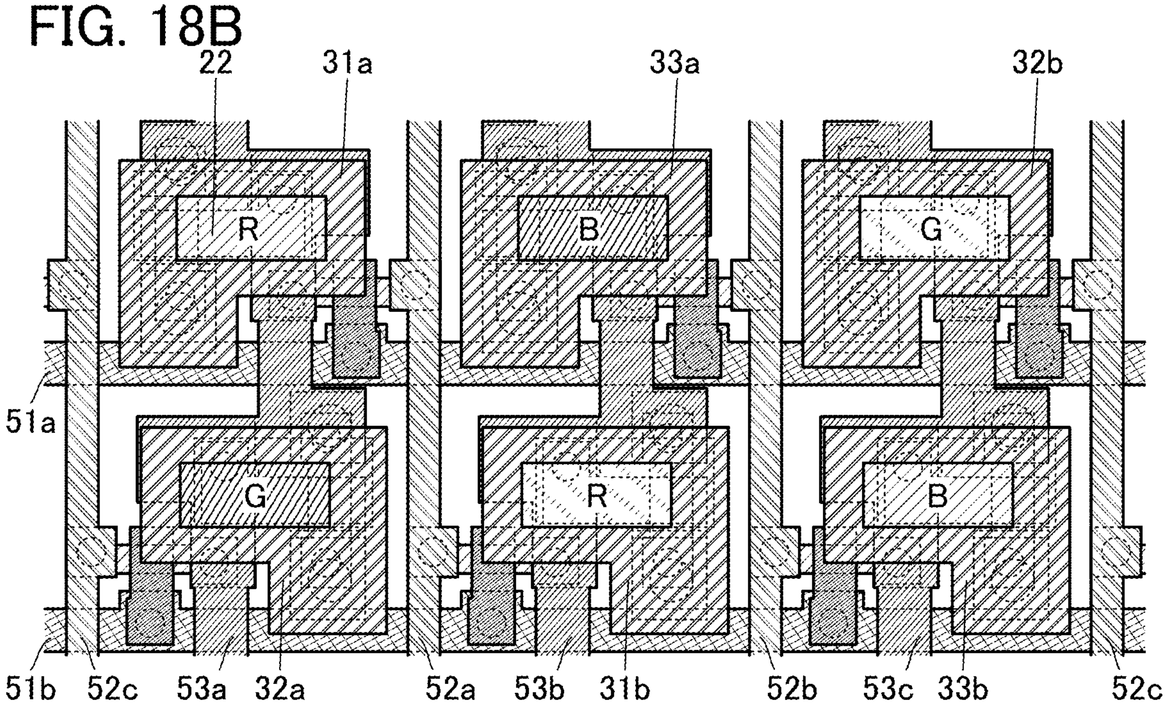

FIG. 18B is a layout example of the pixel unit 70 including the subpixel illustrated in FIG. 18A. FIG. 18B illustrates pixel electrodes (a pixel electrode 31*a*, a pixel electrode 31*b*, a pixel electrode 32*a*, a pixel electrode 32*b*, a pixel electrode 33*a*, and a pixel electrode 33*b*) and a display region 22.

In this example, three subpixels electrically connected to the wiring 51*a* and three subpixels electrically connected to the wiring 51*b* are each bilaterally symmetrical. Therefore, in the structure in which same-color subpixels are arranged in a zigzag pattern in the extending direction of the wiring 52*a* or the like and are connected to one wiring serving as a signal line, wirings in the subpixels can have uniform length, so that variation in luminance between the subpixels can be suppressed.

With the use of such a pixel layout, a display device with extremely high resolution can be manufactured.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 5

In this embodiment, a metal oxide (also referred to as an oxide semiconductor) that can be used in the OS transistor described in the above embodiment is described.

The metal oxide preferably contains at least indium or zinc. In particular, indium and zinc are preferably contained. In addition to them, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structure>

Amorphous (including completely amorphous), CAAC (c-axis-aligned crystalline), nc (nanocrystalline), CAC (cloud-aligned composite), single-crystal, and polycrystalline (poly crystal) structures can be given as examples of a crystal structure of an oxide semiconductor.

A crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method.

For example, the XRD spectrum of the quartz glass substrate shows a peak with a substantially bilaterally symmetrical shape. On the other hand, the peak of the XRD spectrum of the IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Next, the CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which layers containing indium (In) and oxygen (hereinafter In layers) and layers containing the element M, zinc (Zn), and oxygen (hereinafter (M,Zn) layers) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by out-of-plane XRD measurement with an XRD apparatus using θ/2θ scanning, for example, a peak indicating c-axis alignment is detected at or around 2θ of 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, or the like is included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called a polycrystal. It is highly probable that the grain boundary becomes a recombination center and captures carriers and thus decreases the on-state current or field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Moreover, since the crystallinity of an oxide semiconductor might be decreased by entry of impurities, formation of defects, or the like, the CAAC-OS can be regarded as an oxide semiconductor that has a small amount of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. There is no regularity of crystal orientation between different nanocrystals in the nc-OS. Hence, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not observed. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region.

Specifically, the first region is a region including indium oxide, indium zinc oxide, or the like as its main component. The second region is a region including gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where intentional heating is not performed on a substrate, for example. Moreover, in the case of forming the CAC-OS by a sputtering method, any one or more selected from an inert gas (typically, argon), an oxygen gas, and a nitrogen gas are used as a deposition gas. The ratio of the flow rate of an oxygen gas to the total flow rate of the deposition gas at the time of deposition is preferably as low as possible, and for example, the ratio of the flow rate of an oxygen gas to the total flow rate of the deposition gas at the time of deposition is preferably higher than or equal to 0% and lower than 30%, further preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility (μ) can be achieved.

The second region has a higher insulating property than the first region. In other words, when the second regions are distributed in a metal oxide, a leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function.

Accordingly, when the CAC-OS is used for a transistor, a high on-state current ($I_{on}$), high field-effect mobility (μ), and excellent switching operation can be achieved.

A transistor using the CAC-OS has high reliability. Thus, the CAC-OS is most suitable for a variety of semiconductor devices such as display devices.

An oxide semiconductor can have any of various structures that show different properties. Two or more of the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a case where the oxide semiconductor is used for a transistor will be described.

When the oxide semiconductor is used for a transistor, the transistor can have high field-effect mobility. In addition, the transistor can have high reliability.

An oxide semiconductor having a low carrier concentration is preferably used for the transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$ and higher than or equal to $1\times10^{-9}$ $cm^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration is sometimes referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. A transistor whose channel formation region is formed in an oxide semiconductor having a high density of trap states has unstable electrical characteristics in some cases.

In order to obtain stable electrical characteristics of a transistor, it is effective to reduce the impurity concentration in the oxide semiconductor. In order to reduce the impurity concentration in the oxide semiconductor, the impurity concentration in an adjacent film is also preferably reduced. Examples of impurities include hydrogen, nitrogen, an alkali metal, an alkaline earth metal, iron, nickel, and silicon.

<Impurity>

The influence of impurities in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the oxide semiconductor, which is obtained by SIMS, is lower than or equal to $1\times10^{18}$ atoms/$cm^3$, preferably lower than or equal to $2\times10^{16}$ atoms/$cm^3$.

When the oxide semiconductor contains nitrogen, the oxide semiconductor easily becomes n-type because of generation of electrons serving as carriers and an increase in carrier concentration. A transistor including, as a semiconductor, an oxide semiconductor containing nitrogen tends to have normally-on characteristics. When nitrogen is contained in the oxide semiconductor, a trap state is sometimes formed. This might make the electrical characteristics of the transistor unstable. Thus, the nitrogen concentration in the oxide semiconductor, which is obtained by SIMS, is lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor including an oxide semiconductor containing hydrogen tends to have normally-on characteristics. For this reason, hydrogen in the oxide semiconductor is preferably reduced as much as possible. Specifically, the hydrogen concentration in the oxide semiconductor, which is obtained by SIMS, is lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurities is used for a channel formation region in a transistor, stable electrical characteristics can be given.

At least part of this embodiment can be implemented in combination with the other embodiments described in this specification as appropriate.

Embodiment 6

In this embodiment, electronic devices of one embodiment of the present invention will be described with reference to FIG. 19 to FIG. 22.

An electronic device in this embodiment includes the display device of one embodiment of the present invention. In the display device of one embodiment of the present invention, increases in resolution, definition, and sizes are easily achieved. Thus, the display device of one embodiment of the present invention can be used for a display portion of a variety of electronic devices.

The display device of one embodiment of the present invention can be manufactured at low cost, which leads to a reduction in the manufacturing cost of an electronic device.

Examples of the electronic devices include a digital camera, a digital video camera, a digital photo frame, a mobile phone, a portable game machine, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

In particular, the display device of one embodiment of the present invention can have a high resolution, and thus can be suitably used for an electronic device including a relatively small display portion. Examples of such an electronic device include information terminals (wearable devices) such as watch-type and bracelet-type information terminals and wearable devices capable of being worn on the head, such as a VR device like a head-mounted display and a glasses-type AR device. Examples of wearable devices include an SR (Substitutional Reality) device and an MR (Mixed Reality) device.

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680×4320). In particular, definition of 4K2K, 8K4K, or higher is preferable. Furthermore, the pixel density (resolution) of the display device of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. With the display device with such high definition or high resolution, the electronic device can have higher realistic sensation, sense of depth, and the like in personal use such as portable use or home use.

The electronic device in this embodiment can be incorporated along a curved surface of an inside wall or an outside wall of a house or a building or the interior or the exterior of a car.

The electronic device in this embodiment may include an antenna. When a signal is received by the antenna, the electronic device can display a video, data, and the like on a display portion. When the electronic device includes the antenna and a secondary battery, the antenna may be used for contactless power transmission.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of kinds of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 19A:
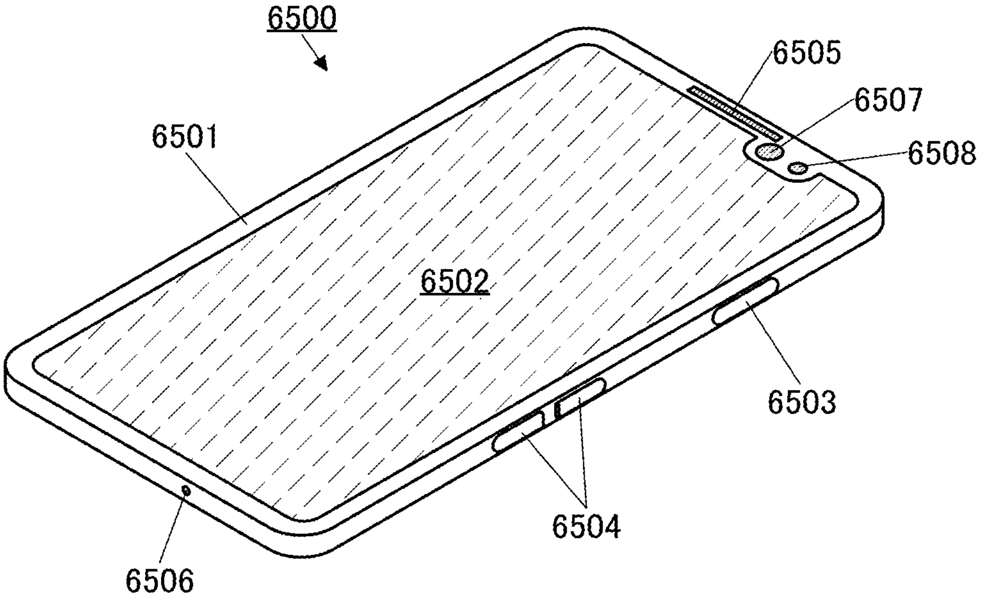
FIG. 19A and FIG. 19B are diagrams illustrating an example of an electronic device.

An electronic device 6500 illustrated in FIG. 19A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 19B:
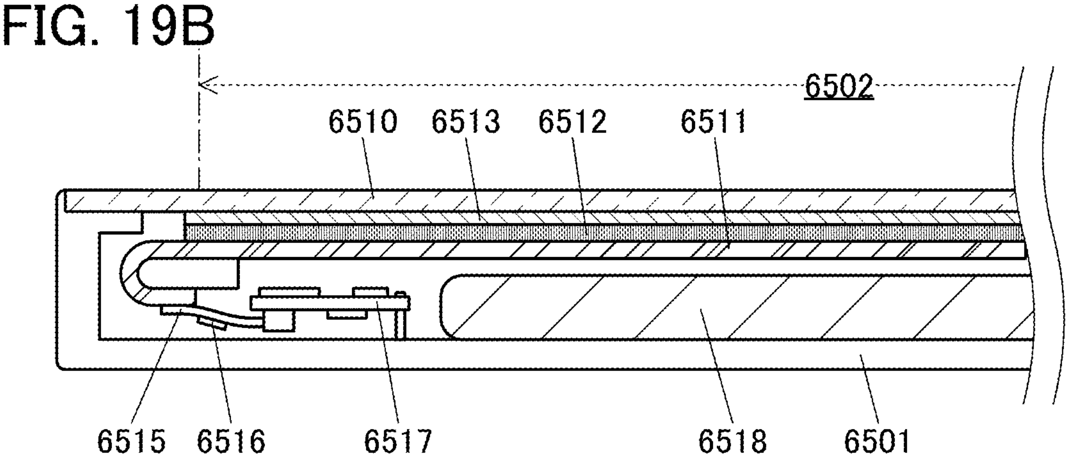

FIG. 19B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display (a display device that has flexibility) of one embodiment of the present invention can be used as the display panel 6511. Thus, an extremely lightweight electronic device can be achieved. Since the display panel 6511 is extremely thin, the battery 6518 with high capacity can be mounted with the thickness of the electronic device controlled. An electronic device with a narrow frame can be achieved when part of the display panel 6511 is folded back so that the portion connected to the FPC 6515 is positioned on the rear side of a pixel portion.

Figure 20A:
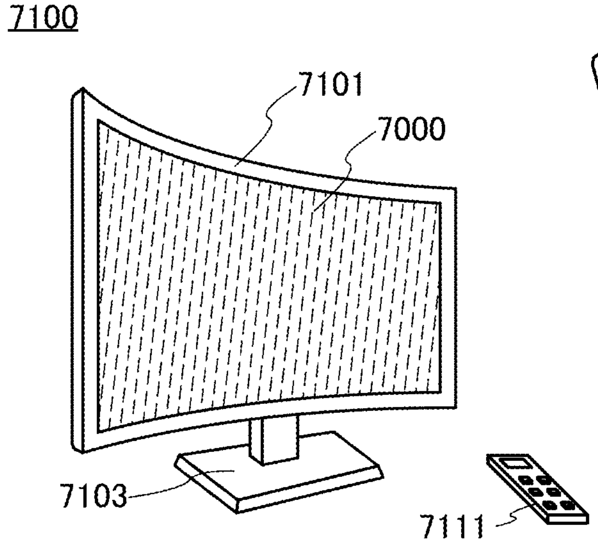
FIG. 20A to FIG. 20D are diagrams illustrating examples of electronic devices.

FIG. 20A illustrates an example of a television device. In a television device 7100, a display portion 7000 is incorporated in a housing 7101. Here, a structure in which the housing 7101 is supported by a stand 7103 is illustrated.

The display device of one embodiment of the present invention can be used in the display portion 7000.

Operation of the television device 7100 illustrated in FIG. 20A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying data output from the remote controller 7111. With operation keys or a touch panel provided in the remote controller 7111, channels and volume can be controlled and videos displayed on the display portion 7000 can be controlled.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 20B:
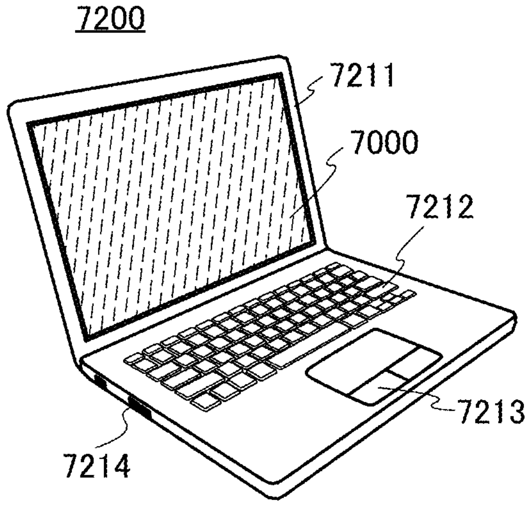

FIG. 20B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used in the display portion 7000.

Figure 20C:
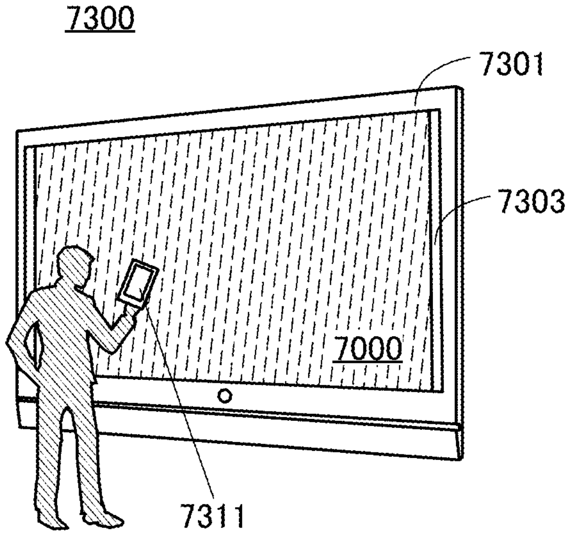
Figure 20D:
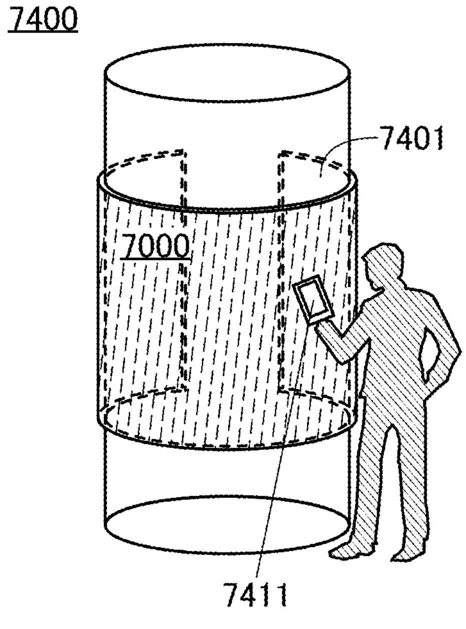

FIG. 20C and FIG. 20D illustrate examples of digital signage.

Digital signage 7300 illustrated in FIG. 20C includes a housing 7301, the display portion 7000, a speaker 7303, and the like. Furthermore, the digital signage 7300 can include an LED lamp, an operation key (including a power switch or an operation switch), a connection terminal, a variety of sensors, a microphone, and the like.

FIG. 20D is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIG. 20C and FIG. 20D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 20C and FIG. 20D, it is preferable that the digital signage 7300 or the digital signage 7400 can work with an information terminal 7311 or an information terminal 7411, such as a smartphone a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Figure 21A:
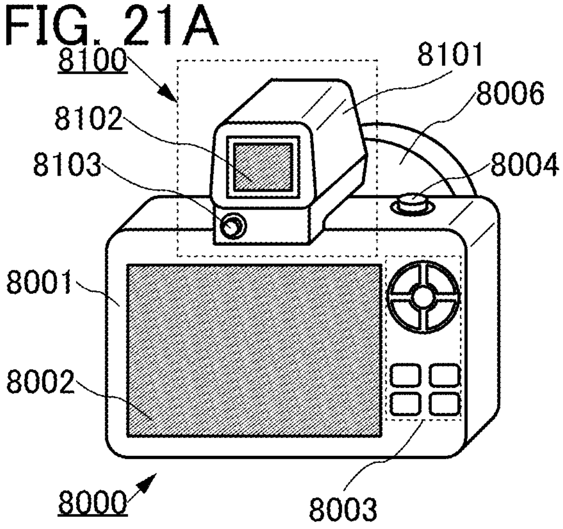
FIG. 21A to FIG. 21F are diagrams illustrating examples of electronic devices.

FIG. 21A is an external view of a camera 8000 to which a finder 8100 is attached.

The camera 8000 includes a housing 8001, a display portion 8002, operation buttons 8003, a shutter button 8004, and the like. In addition, a detachable lens 8006 is attached to the camera 8000. Note that the lens 8006 and the housing 8001 may be integrated with each other in the camera 8000.

The camera 8000 can take images by the press of the shutter button 8004 or touch on the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with the mount engaging with a mount of the camera 8000. In the finder 8100, a video or the like received from the camera 8000 can be displayed on the display portion 8102.

The button 8103 has a function of a power button or the like.

The display device of one embodiment of the present invention can be used for the display portion 8002 of the camera 8000 and the display portion 8102 of the finder 8100. Note that a finder may be incorporated in the camera 8000.

Figure 21B:
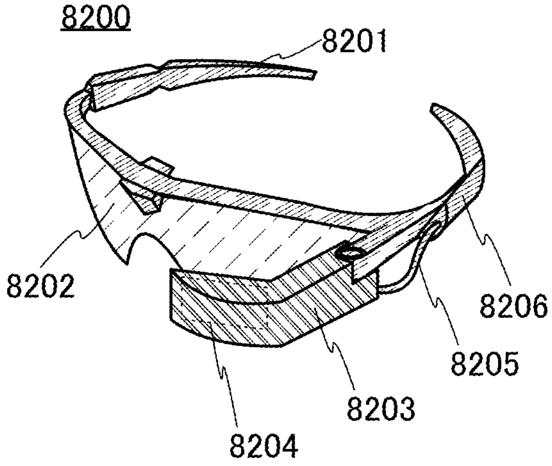

FIG. 21B is an external view of a head-mounted display 8200.

The head-mounted display 8200 includes a wearing portion 8201, a lens 8202, a main body 8203, a display portion 8204, a cable 8205, and the like. A battery 8206 is incorporated in the wearing portion 8201.

The cable 8205 supplies electric power from the battery 8206 to the main body 8203. The main body 8203 includes a wireless receiver or the like and can display received video information on the display portion 8204. In addition, the main body 8203 is provided with a camera, and information on the movement of the user's eyeball or eyelid can be used as an input means.

The mounting portion 8201 may be provided with a plurality of electrodes capable of sensing a current flowing in response to the movement of the user's eyeball in a position in contact with the user to have a function of recognizing the user's sight line. Furthermore, the mounting portion 8201 may have a function of monitoring the user's pulse with the use of a current flowing through the electrodes. Moreover, the mounting portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, or the like.

The display device of one embodiment of the present invention can be used in the display portion 8204.

Figure 21C:
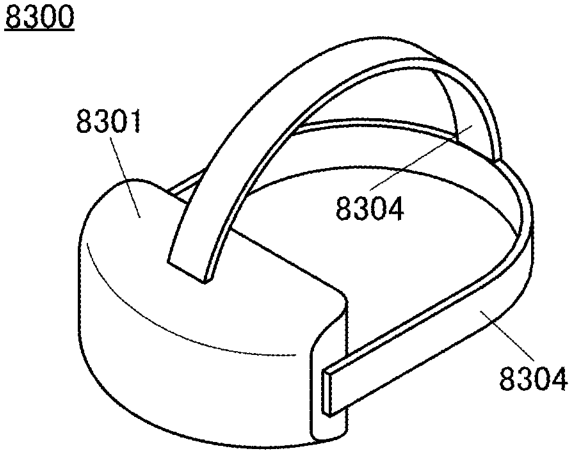
Figure 21D:
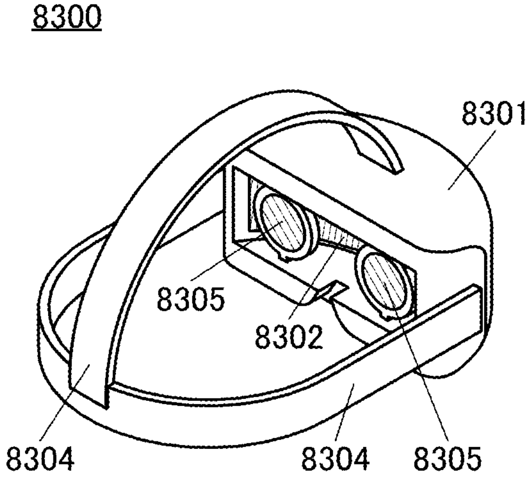
Figure 21E:
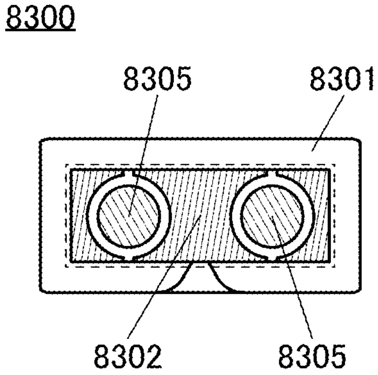

FIG. 21C to FIG. 21E are external views of a head-mounted display 8300. The head-mounted display 8300 includes a housing 8301, a display portion 8302, a fixing band 8304, and a pair of lenses 8305.

A user can perceive display on the display portion 8302 through the lenses 8305. Note that the display portion 8302 is preferably curved and placed because the user can feel a high realistic sensation. In addition, when another image displayed on a different region of the display portion 8302 is perceived through the lenses 8305, three-dimensional display using parallax or the like can also be performed. Note that the number of display portions 8302 provided is not limited to one; two display portions 8302 may be provided so that one display portion is provided for one eye of the user.

The display device of one embodiment of the present invention can be used for the display portion 8302. The display device of one embodiment of the present invention can achieve extremely high resolution. For example, a pixel is not easily perceived by the user even when the user perceives display that is magnified by the use of the lenses 8305 as illustrated in FIG. 21E. In other words, a video with a strong sense of reality can be perceived by the user with the use of the display portion 8302.

Figure 21F:
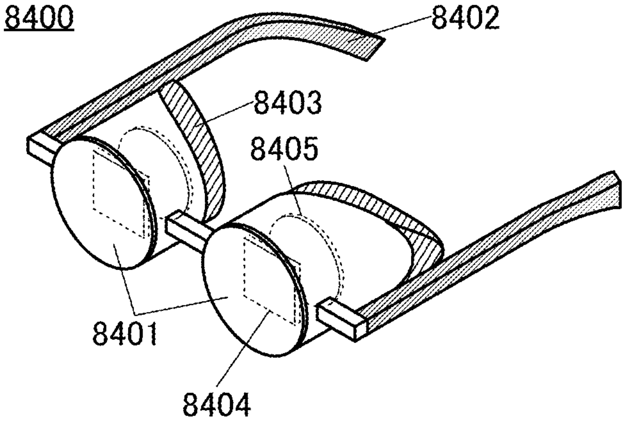

FIG. 21F is an external view of a goggle-type head-mounted display 8400. The head-mounted display 8400 includes a pair of housings 8401, a mounting portion 8402, and a cushion 8403. A display portion 8404 and a lens 8405 are provided in each of the pair of housings 8401. The pair of display portions 8404 may display different images, whereby three-dimensional display using parallax can be performed.

A user can perceive display on the display portion 8404 through the lenses 8405. The lens 8405 has a focus adjustment mechanism and the focus adjustment mechanism can adjust the position of the lenses 8405 according to the user's eyesight. The display portion 8404 is preferably a square or a horizontal rectangle. Accordingly, realistic sensation can be increased.

The mounting portion 8402 preferably has plasticity and elasticity so as to be adjusted to fit the size of the user's face and not to slide down. In addition, part of the mounting portion 8402 preferably has a vibration mechanism functioning as a bone conduction earphone. Thus, without additionally requiring an audio device such as earphones or a speaker, the user can enjoy video and sound only by wearing. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable because cleaning or replacement can be easily performed.

Electronic devices illustrated in FIG. 22A to FIG. 22F include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 22A to FIG. 22F have a variety of functions. For example, the electronic devices can have a function of displaying a variety of data (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. In addition, the electronic devices may each include a camera or the like and have a function of taking a still image or a moving image and storing the taken image in a recording medium (an external recording medium or a recording medium incorporated in the camera), a function of displaying the taken image on the display portion, or the like.

The display device of one embodiment of the present invention can be used in the display portion 9001.

The details of the electronic devices illustrated in FIG. 22A to FIG. 22F are described below.

Figure 22A:
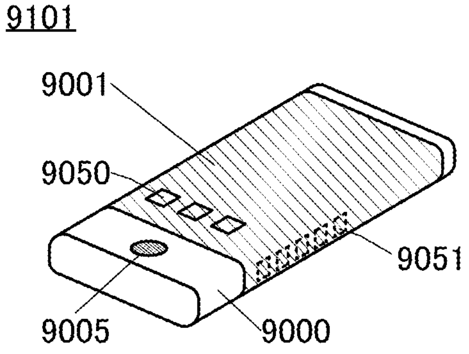
FIG. 22A to FIG. 22F are diagrams illustrating examples of electronic devices.

FIG. 22A is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display letters and image information on its plurality of surfaces. FIG. 22A illustrates an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 22B:
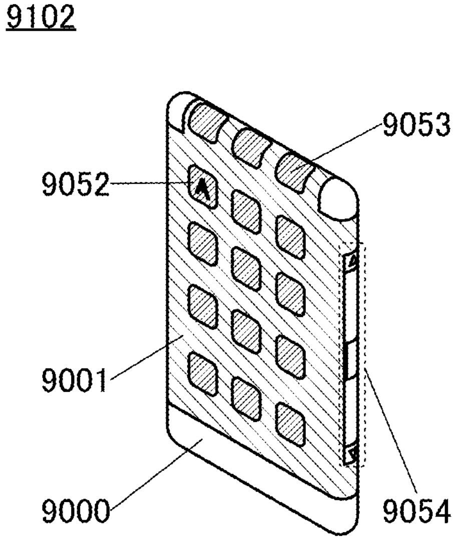

FIG. 22B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is illustrated. For example, the user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer a call, for example.

Figure 22C:
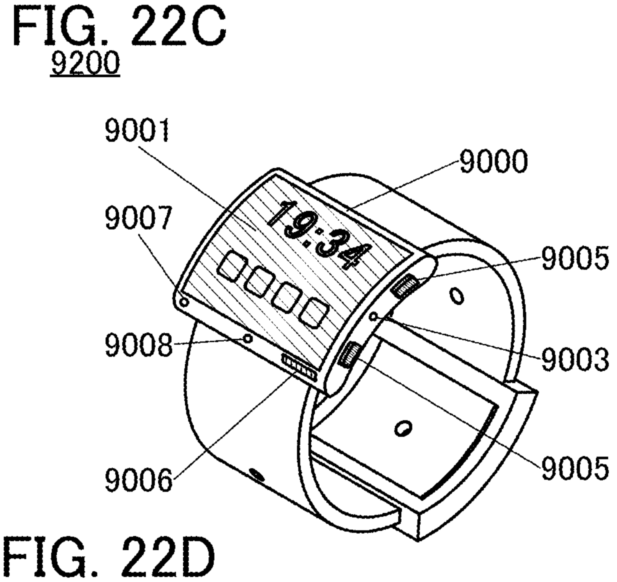

FIG. 22C is a perspective view illustrating a watch-type portable information terminal 9200. The portable information terminal 9200 can be used as a smartwatch (registered trademark), for example. The display surface of the display portion 9001 is curved, and display can be performed on the curved display surface. Mutual communication between the portable information terminal 9200 and, for example, a headset capable of wireless communication enables hands-free calling. With the connection terminal 9006, the portable information terminal 9200 can perform mutual data transmission with another information terminal and can be charged. Note that the charging operation may be performed by wireless power feeding.

Figure 22D:
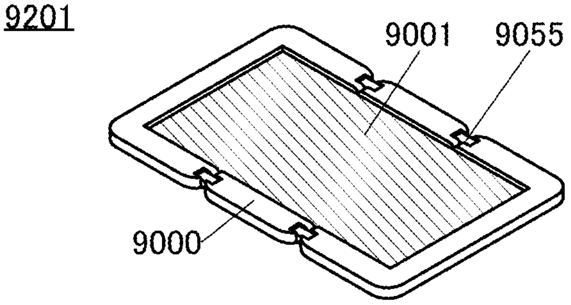
Figure 22E:
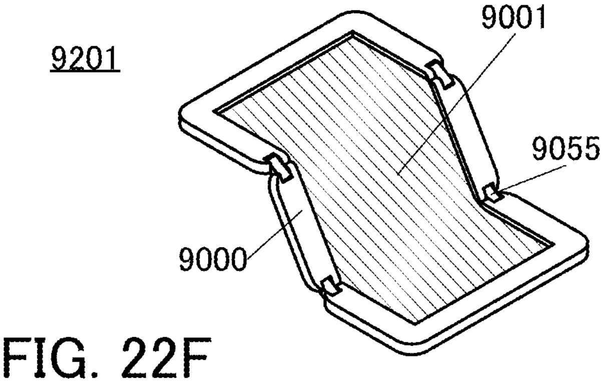
Figure 22F:
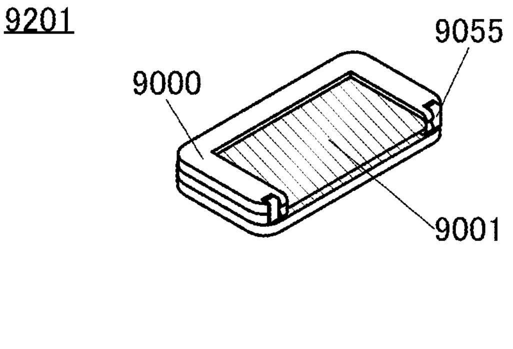

FIG. 22D to FIG. 22F are perspective views illustrating a foldable portable information terminal 9201. FIG. 22D is a perspective view of an opened state of the portable information terminal 9201, FIG. 22F is a perspective view of a folded state thereof, and FIG. 22E is a perspective view of a state in the middle of change from one of FIG. 22D and FIG. 22F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature greater than or equal to 0.1 mm and less than or equal to 150 mm.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Example 1

In this example, a display panel of one embodiment of the present invention was fabricated. In this example, a display panel with a resolution of 3078 ppi was fabricated.

[Fabrication of Display Panel]

The method exemplified in Manufacturing method example 1 in Embodiment 1 was employed for the fabrication of the display panel. Specifically, first, a single crystal silicon substrate over which a pixel circuit provided with transistors, wirings, and the like and a pixel electrode were formed were prepared. Next, after a red EL layer, a green EL layer, and a blue EL layer were sequentially formed, a sacrificial layer and a protective layer over each EL layer were removed. Next, an electron-injection layer, a common electrode, and a protective layer were sequentially formed over the EL layers.

As the EL layer, a stacked-layer structure of a hole-injection layer, a hole-transport layer, a light-emitting layer, and an electron-transport layer was formed. An aluminum oxide film formed by an ALD method at a substrate temperature of 80° C. was used for the sacrificial layer, and an In—Ga—Zn oxide film formed by a sputtering method was used for the protective layer. LiF was used for the electron-injection layer, a mixed film of silver and magnesium was used for the common electrode, and an ITO film formed by a sputtering method was used for the protective layer over the common electrode.

[Results]

Figure 23A:
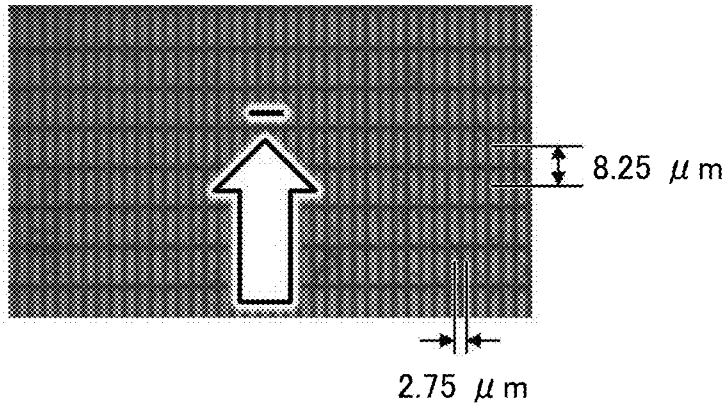
FIG. 23A is an optical micrograph of a pixel according to Example 1.

FIG. 23A shows an optical micrograph of pixels of the fabricated display panel. In the display panel, the pixel pitch was approximately 8.25 μm, the subpixel pitch was approximately 2.75 μm, and the aperture ratio (designed value) of the pixel was approximately 33.7% (which corresponds to a subpixel aperture ratio of approximately 11.2%×3).

Figure 23B:
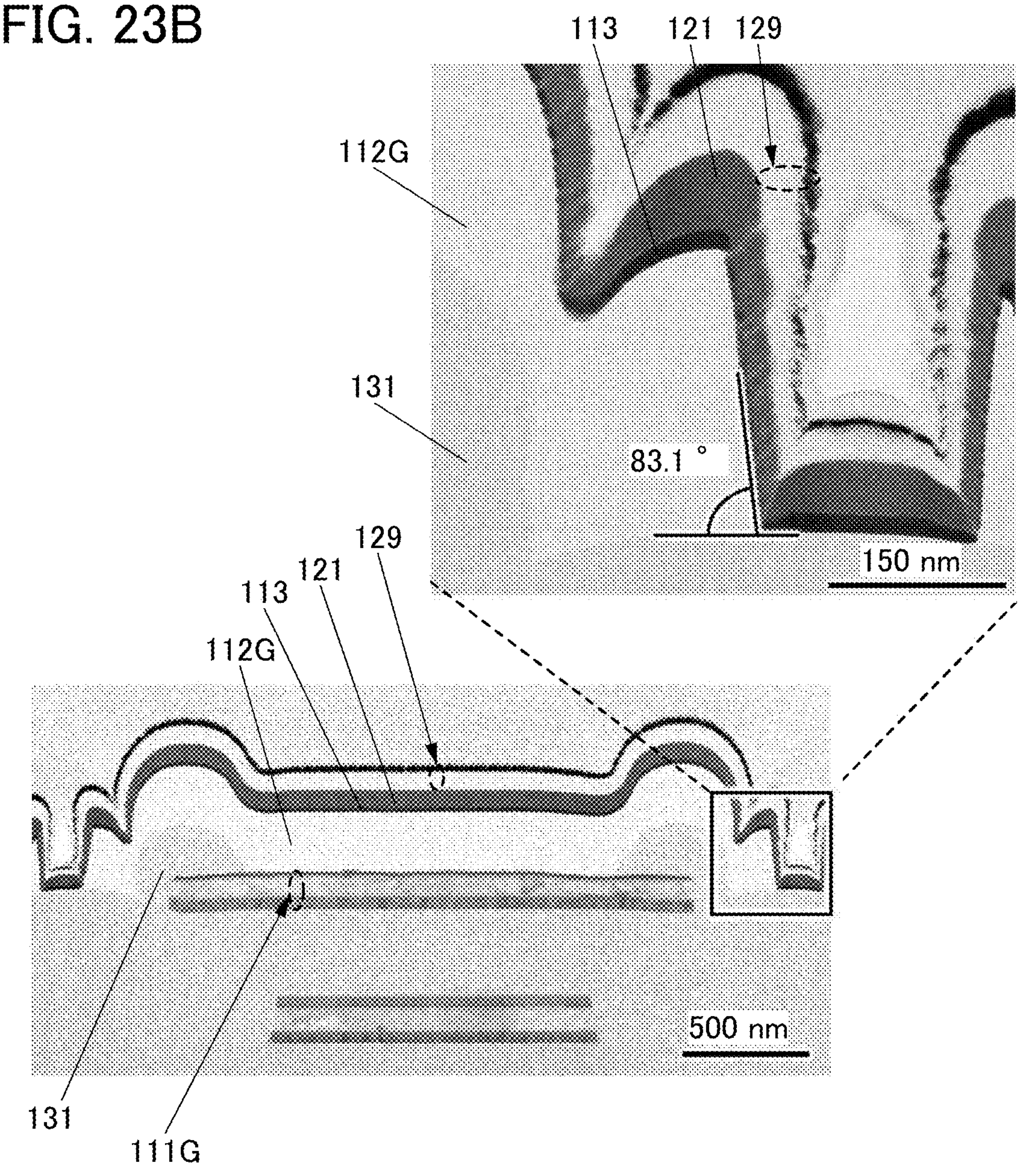
FIG. 23B is observation photographs of a cross section of the pixel according to Example 1.

Next, an observation result of a cross section of a portion with a thick line in FIG. 23A from the arrow direction is shown. FIG. 23B shows cross-sectional STEM observation photographs of the pixel of the fabricated display panel. The pixel shown in FIG. 23B is a green subpixel (G). The insulating layer 131 covers end portions of the pixel electrode 111G. The EL layer 112G is provided over the pixel electrode 111G and the insulating layer 131. The electron-injection layer, the common electrode 113, and the protective layer 121 are provided to cover the EL layer 112G. Note that a protective film 129 for analysis is provided over the protective layer 121.

As shown in an enlarged view in FIG. 23B, it was confirmed that the EL layer 112G had a taper angle of approximately 83° that is almost a right angle.

Example 2

In this example, a display panel of one embodiment of the present invention was fabricated.

In the display panel fabricated in this example, a display portion had a square with a size of 0.99 inches diagonal, the number of effective pixels was 1920×1920, the resolution was 2731 ppi, the pixel pitch was 9.3 μm×9.3 μm, the pixel arrangement was a stripe arrangement of R, G, and B, the aperture ratio was 43% (designed value), and the frame frequency was 90 Hz.

The display panel was fabricated using a single crystal silicon substrate as the substrate by stacking a single crystal silicon transistor, a wiring layer, an oxide semiconductor transistor (OS transistor), and a light-emitting element in order. The light-emitting element was fabricated in a manner similar to that in Example 1 except that a tungsten film formed by a sputtering method was used for a second layer (protective layer) of a sacrificial layer.

Figure 24:
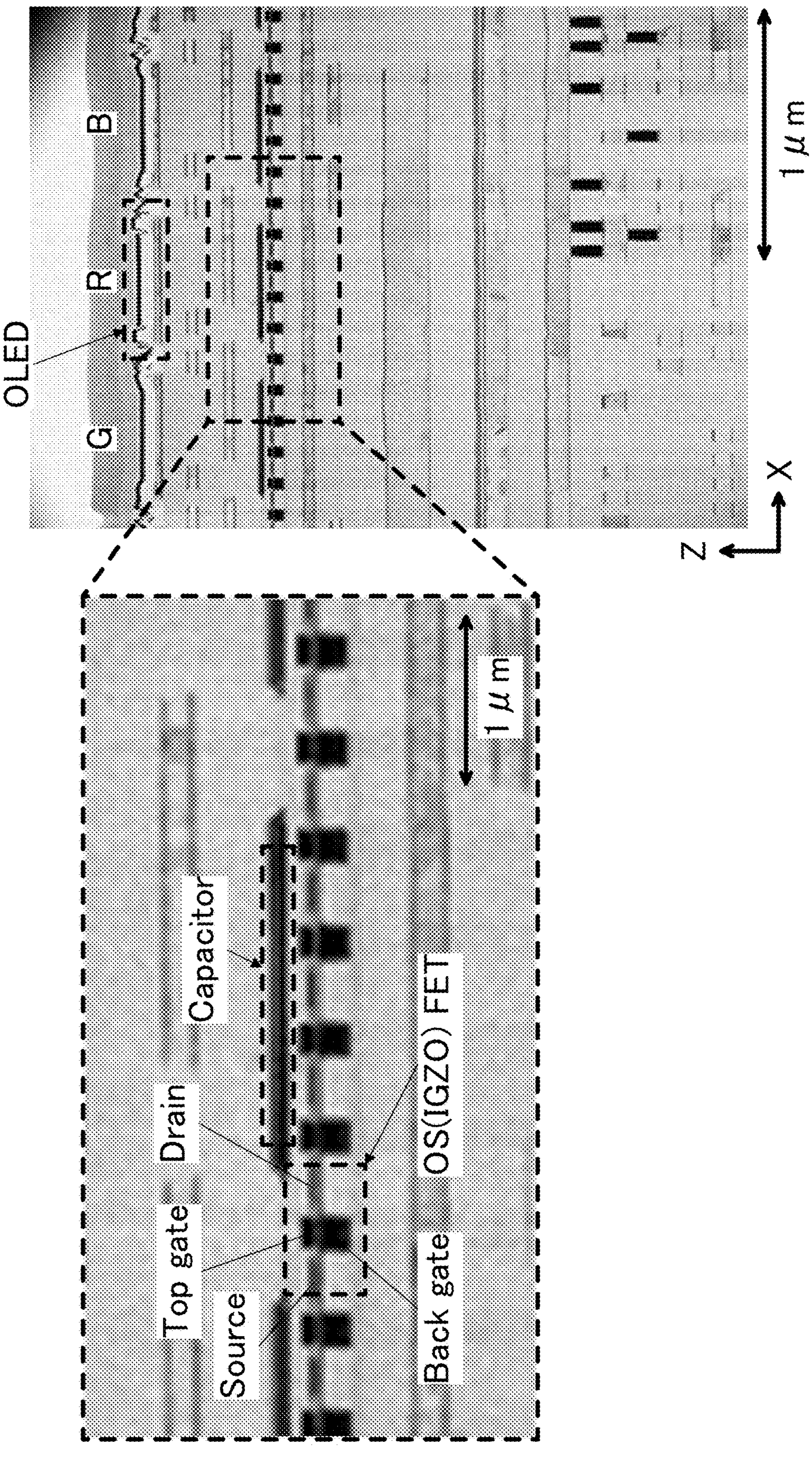
FIG. 24 is observation photographs of a cross section of a pixel according to Example 2.

FIG. 24 shows cross-sectional observation photographs of the fabricated display device. A cross section from the wiring layer to the light-emitting element is shown on the right side, and an enlarged view of the OS transistor and its vicinity is shown on the left side. Although not clearly shown here, the single crystal silicon substrate and the single crystal silicon transistor formed on the substrate are provided below the wiring layer.

In the OS transistor (OS (IGZO) FET), an In—Ga—Zn oxide film (IGZO) was used for a semiconductor layer. FIG. 24 shows a top gate, a back gate, a source, and a drain of the OS transistor, and a capacitor.

Figure 25A:
FIG. 25A and FIG. 25B are display photographs of a display panel according to Example 2.
Figure 25B:
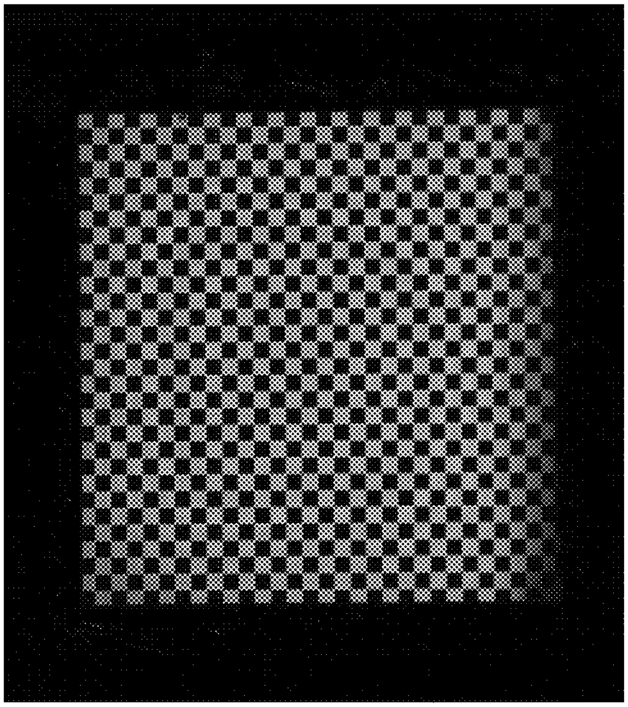

FIG. 25A and FIG. 25B show display photographs of the fabricated display panel. By a side-by-side method not using a metal mask, color images with extremely high resolution such as the resolution of 2731 ppi was able to be achieved.

REFERENCE NUMERALS

100: display device, 100A to 100G: display device, 101: substrate, 110R, 110G, 110B, 110P, and 110Q: light-emitting element, 111R, 111G, 111B, 111P, and 111Q: pixel electrode, 111C: connection electrode, 112R, 112G, 112B, 112P, and 112Q: EL layer, 112Rf, 112Gf, and 112Bf: EL film, 113: common electrode, 114: EL layer, 115R, 115G, and 115B: optical adjustment layer, 121: protective layer, 122: space, 129: protective film for analysis, 130: connection portion, 131: insulating layer, **143*a* to 143*d*: resist mask, 144*a* to 144*c*: sacrificial film, 145*a* to 145*c*: sacrificial layer, 146*a* to 146*c*: protective film, 147*a* to 147*c*: protective layer, 151: dummy layer, 152: wiring, 153**: slit

The invention claimed is:

1. A display device comprising a first light-emitting element and a second light-emitting element, wherein the first light-emitting element comprises a first pixel electrode, a first EL layer, a common layer, and a common electrode, wherein the second light-emitting element comprises a second pixel electrode, a second EL layer, the common layer, and the common electrode, wherein an insulating layer is between the first pixel electrode and the second pixel electrode, wherein the insulating layer comprises a first region overlapping with the first EL layer, a second region overlapping with the second EL layer, and a third region positioned between the first region and the second region and overlapping with neither the first EL layer nor the second EL layer, wherein a side surface of the first EL layer and a side surface of the second EL layer are positioned over the insulating layer to face each other, wherein the common layer comprises a region positioned over the first EL layer, a region positioned over the second EL layer, and a region positioned between the first EL layer and the second EL layer, wherein the common electrode is provided along a top surface of the common layer, the side surface of the first EL layer, the side surface of the second EL layer, and a top surface of the insulating layer, wherein the insulating layer comprises an inorganic insulating material, and wherein a width of the insulating layer is larger than or equal to 2 times and smaller than or equal to 4 times a distance between the first pixel electrode and the second pixel electrode.

2. A display device comprising a first light-emitting element and a second light-emitting element, wherein the first light-emitting element comprises a first pixel electrode, a first EL layer, a common layer, and a common electrode, wherein the second light-emitting element comprises a second pixel electrode, a second EL layer, the common layer, and the common electrode, wherein an insulating layer is between the first pixel electrode and the second pixel electrode, wherein the insulating layer comprises a first region overlapping with the first EL layer, a second region overlapping with the second EL layer, and a third region positioned between the first region and the second region and overlapping with neither the first EL layer nor the second EL layer, wherein a side surface of the first EL layer and a side surface of the second EL layer are positioned over the insulating layer to face each other, wherein the common layer comprises a region positioned over the first EL layer, a region positioned over the second EL layer, and a region positioned between the first EL layer and the second EL layer, wherein the common electrode is provided along a top surface of the common layer, the side surface of the first EL layer, the side surface of the second EL layer, and a top surface of the insulating layer, wherein the insulating layer comprises an inorganic insulating material, and wherein a width of the insulating layer is larger than or equal to 2 times and smaller than or equal to 4 times a distance between the side surface of the first EL layer and the side surface of the second EL layer.

3. The display device according to claim 1, wherein a width of the first region is larger than a width of the third region and smaller than or equal to 300 nm, and wherein a width of the second region is larger than the width of the third region and smaller than or equal to 300 nm.

4. The display device according to claim 1, wherein a sum of the width of the first region and the width of the second region is larger than 2 times the width of the third region, and wherein a sum of the width of the first region, the width of the second region, and the width of the third region is smaller than or equal to 1000 nm.

5. The display device according to claim 1, wherein the width of the third region is larger than or equal to 50 nm and smaller than or equal to 250 nm.

6. The display device according to claim 1, wherein an effective light-emitting area ratio is higher than or equal to 70% and lower than 100%.

7. The display device according to claim 2, wherein a width of the first region is larger than a width of the third region and smaller than or equal to 300 nm, and wherein a width of the second region is larger than the width of the third region and smaller than or equal to 300 nm.

8. The display device according to claim 2, wherein a sum of the width of the first region and the width of the second region is larger than 2 times the width of the third region, and wherein a sum of the width of the first region, the width of the second region, and the width of the third region is smaller than or equal to 1000 nm.

9. The display device according to claim 2, wherein the width of the third region is larger than or equal to 50 nm and smaller than or equal to 250 nm.

10. The display device according to claim 2, wherein an effective light-emitting area ratio is higher than or equal to 70% and lower than 100%.

11. The display device according to claim 1, wherein the common layer comprises one or more of an electron-injection layer, an electron-transport layer, a hole-injection layer, and a hole-transport layer.

12. The display device according to claim 2, wherein the common layer comprises one or more of an electron-injection layer, an electron-transport layer, a hole-injection layer, and a hole-transport layer.

13. The display device according to claim 1, further comprising a connection electrode, wherein the connection electrode is provided along a periphery of a display region comprising the first light-emitting element and the second light-emitting element, and wherein the connection electrode is electrically connected to the common electrode.

14. The display device according to claim 2, further comprising a connection electrode, wherein the connection electrode is provided along a periphery of a display region comprising the first light-emitting element and the second light-emitting element, and wherein the connection electrode is electrically connected to the common electrode.

15. The display device according to claim 13, wherein the connection electrode is provided on the same plane as the first pixel electrode and the second pixel electrode.

16. The display device according to claim 14, wherein the connection electrode is provided on the same plane as the first pixel electrode and the second pixel electrode.

17. The display device according to claim 1, wherein an end portion of the first EL layer comprises a region overlapping with the first pixel electrode, and wherein an end portion of the second EL layer comprises a region overlapping with the second pixel electrode.

18. The display device according to claim 2, wherein an end portion of the first EL layer comprises a region overlapping with the first pixel electrode, and wherein an end portion of the second EL layer comprises a region overlapping with the second pixel electrode.

* * * * *